United States Patent [19]
Nishio et al.

[11] Patent Number: 5,793,823
[45] Date of Patent: Aug. 11, 1998

[54] SYNCHRONIZATION CIRCUIT THAT CAPTURES AND PHASES AN EXTERNAL SIGNAL

[75] Inventors: Satoshi Nishio; Tsutomu Yoshimura; Harufusa Kondoh; Shigeki Kohama, all of Hyogo, Japan

[73] Assignees: Mitsubishi Electric Engineering Co., Ltd.; Mitsubishi Denki Kabushiki Kaisha, both of Tokyo, Japan

[21] Appl. No.: 405,889

[22] Filed: Mar. 17, 1995

[30] Foreign Application Priority Data

Oct. 7, 1994 [JP] Japan ..................... 6-244066

[51] Int. Cl.$^6$ ............................................. H04L 7/02
[52] U.S. Cl. .................... 375/372; 375/360; 327/152; 327/161
[58] Field of Search ................... 375/356, 357, 375/354, 359, 371, 372, 373, 360; 327/141, 208, 144, 145, 99, 152, 161; 326/96, 93; 395/250, 551; 331/49; 370/105.3, 516, 503, 517, 518; 371/1

[56] References Cited

U.S. PATENT DOCUMENTS

| | | |
|---|---|---|
| 4,494,021 | 1/1985 | Bell et al. |
| 5,502,750 | 3/1996 | Co et al. ................ 375/372 |
| 5,602,882 | 2/1997 | Co et al. ................ 375/372 |

FOREIGN PATENT DOCUMENTS 31 02 447  11/1981  Germany.

OTHER PUBLICATIONS

IEEE Journal of Solid–State Circuits, vol. SC–22, No. 2, Apr. 1987, pp. 255–261, Deog–Kyoon Jeong, et al., "Design of PLL–Based Clock Generation Circuits".

1992, IEEE International Solid–State Circuits Conference, pp. 94–95, Mehran Bagheri, et al., "TA 5.3: 11.6GHz 1:4 Demultiplexer with Bit–Rotation Control and 6.1 GHz Auto–Latching Phase–Aligner ICS".

*Primary Examiner*—Wellington Chin
*Assistant Examiner*—William Luther
*Attorney, Agent, or Firm*—Oblon, Spivak, McClelland, Maier & Neustadt, P.C.

[57] ABSTRACT

It is an object to realize a synchronization circuit with small size and low consumption power which enables capturing and phasing of external data without running external clock in parallel. Internal clock (2) is delayed by a delay line (1) to produce delay clocks (3), and one of the delay clocks (3) having its rise almost corresponding to that of an external data signal (6) becomes a select clock (5). An elastic store circuit (7) is a circuit which controls a row of D-latches with a row of C elements. Thus the elastic store circuit (7) captures the external data signal (6) with enough set up hold time at timing of the select clock (5) and then outputs the captured external data as an internal data signal (8) in synchronization with the internal clock (2).

18 Claims, 46 Drawing Sheets

SYNCHRONIZATION CIRCUIT THAT CAPTURES AND PHASES AN EXTERNAL SIGNAL

BACKGROUND OF THE INVENTION

1. Field of the Invention

The present invention relates to a synchronization circuit including bit synchronization, or a synchronization circuit including bit synchronization and cell synchronization at an input portion of a semiconductor integrated circuit.

2. Description of the Background Art

Recently, the technical development in the semiconductor integrated circuits has advanced so that blocks having a large number of functions can be built on one chip. Due to the restriction of packages and boards, however, it has a problem of pin neck that there is a limit in the number of input/output which can be interconnected. Furthermore, with speed-up of operation, in the aspect of the clock skew, that is, to solve the problem that the phase difference will occur due to the difference in interconnection length if data lines and clock lines are separately provided among chips, it is necessary to run the data lines and the clock lines in parallel to have external data signal and external clock in the same phase. Even if the data lines and the clock lines are run in parallel, however, occurrence of physical phenomena such as reflection and crosstalk becomes considerable as the operation is speeded up. In this point of view, transmission of high speed clock lines among chips itself is becoming difficult.

Considering the aforementioned situation, some techniques are proposed for enabling capturing of external data and phasing by incorporating synchronization circuits free from clock skew (the state with no delay in phase of clock) in chips without running clocks in parallel for each data line. By these techniques, the number of input can be decreased and also transmission at high speed can be dealt with.

The techniques include one which utilizes a timing generation circuit using a delay line, whose structure is shown in a block diagram of FIG. 43. This technique is disclosed in FIG. 1. in "International Solid-State Circuits Conference (ISSCC)-90" Feb. 15, 1990 P104, IEEE.

In the method shown in the figure, the external data 124 is delayed by the delay line 120, from which delayed external data, data in the phase having sufficient set up hold time for the internal clock 125 is selected as the select data 126 by the select circuit 121, and the select data 126 is synchronized with the internal clock 125 in the D-flip flop(referred to as D-F/F, hereinafter) 123. Now, the phase having sufficient set up hold time means the case where a rise or a fall of the internal clock 125 is nearly at the middle timing in the time when the external data is at the "H" level.

As a method of controlling delay value of the aforementioned delay line 120, the method disclosed in Japanese Patent Publication No. 3-62052 (U.S. Pat. No. 412,490) is cited, though it is not proposed directly for a bit synchronization circuit. This method relates to generation of two-phase clocks with strictly controlled duty values.

Furthermore, the second conventional art relates to a conventional example of cell phase synchronization, which is disclosed in the column of the prior art in Japanese Patent Laying-Open No. 4-92534. A block structure diagram of this technique is shown in FIG. 44.

In the technique illustrated in the figure, the method is adopted in which the internal clock 144 is divided into several bits using the reference counter 155, and each clock 145 is controlled by the cell phase comparator 156 when decomposing the external data 141 into parallel by the serial/parallel converter (simply referred to as S/P) 146, and subsequently it is re-converted by the P/S 147 to generate the internal data 150.

The cell synchronization here means a synchronization process made to extract data which belong to head in data in one frame of the captured external data, where the external cell pulse 142 is inputted running in parallel with the data line for the external data 141, but the phase of each external cell pulse 142 is sifted because the interconnection length differs for each chip outputting the external data.

Accordingly, in the conventional art, the external data 141 is decomposed into parallel signals by each D-F/F 149 included in the S/P 146 to lengthen cycle of the decomposed external data 151-154. Thus, each external data 151-154 has enough set up - hold time for the internal clock 144, enabling cell synchronization by the internal clock 144. A timing chart in the cell synchronizing is shown in FIG. 45.

Now, in FIG. 44, 143 represents a reference cell pulse and 148 represents a select signal.

Furthermore, the third conventional art shown in the block diagram of FIG. 46 relates to bit synchronization for capturing external data, where the operation of the external data 135-138 is sufficiently slowed down by widening the bit width of the S/P 129, and the art realizes the bit synchronization at a transmission speed capable of surely capturing the external data 131. In this case, the external data 131 and the external clock 132 are in the same phase because they are inputted running in parallel and the cycle of the external data is lengthened by the D-latch 134. In order to allow enough set up - hold time at that time, such control is required so that when clocks of the D-latches 134 on both ends and the internal clock coincide, it is detected, and the data can be captured at timing just intermediate.

In the above-described first conventional art, there is a problem that a combination of the delay line and the select circuit is needed for each input line of the external data. Also, there is a problem about control of delay value of the delay line that a loop configuration is required, so that the circuit configuration becomes complex, and that it is necessary to control the total delay value in the delay line to be strictly equal to one period of the external data, so that the control is not easy and it is not practical.

In the second conventional art, a register or a D-F/F for the bit width of cell phase adjustment is required for each part of the S/P, P/S, counter, so that the circuit scale becomes larger. Furthermore, head of a cell must always be above the same register or D-F/F, so that the circuit scale becomes larger in proportion to the cell phase adjust pulse width, and at the same time three is a limitation that the adjust width must be a measure of the cell period. For example, if one cell is 110 bits, the adjustment width is 2 bits, 5 bits, 10 bits, 11 bits . . . , and so on.

Moreover, in the third conventional art, there is a problem that the requirement of enabling capturing of data and phase synchronization without running clock in parallel for each data line is not satisfied at all because the external clock is basically run in parallel with the external data. In addition, since such a circuit configuration in which latches always operate is adopted, it also involves a problem that the consumption power inevitably increases.

SUMMARY OF THE INVENTION

A synchronization circuit according to the present invention comprises: a first terminal for inputting an external data signal; a second terminal for inputting an internal clock; a delay line connected to the second terminal for sequentially delaying the internal clock to produce a plurality of delay clocks; a clock select circuit connected to the first terminal and the delay line for selecting one of the plurality of delay clocks which makes a level change while the external data signal is at a predetermined level and for outputting the selected delay clock as a select clock; and an elastic store circuit having a bit synchronization portion, the bit synchronization portion being connected to the first and second terminals and the clock select circuit and capturing the external data signal in accordance with the level change of the select clock and further converting captured the external data signal to an internal data signal with its phase being synchronized with the internal clock to output the internal data signal.

In this invention, as the select clock changes its level while the external data signal is at the predetermined level, the elastic store circuit captures the external data signal in accordance with the level change of the select clock while the external data signal is at the predetermined level. Accordingly, the elastic store circuit can ensure enough set up · hold time when capturing the external data signal. After that, the elastic store circuit converts the captured external data signal to the internal data signal with its phase being in synchronization with the internal clock to output the internal data signal.

Preferably, in this invention, in the synchronization circuit according to claim 1, the bit synchronization portion of the elastic store circuit includes a row of latches having a plurality of latches serially connected for sequentially latching the external data signal and outputting the internal data signal from the latch on the final stage and a row of self-timed C elements having a plurality of self-timed C elements provided for each of the latches and connected serially, wherein, in the plurality of self-timed C elements, the self-timed C element on the first stage inputs the select clock as its request signal, the self-synchronization C element on the final stage inputs the internal clock as its acknowledge signal, each of the plurality of self-timed C elements controls a corresponding latch to a hold state if the latch is in an empty state when receiving input of the request signal outputted by the self-timed C element on the preceding stage, outputs the request signal and acknowledge signal to each of the self-timed C elements on the following stage and the preceding stage, and subsequently controls the latch to an open state in accordance with input of the acknowledge signal outputted by the self-timed C element on the following stage, and if corresponding the latch is in an occupation state when receiving input of the request signal outputted by the self-timed C element corresponding to the preceding stage, it controls the latch from the hold state to the open state in accordance with input of the acknowledge signal outputted by the self-timed C element on the following stage, and further outputs the request signal and acknowledge signal to the self-timed C elements on the following stage and the preceding stage respectively and controls the latch from the open state to the hold state again.

In this invention which is one of the preferred modes described above, each self-timed C element sends/receives the request signal and the acknowledge signal between the self-timed C elements on the preceding stage and the following stage to control the open/hold states of a corresponding latch, and thus the external data is sequentially transferred. At this time, the self-timed C element on the first stage makes the corresponding latch hold the external data in synchronization with input of the select clock.

After that, when the corresponding latch is in an empty state, that is, in a state where no data is held, each self-timed C element causes the corresponding latch to be in the hold state in synchronization with input of the request signal, captures the data transferred from the latch on the preceding stage in the corresponding latch, outputs the request signal commanding capturing of the data to the self-timed C element on the following stage, receives the acknowledge signal indicating that the data has been captured outputted from the self-timed C element on the following stage, and places the corresponding latch in the open state.

On the other hand, when the corresponding latch is already in the occupation state, the self-timed C element holds the corresponding latch still in the hold state until the acknowledge signal is sent from the self-timed C element on the following stage. Accordingly, the self-timed C element on the preceding stage can not place its corresponding latch in the open state, either, and holds it in the hold state. Then, receiving transfer of the acknowledge signal, that self-timed C element places the corresponding latch in the open state and outputs the acknowledge signal indicating that the data can be captured to the self-timed C element on the preceding stage.

The self-timed C element on the final stage receives the internal clock which is an acknowledge signal which it inputs and captures the data. Accordingly, the phase difference between the external data signal captured in synchronization with the select clock and the internal clock is absorbed by the transfer by control of the row of self-timed C elements, and thus the internal signal in synchronization with the internal clock is obtained.

A synchronization circuit of a further preferred mode of the invention is a synchronization circuit according to claim 2, where the first terminal also inputs a signal corresponding to an internal cell phase pulse before both bit synchronization and cell synchronization transmitted running in parallel with the external data signal, the bit synchronization portion of the elastic store circuit applies the same processing to the signal corresponding to the internal cell phase pulse as the processing to the external data signal and outputs it as the internal signal, the elastic store circuit further comprises a cell synchronization portion connected to the bit synchronization portion, the cell synchronization portion having a row of new latches having a plurality of new latches having its first stage connected to the bit synchronization portion of the elastic store circuit and connected serially for sequentially latching the internal data signal outputted by the bit synchronization portion and outputting it as a cell synchronization data signal, a row of new self-timed C elements having a plurality of new self-timed C elements connected serially each provided for each of the new latches for controlling the new latches, a cell phase comparator for comparing the internal cell phase pulse outputted by the new self-timed C element on the final stage of the row of new self-timed C elements and a reference cell phase pulse and, when the internal cell phase pulse delays from the reference cell phase pulse, outputting a first cell phase adjust signal only for the delay time, and when the internal cell phase pulse is advanced from the reference cell phase pulse, outputting a second phase adjust signal only for the advancing time, and when the internal cell phase pulse and the reference cell phase pulse agree in phase, outputting none of the first and second cell phase adjust signals, a first cell phase control portion for outputting a write clock in accordance with the internal clock inputted from the second terminal when the cell phase comparator dose not output the first cell phase adjust signal, and the write clock in accordance with the first cell phase adjust signal when the cell phase comparator outputs the first cell phase adjust signal to the new self-timed C element on the first stage as its request signal, respectively, and a second cell phase control portion for outputting a read clock obtained by delaying output of the internal clock inputted from the second terminal by certain period of its period when the cell phase comparator dose not output the second cell phase adjust signal, and the read clock in accordance with the second cell phase adjust signal when the cell phase comparator outputs the second cell phase adjust signal to the new self-timed C element on the final stage as its acknowledge signal, respectively, and the new self-timed C element having the same function as that of the self-timed C element.

In the above-described invention which is a preferred implementation, each of the new self-timed C elements sends/receives the request signal and the acknowledge signal between the new self-timed C elements on the preceding stage and the following stage to control the open/hold state of a corresponding latch, and thus the internal data is sequentially transferred.

The cell phase comparator outputs the first cell phase adjust signal to the first cell phase control portion when the internal cell phase pulse outputted by the new self-timed C element on the final stage is delayed from the reference cell phase pulse, and the first cell phase control portion outputs the write clock to the new self-timed C element on the first stage. Thus, the new self-timed C element on the first stage inputs the write clock as a request signal and controls the corresponding new latch. As a result, the transfer of the data is accelerated, and the cell synchronization data signal outputted from the new self-timed C element on the final stage comes in the same phase as the reference cell phase pulse.

On the other hand, when the internal cell phase pulse outputted by the new self-timed C element on the final stage is advanced from the reference cell phase pulse, the cell phase comparator outputs the second cell phase adjust signal to the second cell phase control portion and the second cell phase control portion outputs the read clock to the new self-timed C element on the final stage. Thus, the new self-timed C element on the final stage inputs the read clock as an acknowledge signal and controls the corresponding new latch on the final stage. As a result, the data transfer is delayed so that the cell synchronization data signal outputted from the new self-timed C element on the final stage comes in the same phase as the reference cell phase pulse.

Furthermore, one of the preferred implementations of the invention, in the synchronization circuit according to claim 1, further comprises a phase-locked loop circuit and a current mirror circuit driven by receiving a VCO control voltage signal for a voltage controlled oscillator in the phase-locked loop circuit, wherein the delay line includes a plurality of buffers connected serially which are driven by current generated by the current mirror circuit.

In the invention which is one of the preferred modes described above, the current mirror circuit is driven by the VCO control voltage signal which appropriately changes in correspondence with the temperature change and the like, and the delay line is driven by the current generated by the current mirror circuit.

Furthermore, in the invention, in a synchronization circuit for performing capturing and phasing of an external data signal by self-latch comprised of a plurality of latches connected serially for latching data of itself at a point of change of inputted data, the timing adjustment of latching by the self-latch is controlled by a row of self-timed C elements including serially connected self-timed C elements provided for each of the latches.

Furthermore, the invention comprises: a first terminal for inputting an external data signal; a second terminal for inputting an internal clock; a data change point pulse generation circuit connected to the first terminal for generating a pulse signal which is in synchronization with a change point of the external data signal, a bit synchronization portion having a row of latches connected to the first terminal and having a plurality of latches serially connected, and a row of self-timed C elements having self-timed C elements connected serially and provided for each of the latches for outputting a latch signal to the corresponding latch for controlling; and a cell synchronization portion connected to the self-timed C element and the latch on the final stage respectively in the row of self-timed C elements and the row of latches and to the second terminal for capturing a data signal outputted by the latch on the final stage in synchronization with an acknowledge signal outputted by the self-timed C element on the final stage and further outputting the captured data signal in synchronization with the internal clock, wherein the self-timed C element on the first stage in the row of self-timed C elements inputs the pulse signal as its request signal, and the self-timed C element on the final stage is connected to the second terminal and inputs the internal clock as the acknowledge signal, each of the self-timed C elements, if the corresponding latch is in an empty state when receiving input of the request signal outputted by the self-timed C element corresponding to the preceding stage, controls the latch to a hold state, outputs the request signal and acknowledge signal to each of the self-timed C elements corresponding to the following stage and the preceding stage, and subsequently, controls the latch to an open state in accordance with input of the acknowledge signal outputted by the self-timed C element on the following stage, and if the corresponding latch is in an occupation state when receiving input of the request signal outputted by the self-timed C element corresponding to the preceding stage, it controls the latch from the occupation state to the open state in accordance with input of the acknowledge signal outputted by the self-timed C element on the following stage, and further outputs the request signal and acknowledge signal to the self-timed C elements on the following stage and the preceding stage, respectively.

In this invention, each self-timed C element sends/receives the request signal and the acknowledge signal between the self-timed C elements on the preceding stage and the following stage to control the open/hold state of a corresponding latch, and thus the external data is sequentially transferred to accomplish the bit synchronization. Here, the self-timed C element on the first stage captures the external data signal at the timing of the pulse signal generated by the data change point pulse generation circuit and the self-timed C element on the final stage captures the data in accordance with the timing of the internal clock. Therefore, the phase difference between the external data signal and the internal clock is absorbed, and furthermore, the data outputted by the latch on the final stage is outputted being in cell synchronization by the cell synchronizing portion.

Accordingly, according to the present invention, the external data can be captured in synchronization with the internal clock without running the external clock in parallel, and furthermore such bit synchronization can be realized with circuit structure capable of small scale and high speed lock.

According to the present invention, synchronization circuits of high speed, small size and of low consumption power type can be realized.

It is an object of the present invention to realize a high speed synchronization circuit with small scale and low consumption power which enables capturing and phasing of the external data without running clock in parallel for each data line in one chip (LSI). Furthermore, it is also an object of the present invention to make the synchronization function accomplished by the present synchronization circuit applicable to the cell synchronization in addition to the bit synchronization.

It is another object of the present invention to realize a synchronization circuit accomplishing bit synchronization with control by a row of self-timed C elements to realize a synchronization circuit with small scale and low consumption power and capable of high speed lock.

It is still another object of the present invention to realize select clock by encoding output of a delay line to make the circuit scale smaller and the consumption power lower, and also to generate the select clock for capturing an external data signal without strictly controlling delay amount of the delay line to one period of the external data signal.

It is a further object of the present invention to prevent the external data from being left out without captured in the self-timed C element on the final stage.

It is a further object of the present invention to detect error operation due to effects of noise and the like to enable return to normal operation without making the circuit scale larger.

It is a further object of the present invention to realize both the bit synchronization control and the cell synchronization control with circuit configuration of small scale and low consumption power type using a row of self-timed C elements without running external clock in parallel.

It is a further object of the present invention to enable realization of a error detection function in the cell synchronization.

It is a further object of the present invention to realize a delay line of the low consumption power type capable of having delay value always constant to realize an stable synchronization circuit which is not affected by inequality in process and temperature change.

It is a further object of the present invention to realize a small sized synchronization circuit performing bit synchronization and cell synchronization at high speed using a row of self-timed C elements for timing adjustment of self-latches.

These and other objects, features, aspects and advantages of the present invention will become more apparent from the following detailed description of the present invention when taken in conjunction with the accompanying drawings.

DESCRIPTION OF THE PREFERRED EMBODIMENTS (First Preferred Embodiment)

In the actual inter-chip interfaces, several bits are often data outputted from similar chips, in which case it is advantageous in the aspect of saving the circuit to simultaneously capture the plurality of bits at the same timing. Considering this point of view, the present invention constitutes a synchronization circuit.

A synchronization circuit according to the first preferred embodiment of the present invention will be described below referring to the figures.

Figure 1:
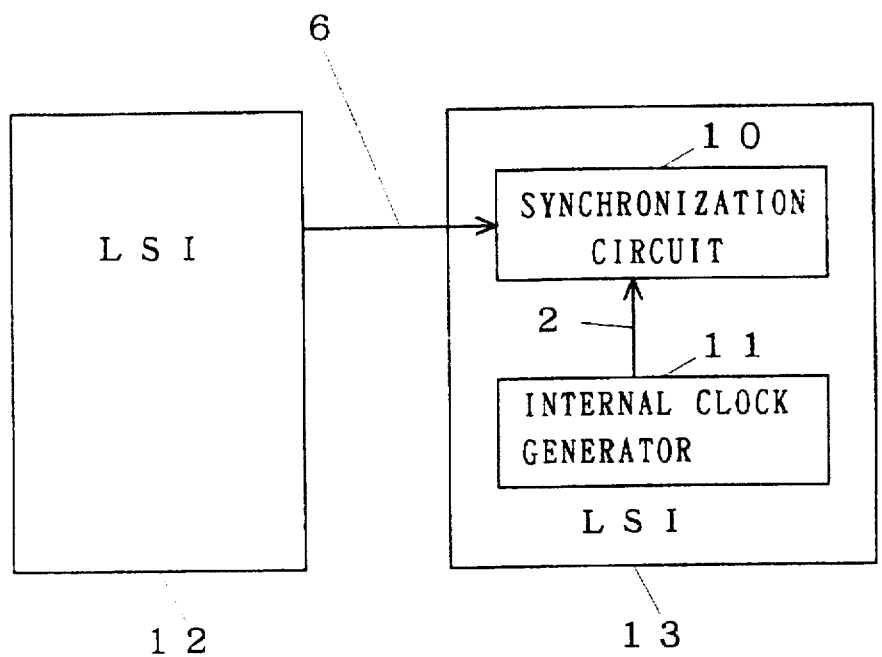
FIG. 1 is a block diagram showing an LSI incorporating a synchronization circuit according to the first preferred embodiment.

FIG. 1 is a block diagram schematically showing the data transmission between two chips (LSIs), where a synchronization circuit 10 as the first preferred embodiment is incorporated in an LSI 13. An internal clock generator 11 also provided in the LSI 13 oscillates internal clock 2 and outputs the internal clock 2 to the synchronization circuit 10. An LSI 12 transfers an external data signal 6 (serial signal) to the LSI 13 and the synchronization circuit 10 performs capturing (bit synchronization) of the external data signal 6 in synchronization with the internal clock 2.

Figure 2:
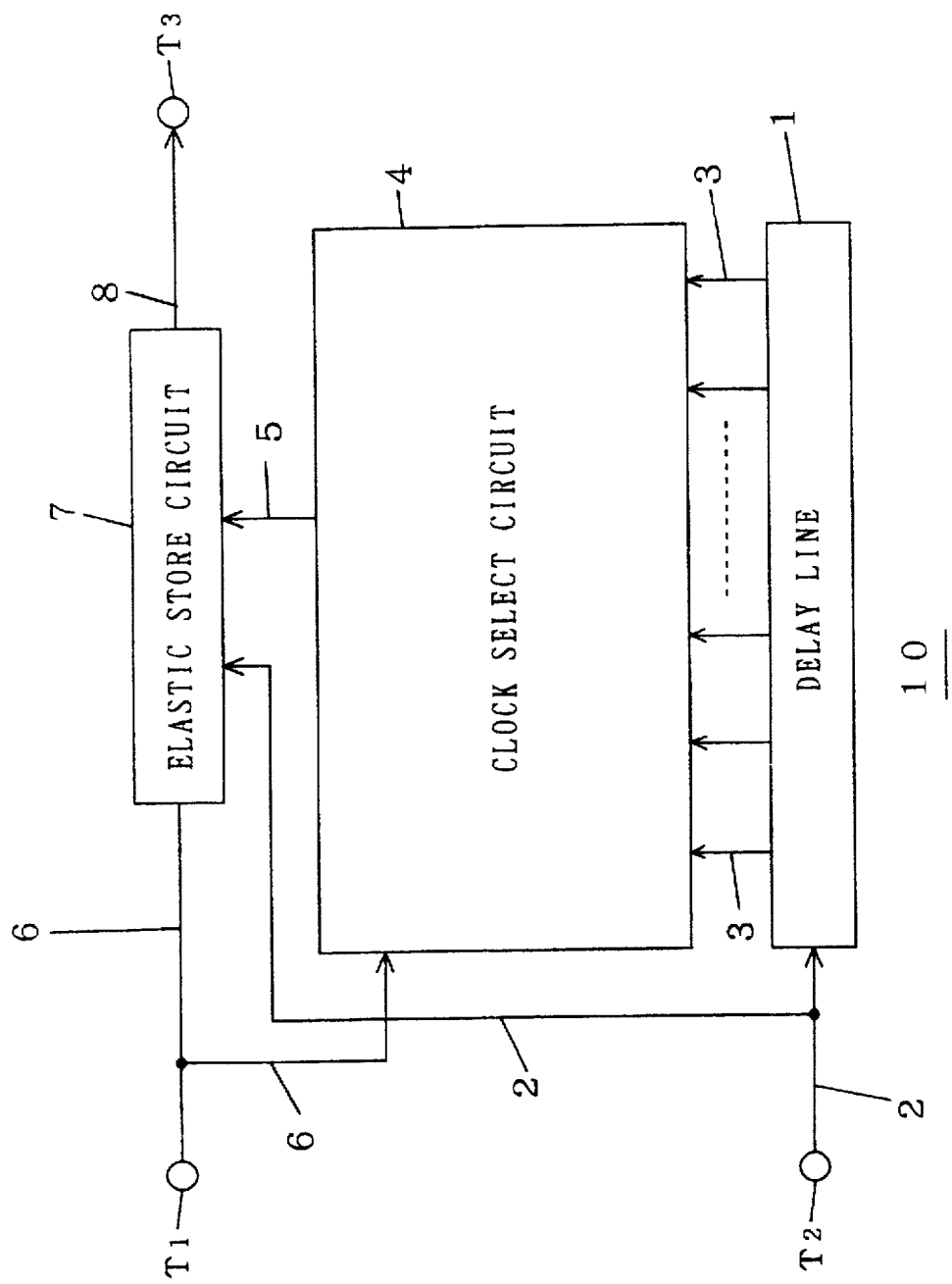
FIG. 2 is a block diagram showing the structure of the synchronization circuit according to the first preferred embodiment.

FIG. 2 is a block diagram showing the structure of the synchronization circuit 10. A first terminal $T_1$ is an input terminal for inputting the external data signal 6 to the synchronization circuit 10 and a second terminal $T_2$ is an input terminal for inputting the internal clock 2 to the synchronization circuit 10. A third terminal $T_3$ is an output terminal for outputting an internal data signal 8 which is the external data signal captured in synchronization with the internal clock 2 to another functional circuit portion in the LSI 13. The reference numeral 1 denotes a delay line composed of n (n≥2) buffers connected in series, 4 denotes a clock select circuit and 7 denotes an elastic store circuit.

When the second input terminal $T_2$ inputs the internal clock 2 to the delay line 1, the delay line 2 successively delays the internal clock 2 n times with the internal buffers (not shown) included therein and provides the obtained outputs of each buffer to the clock select circuit 4 as delay clocks 3 (of which number is n).

The first input terminal $T_1$ inputs the external data signal 6 to the clock select circuit 4 and the elastic store circuit 7.

Receiving the delay clocks 3, the clock select circuit 4 selects one out of them which is in synchronization with the external data signal 6 and which enables the capturing of the external data signal 6 with enough set up-hold time, and outputs the selected delay clock 3 as a select clock 5.

The elastic store circuit 7 captures the external data signal 6 in synchronization with the inputted select clock 5. Further, the elastic store circuit 7 serves to convert the external data signal 6 to the internal data signal 8 in accordance with the internal clock 2 inputted by the second input terminal $T_2$ and the select clock 5. The internal data signal 8 has a phase which is synchronized with the same of the internal clock 2.

Figure 3:
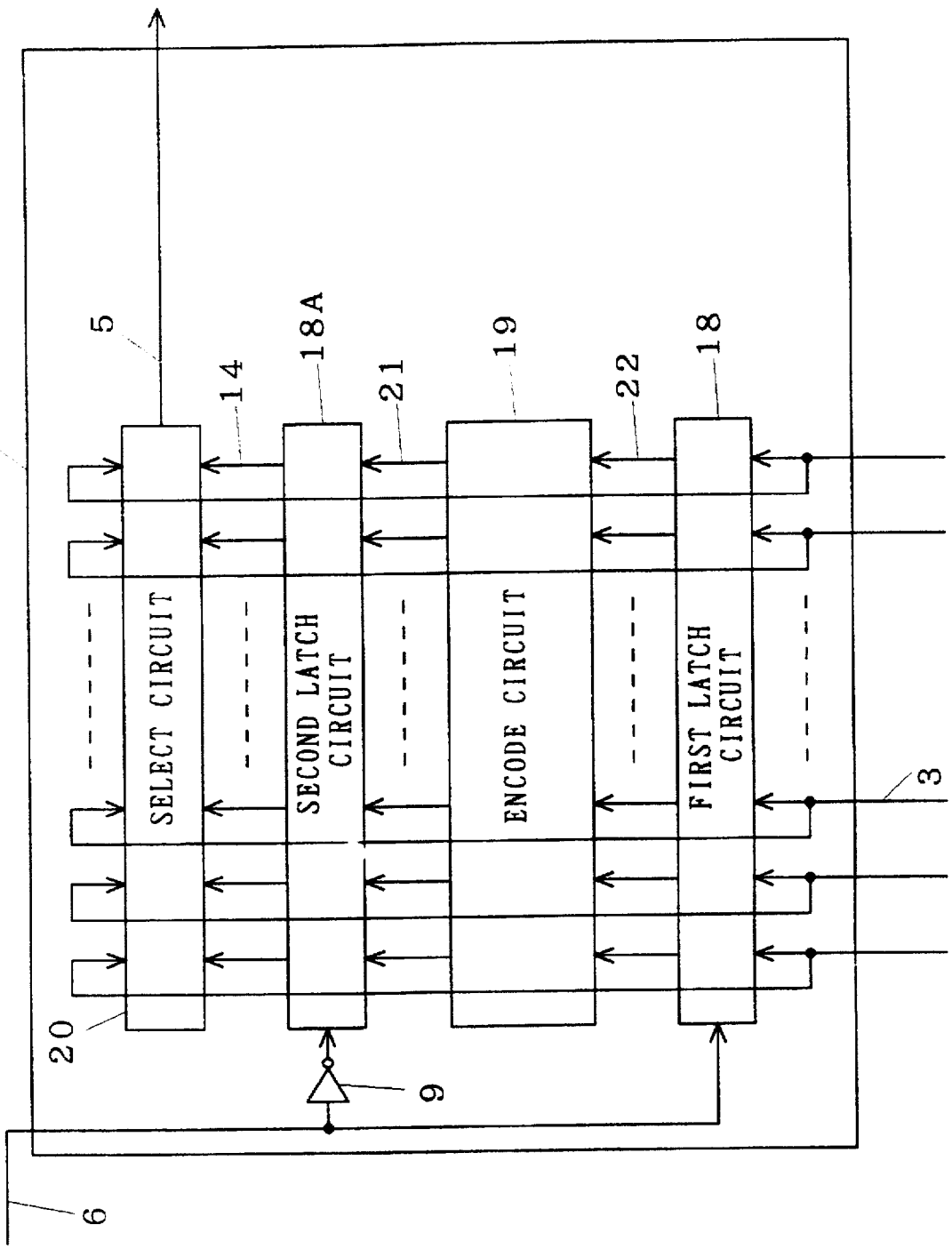
FIG. 3 is a block diagram showing an example of structure of a clock select circuit.

FIG. 3 is a block diagram showing the internal structure of the clock select circuit 4. The circuit 4 is generally divided into a first latch circuit 18, an encode circuit 19, a second latch circuit 18A and a select circuit 20.

The first latch circuit 18 captures the sequentially delayed n delay clocks 3 in response to the external data signal 6 and outputs its outputs 22 (referred to as a status signal, hereinafter) to the encode circuit 19, and the encode circuit 19 converts the status signals 22 into encode signals 21, and the second latch circuit 18A captures the encode signals 21 in synchronization with inversion output of the external data signal 6 from an inverter 9. The select circuit 20 selects one of the delay clocks 3 in accordance with outputs 14 of the second latch circuit 18A and outputs the selected delay clock 3 as the select clock 5.

Next, detailed structures and operations of individual parts of this circuit 4 will be described.

Figure 4:
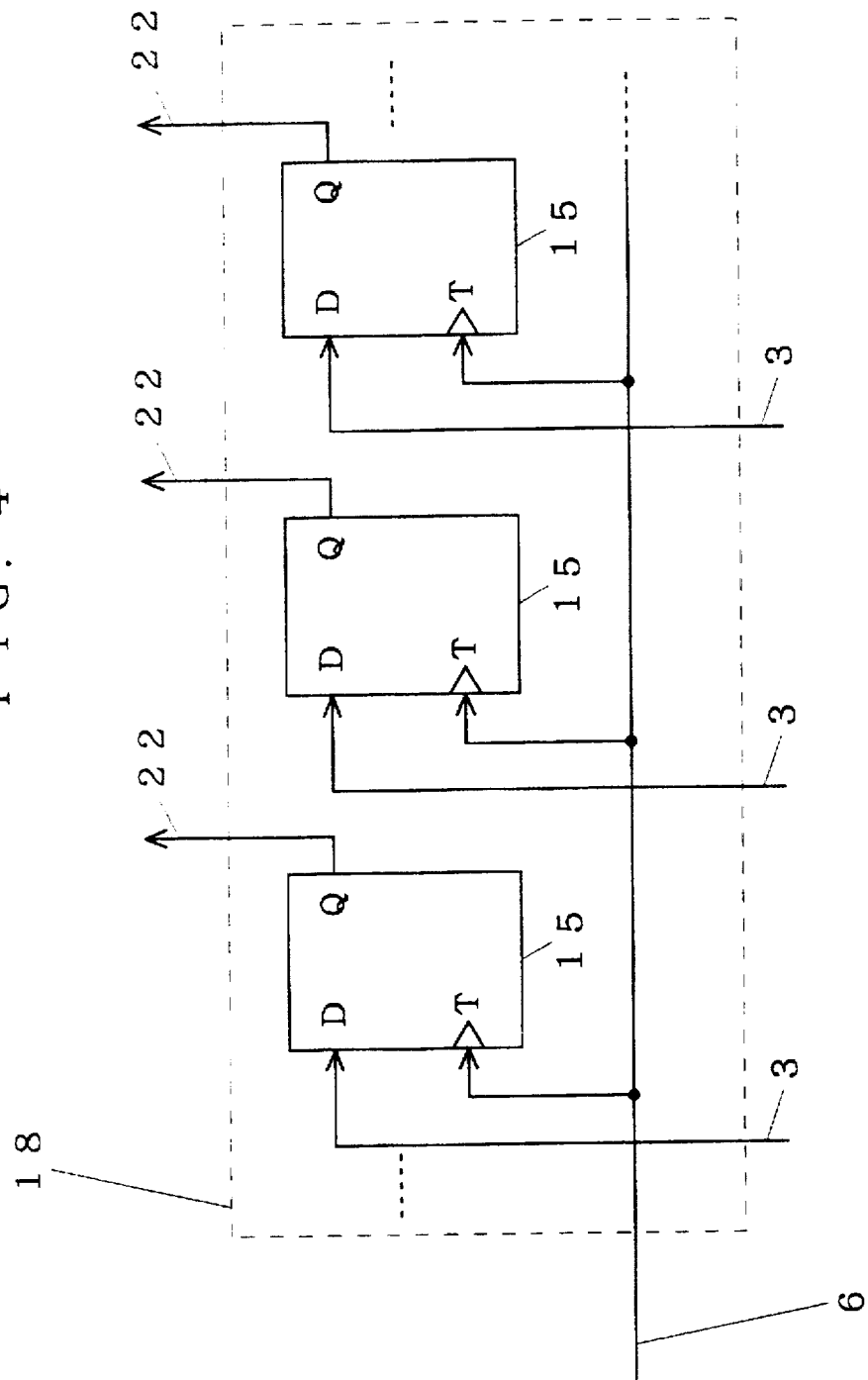
FIG. 4 is a block diagram showing an example of structure of a first latch circuit.

FIG. 4 is a block diagram showing the structure of the first latch circuit 18, where the circuit 18 is comprised of n up-edge operation type D-flip flops (referred to as D-F/F, hereinafter) (first flip flops) 15 corresponding to the number of the inputted delay clocks 3. It is a matter of course that this circuit 18 may be operated at fall of the external data signal 6 using D-F/Fs of the down-edge operation type. The first latch circuit 18 captures values of the delay clocks 3 in response to a rise of the external data signal 6 and outputs them to the encode circuit 18.

Figure 5:
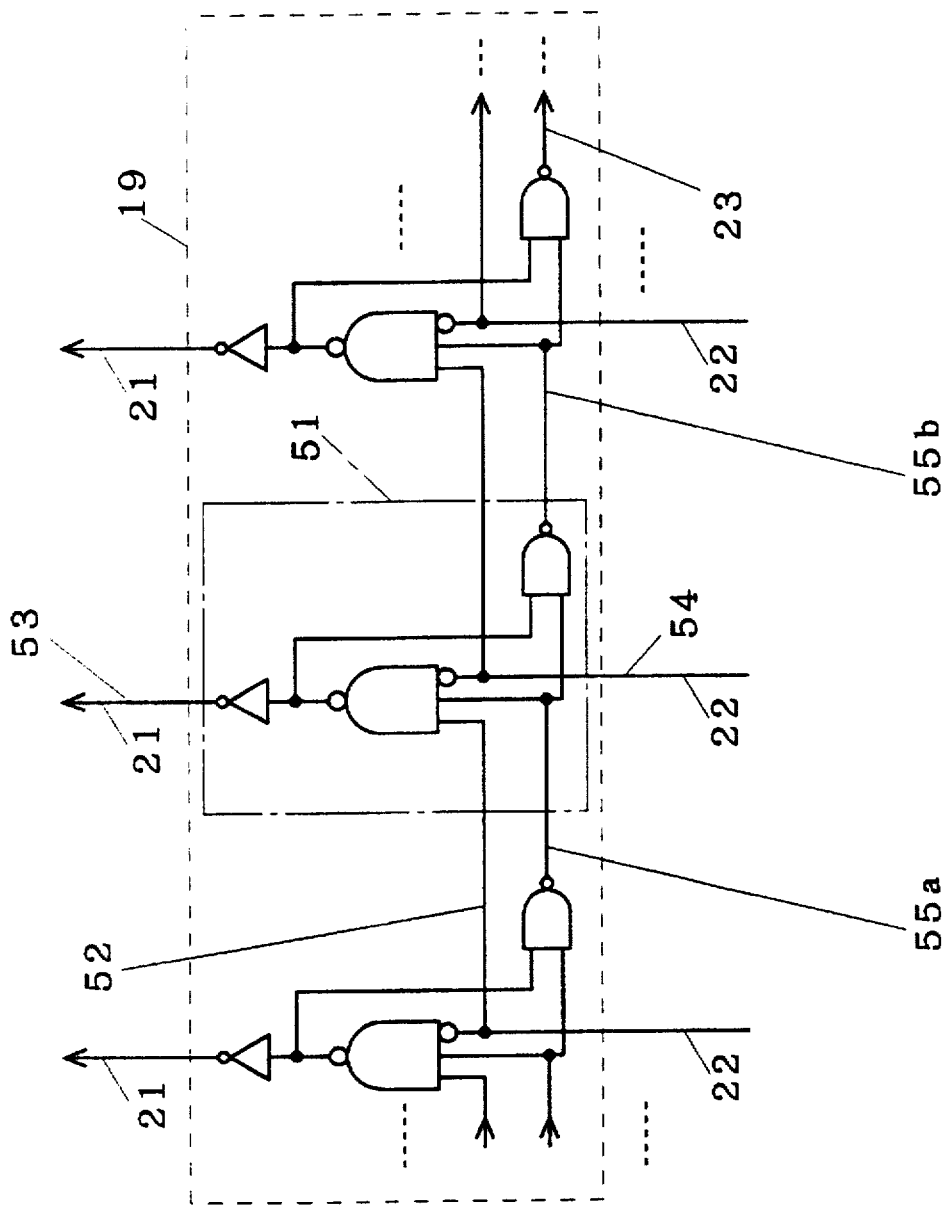
FIG. 5 is a diagram showing an example of structure of an encode circuit.

FIG. 5 is a circuit diagram showing the internal structure of the encode circuit 19. The circuit portion for outputting an encode signal 21 for one status signal 22 inputted is indicated as the region 51 surrounded with the chain line in FIG. 5. A truth table in this circuit portion 51 is shown below as Table 1.

TABLE 1

| The preceding stage clock | This stage clock | Flag input | Select output | Flag output |
|---|---|---|---|---|
| H | H | L | 0 | 0 |
| H | L | L | 1 | 1 |
| L | H | L | 0 | 0 |
| L | L | L | 0 | 0 |
| H | H | H | 0 | 1 |
| H | L | H | 0 | 1 |
| L | H | H | 0 | 1 |
| L | L | H | 0 | 1 |

Note that the preceding stage clock 52, this stage clock 54 and the select output 53 in Table 1 correspond to the status signal 22 of a circuit portion on the stage preceding to the circuit portion 51, the status signal 22 of that circuit portion 51 and the encode signal 21 in FIG. 5, respectively. Also, the flag input and the flag output in Table 1 correspond to a flag input signal 55a and a flag output signal 55b in FIG. 5, respectively.

The encode circuit 19 outputs such encode signals 21 as follows from the outputs 22 of the first latch circuit 18. First, it compares values of a certain status signal 22 and a status signal 22 on the preceding stage (output from the preceding delay clock 3), and only when the preceding stage output (the preceding stage clock 52) and this stage output (this stage clock 54) are at the "H" and "L" levels, respectively, it brings the encode signal 21 to the "H" level. For example, as shown in the timing chart of FIG. 6, when the timings of the three adjacent delay clocks 3 are A, B and C for a change of the external data signal 6, respectively, the level of the encode signal 21 which corresponds to the delay clock 3 represented at B in the figure becomes the "H" level.

On the other hand, when the total delay value of the delay line 1 is larger than one period of the external data signal 6 and there exist a plurality of combinations of the "H" level and the "L" level, it is necessary to always preferentially select only one of them.

Accordingly, the flag signal 23 is provided for, when the level of one of the encode signals 21 once rises to the "H" level, forcing encode signals 21 after that to the "L" level. By doing so, the total delay value of the delay line 1 dose not have to be strictly controlled for one period of the external data signal 6, and an encode signal 21 is always outputted if the delay is not less than the clock period of the external data signal 6.

Now, note that the "H" level corresponds to the second level and the "L" level corresponds to the first level, respectively. This relation of correspondence is the same in the following description.

Considering the processing time in the encode circuit 19, the second latch circuit 18A captures the output signals 21 of the encode circuit 19 on a fall of the external data signal 6 and outputs them as the select signals 14 to the select circuit 20. Now, the second latch circuit 18A has the same structure as that of the first latch circuit 18 shown in FIG. 4.

A D-F/F included in the second latch circuit 18A is referred to as a second flip flop.

Figure 7:
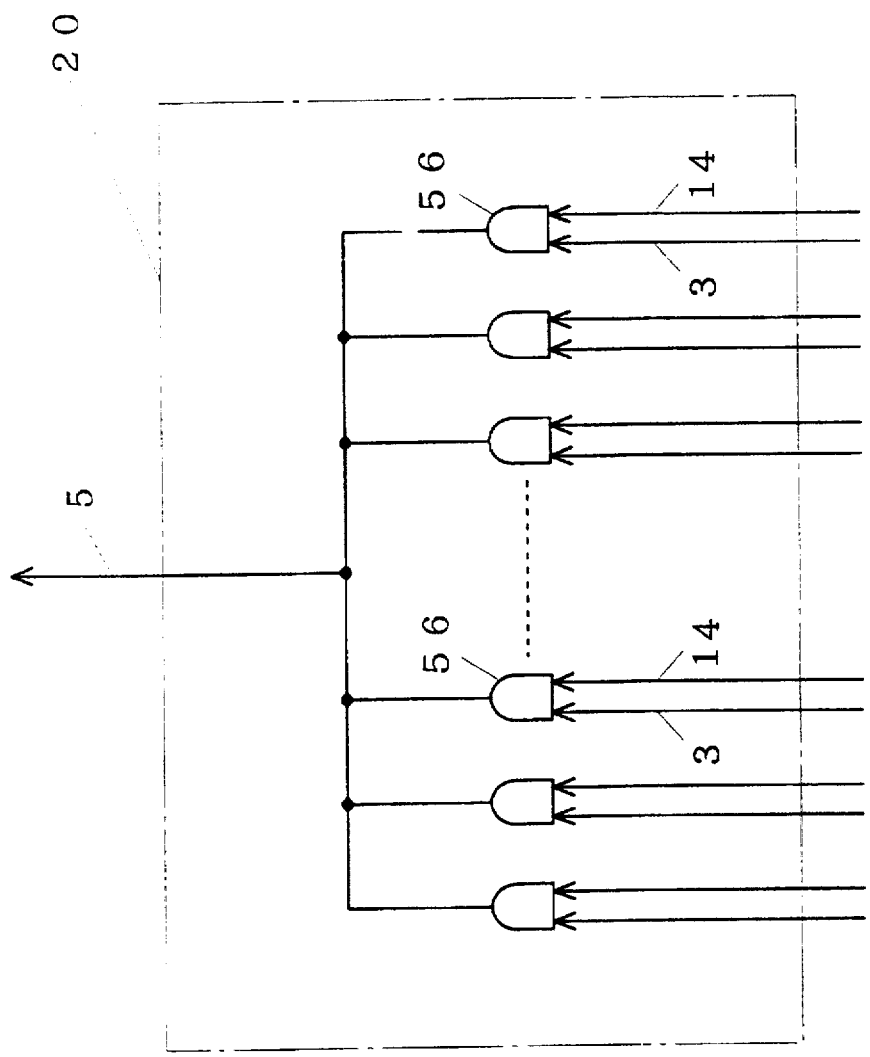
FIG. 7 is a diagram showing an example of structure of a select circuit.

FIG. 7 is a circuit diagram showing the internal structure of the select circuit 20, where each of the n select signals 14 is inputted to an AND circuit 56 together with a corresponding delay clock 3. The n AND circuits 56 are connected in parallel, and output of one of the AND circuits 56, that is, an AND circuit 56 to which one select signal 14 at the "H" level is inputted, is outputted as the select clock 5. Accordingly, the level of the outputted select clock 5 changes according to the level change of the delay clock 3 inputted to the corresponding AND circuit 56.

Figure 8:
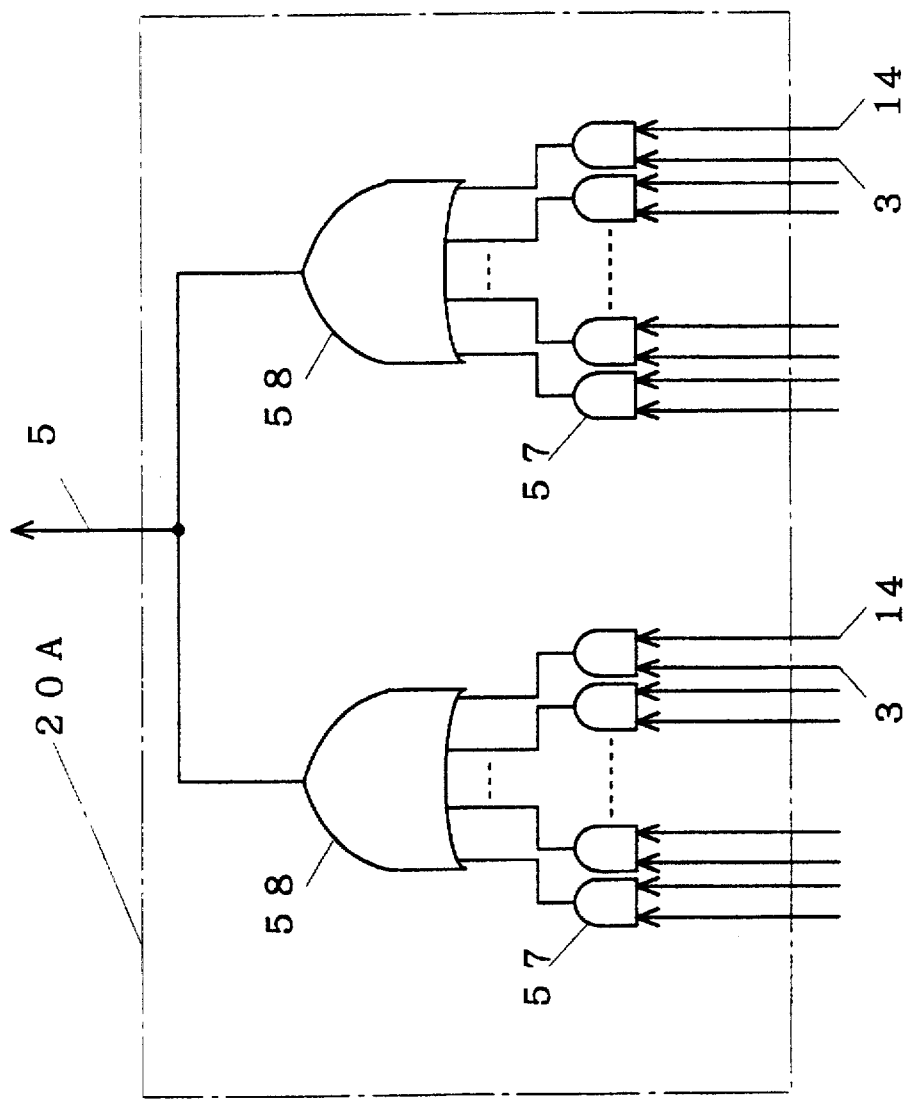
FIG. 8 is a diagram showing another example of structure of the select circuit.

As structure of the select circuit 20, the structure 20A shown in FIG. 8 can be taken in place of that shown in FIG. 7. In FIG. 8, 57 denotes an AND circuit and 58 denotes an OR circuit.

Figure 6:
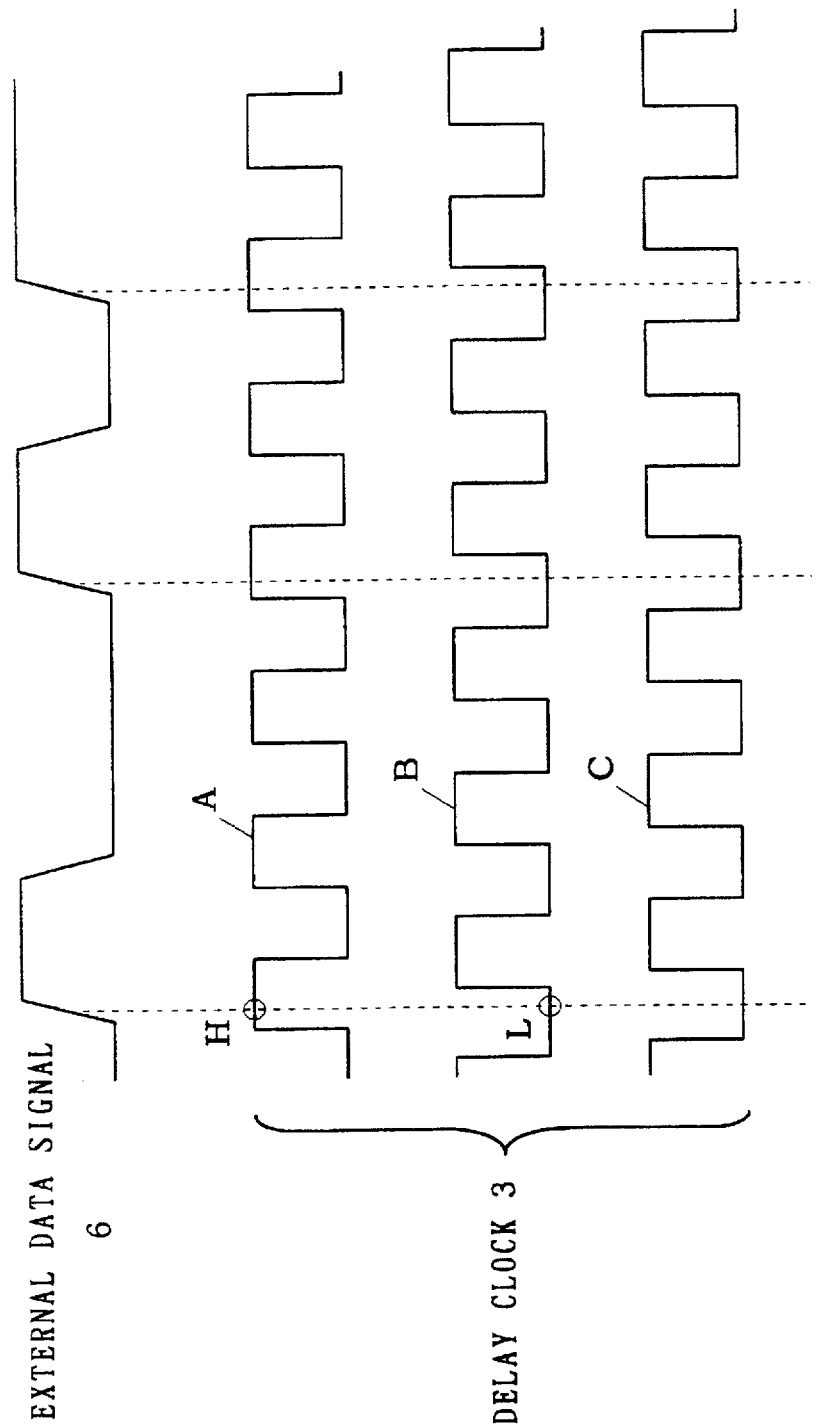
FIG. 6 is a timing chart illustrating the operation of the clock select circuit.

As a result, a rise of the select clock 5 and a rise of the external data signal 6 almost agree, and by capturing the external data signal 6 on a fall of the select clock 5 in the elastic store circuit 7 described hereinbelow, enough set up/hold time can be taken. (For example, refer to the case where the delay clock 3 represented at B in FIG. 6 is selected as a select clock 5.)

By constituting the clock select circuit 4 as described above, an external data capturing function with circuitry of small scale can be realized without running the external clock in parallel with the external data signal 6 and also without using a large number of registers and the like. Furthermore, the structure in which the select clock 5 is locked within one period time of the external data signal 6 is introduced, that is, the internal clock 2 is latched on a rise of the external data signal 6 and the select clock 5 is determined on its fall, so that it is possible to instantly deal with temporary unstableness of the external data signal 6 due to effects of jitter or the like.

Figure 9:
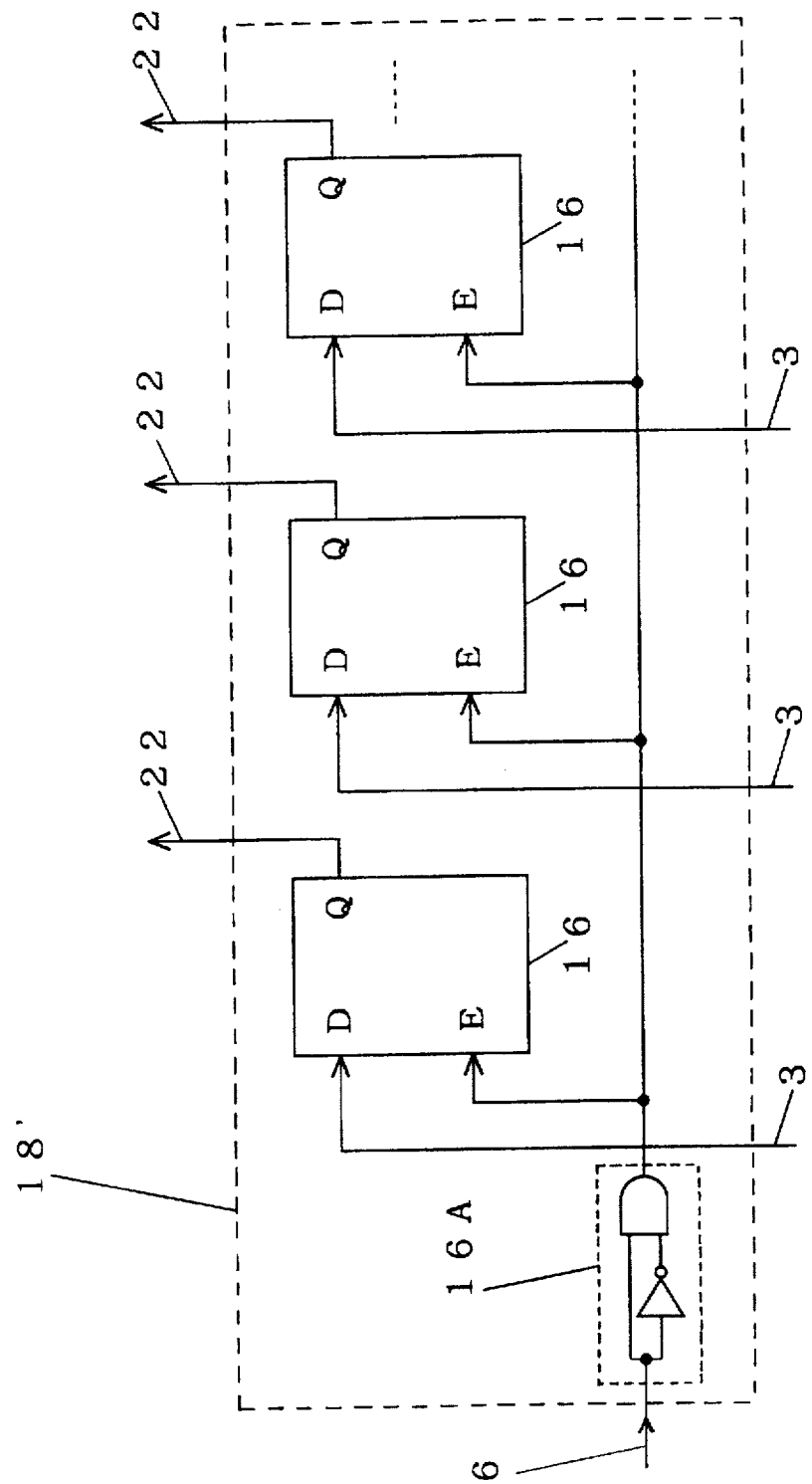
FIG. 9 is a diagram showing another example of structure of the first latch circuit.

Although the D-F/Fs 22 are used as component elements of the first (and second) latch circuit(s) 18 (18A) in FIG. 4, D-latches may be used instead. An example of such a case is shown in FIG. 9. In the figure, 16 denotes D-latches, where the gate circuit 16A comprised of an inverter and an AND circuit generates a pulse with short pulse width which rises to the "H" level in response to a rise time of the external data signal 6 from the "L" level to the "H" level and falls to the "L" level immediately after that and inputs the pulse to the E terminal of each D-latch 16. Accordingly, in this case, especially in the case of being locked (a state in which the select clock 5 is fixed), the select clock circuit 4 is not operating almost at all, so there is an advantage that the consumption power is suppressed low. In this point, the consumption power is considerably saved in comparison with the conventional art using the S/P-P/S circuits. The D-latches included in the first and second latch circuits 18 and 18A are referred to as first and second latches, respectively.

Figure 10:
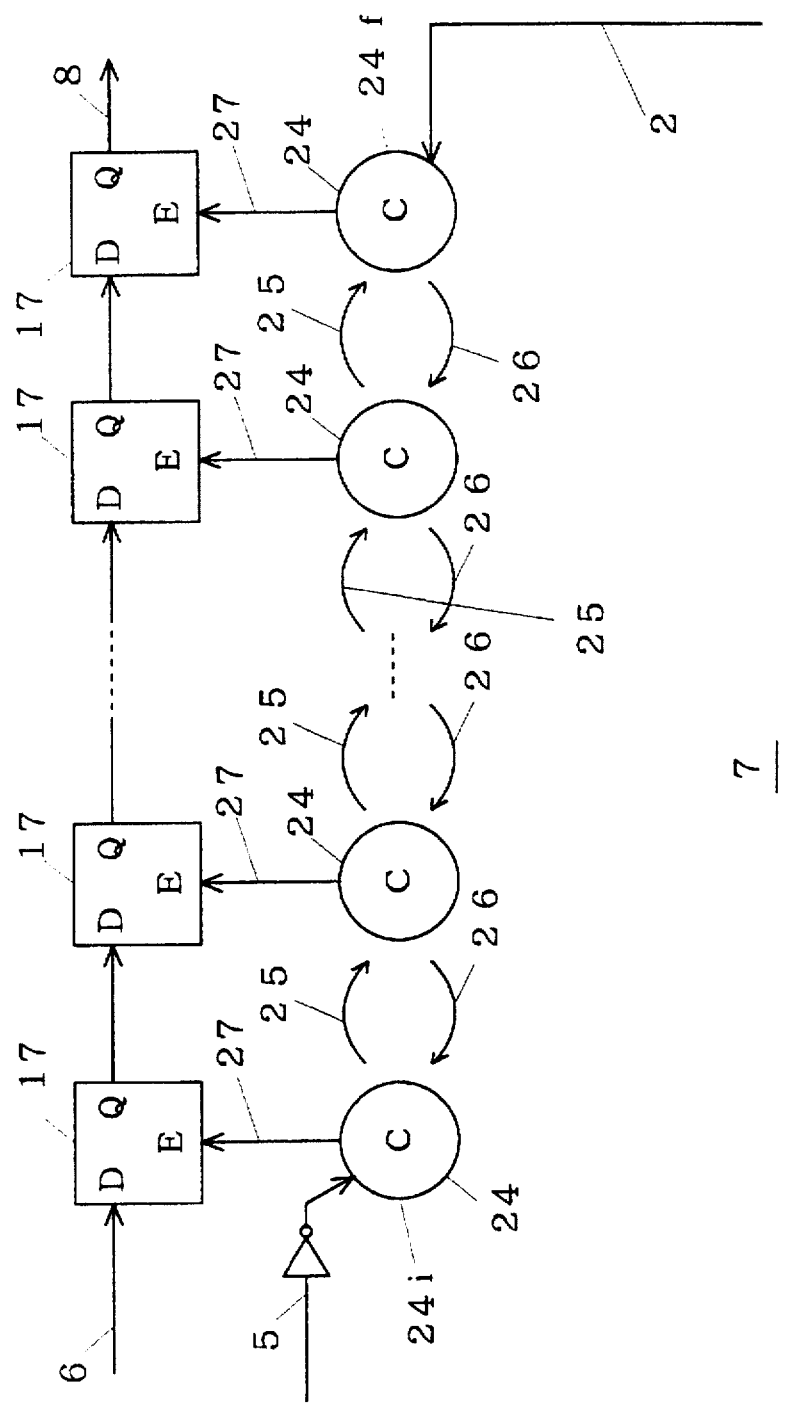
FIG. 10 is a diagram showing an example of structure of an elastic store circuit.

FIG. 10 is a block diagram showing an example of structure of the elastic store circuit 7 in FIG. 2. The circuit 7 includes a row of D-latches composed of a plurality of D-latches 17 connected serially and a row of self-timed C elements composed of serially connected self-timed C elements 24 each provided for each D-latch 17 to control corresponding one of the D-latches 17. Now, "C element" corresponds to a coincidence circuit. In these self-timed C elements 24, an inversion signal of the select clock 5 is inputted as a request input signal described below to the self-timed C element 24i on the first stage which outputs a latch signal 27 to the D-latch 17 to which the external data signal 6 is inputted. Also, to the self-timed C element 24f on the final stage which outputs the latch signal 27 to the D-latch 17 on the final stage which outputs the internal data signal 8, the internal clock 2 is inputted as an acknowledge input signal for the self-timed C element 24f. Here, the reference numerals 25 and 26 generically represent request signals and acknowledge signals, respectively. The operation of the self-timed C elements 24 will be described hereinbelow.

Figure 11:
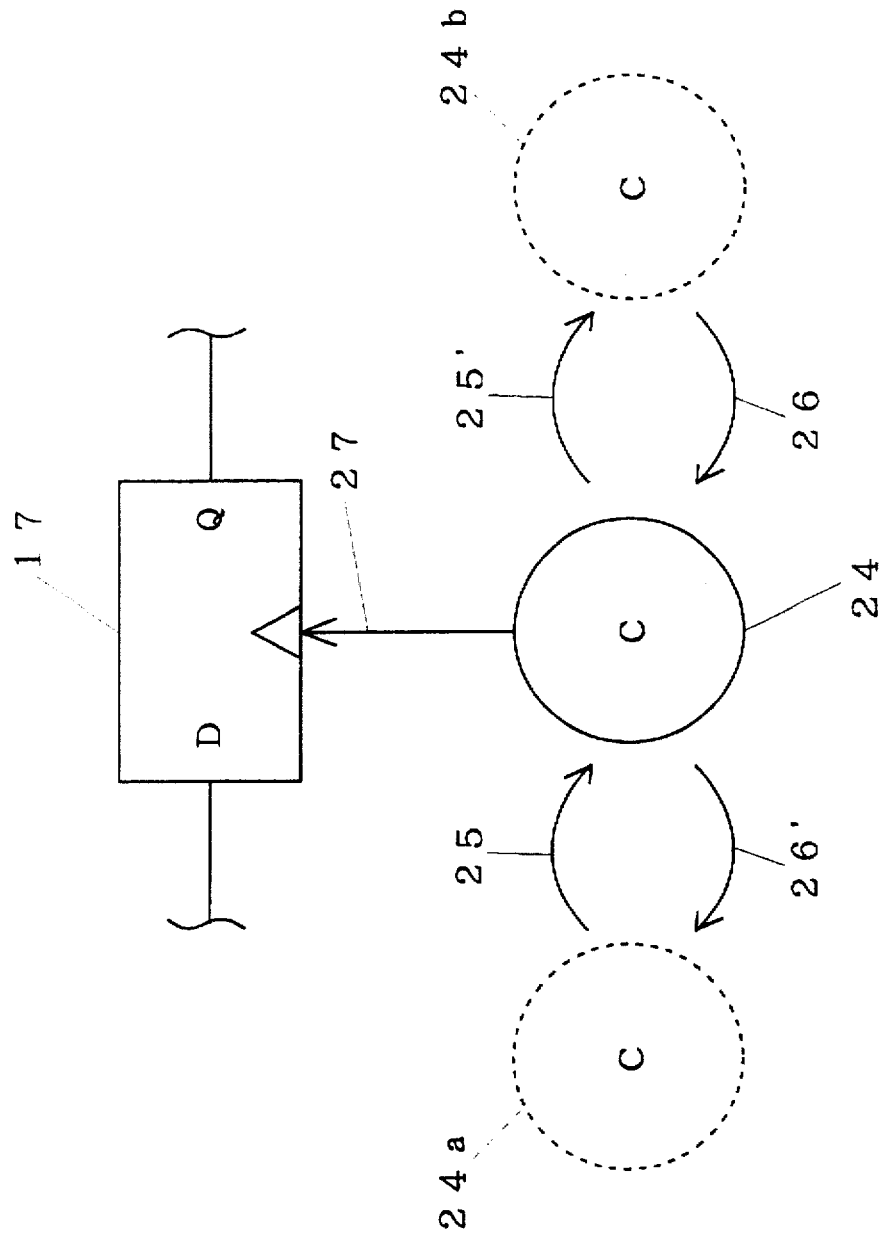
FIG. 11 is a diagram showing input/output of a request signal and an acknowledge signal in a certain self-timed C element.
Figure 12:
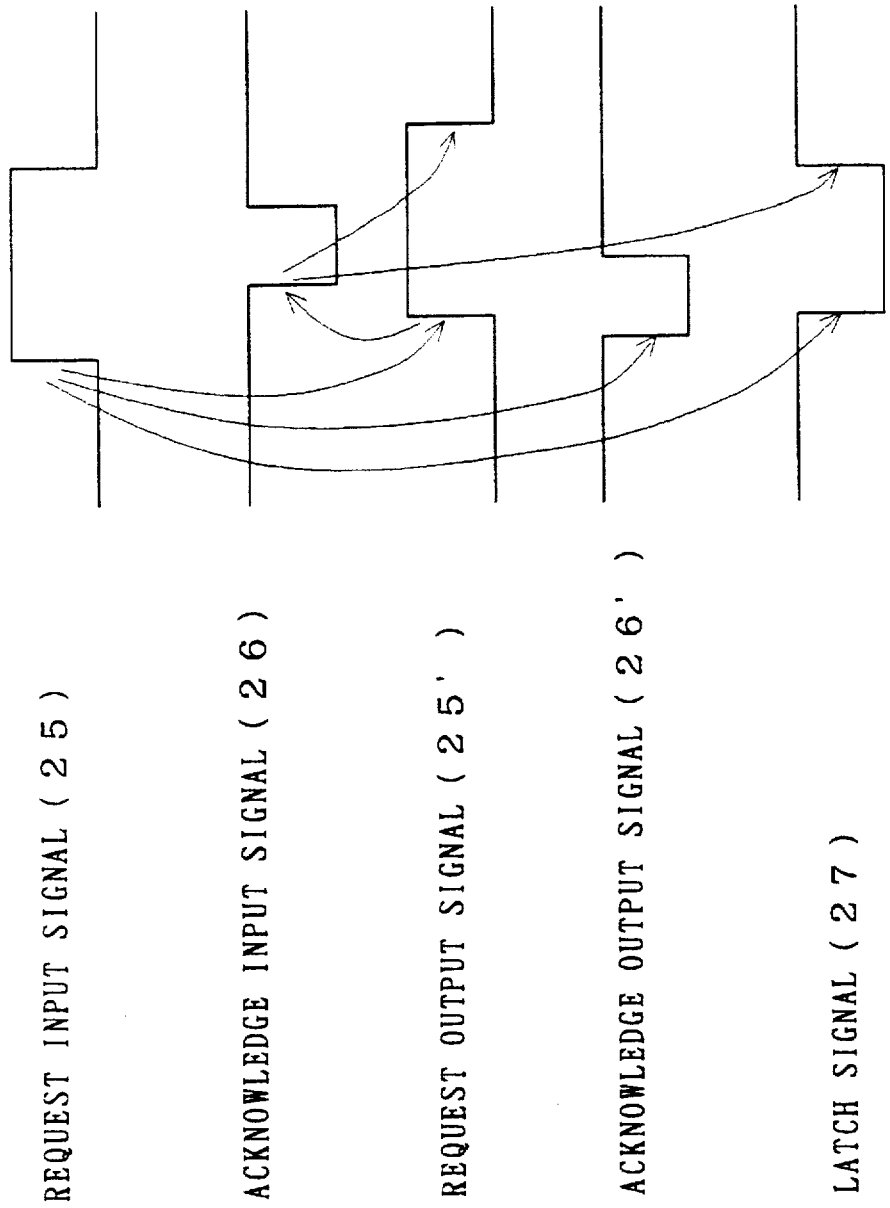
FIG. 12 is a timing chart showing the operation of the self-timed C element in the empty state.

Now, the operation of the self-timed C element 24 will be described referring to the schematic diagram of FIG. 11 and the timing charts of FIG. 12 and FIG. 13. In FIG. 11, a request signal and an acknowledge signal inputted to a certain self-timed C element 24 are indicated as a request input signal 25 and an acknowledge input signal 26, respectively, and a request signal and an acknowledge signal outputted from the above-stated self-timed C element 24 are indicated as a request output signal 25' and an acknowledge output signal 26', respectively. Now, the D-latch 17 is opened when the latch signal 27 is at the "H" level and the D-latch 17 is held when the latch signal 27 is at the "L" level.

First, consider a state where the D-latch 17 is open (an unlatch state), i.e. it is empty. The timing chart of this case is depicted in FIG. 12.

The self-timed C element 24 sends the latch signal 27 for placing the D-latch 17 in the hold state to the corresponding D-latch 17 in response to input of the request input signal 25 outputted by the self-timed C element 24a on the preceding stage and also outputs the acknowledge output signal 26' to the self-timed C element 24a on the preceding stage. Furthermore, the self-timed C element 24 sends the request output signal 25' to the self-timed C element 24b on the next stage. In turn, the self-timed C element 24b on the next stage receives the request output signal 25' and sends the acknowledge input signal 26 back to the self-timed C element 24 on its preceding stage, and the self-timed C element 24 receiving the acknowledge input signal 26 opens the D-latch 17 and also stops output of the request output signal 25'.

Figure 13:
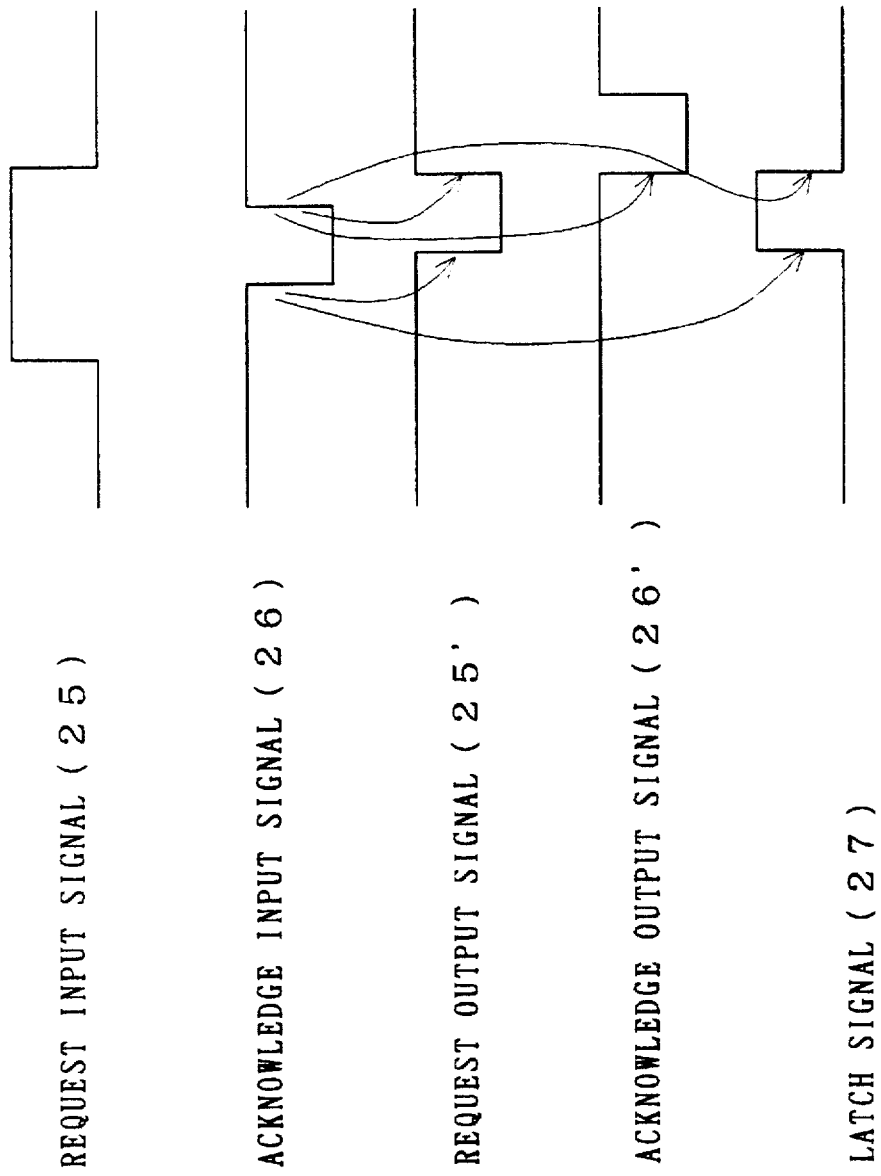
FIG. 13 is a timing chart showing the operation of the self-timed C element in the occupation state.

On the other hand, when the D-latch 17 is in the occupation state (latch state) or the hold state, as seen in the timing chart of FIG. 13, the self-timed C element 24 causes the latch signal 27 to rise to the "H" level in accordance with a fall to the "L" level of the acknowledge input signal 26 to put the D-latch 17 in the open state, and also causes the request output signal 25' to fall to the "L" level. This C element 24 then outputs the request output signal 25' to the self-timed C element 24b on the next stage in accordance with a rise to the "H" level of the acknowledge input signal 26 after that, and also causes the latch signal 27 to fall to the "L" level to put the D-latch 17 in the hold state. As the D-latch 17 has taken in the data on the preceding stage, the self-timed C element 24 outputs the acknowledge output signal 26' instructing to capture the data signal on the further preceding stage to the self-timed C element 24a on the preceding stage.

Figure 41:
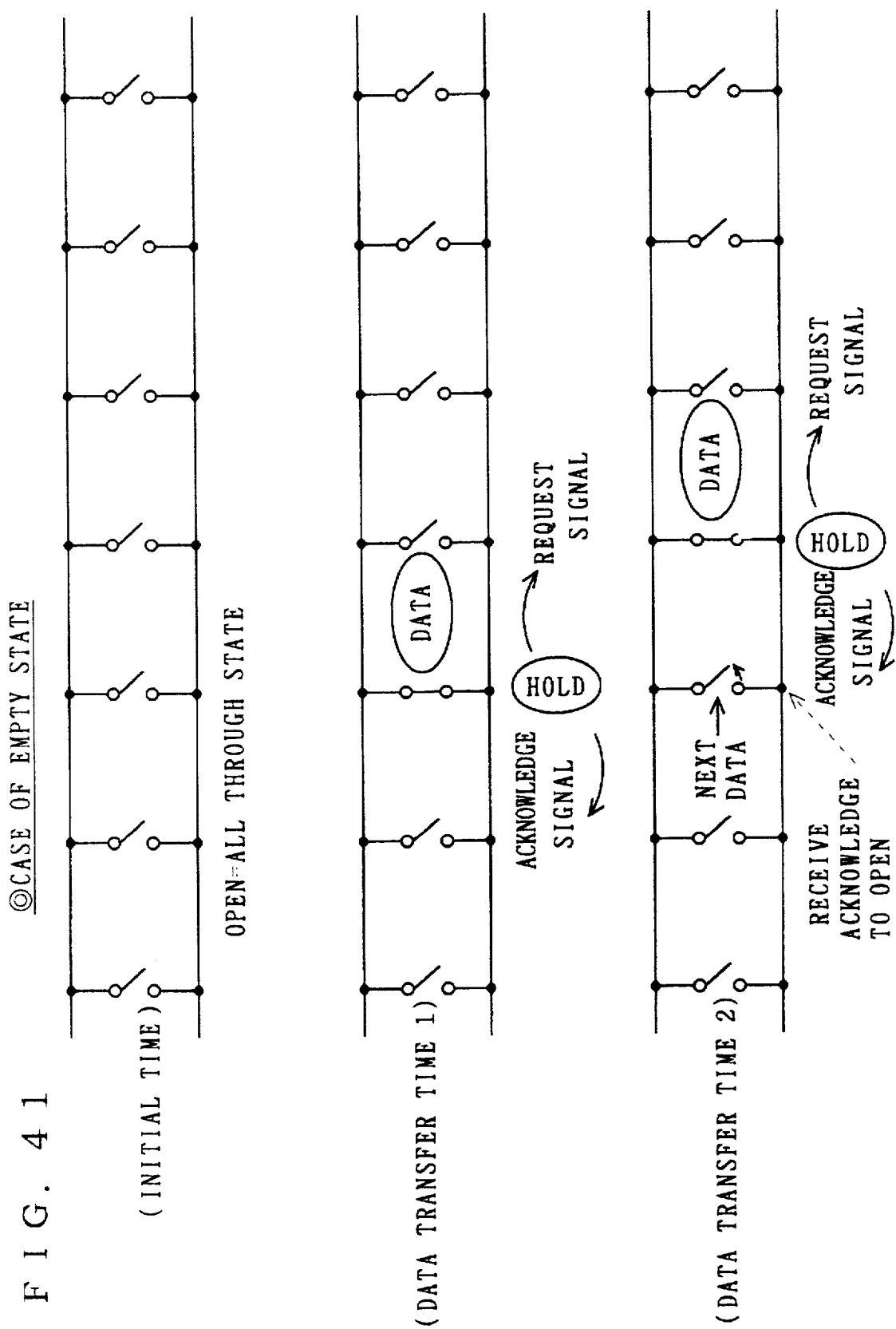
FIG. 41 is a conceptional diagram showing the case of empty state.
Figure 42:
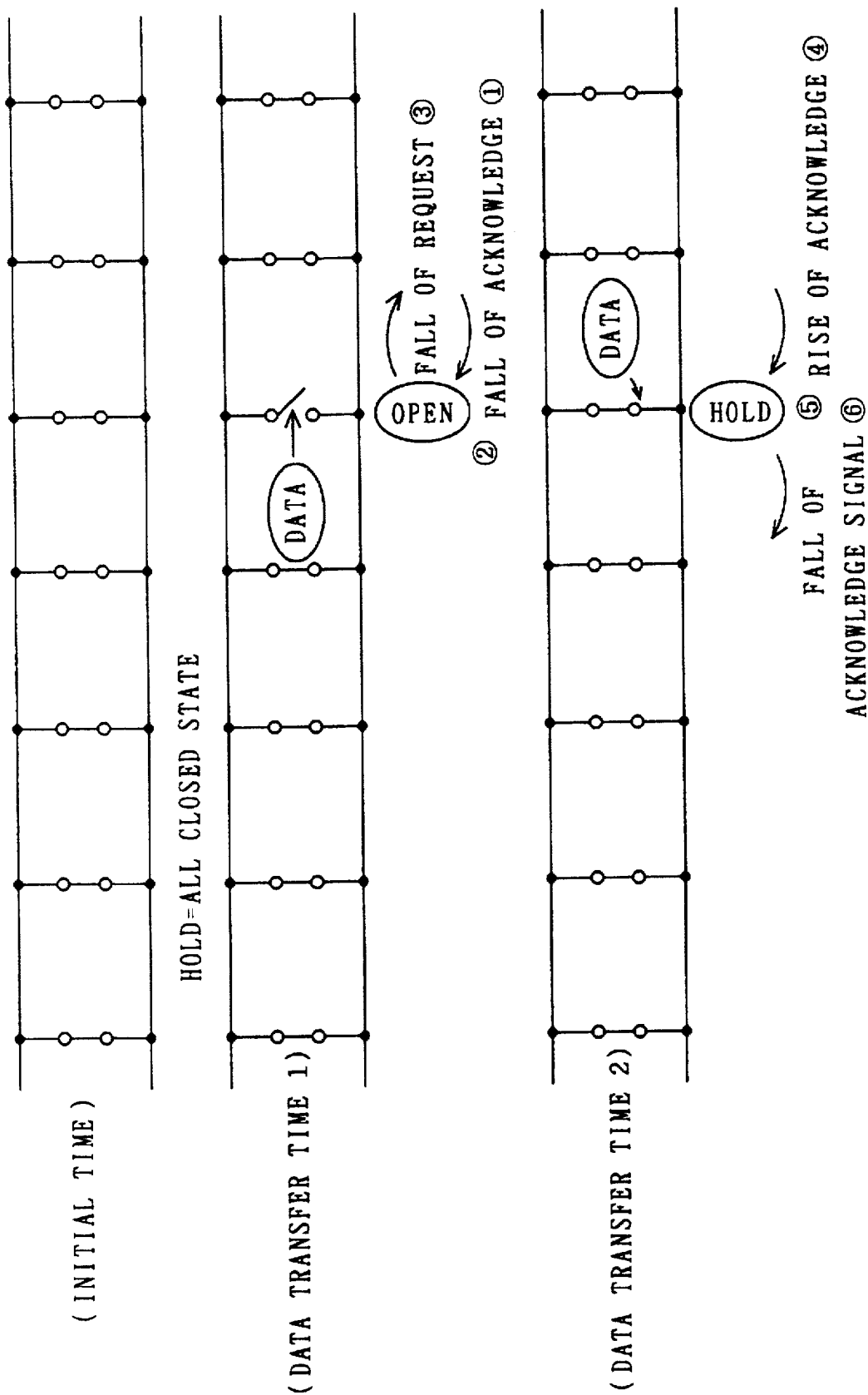
FIG. 42 is a conceptional diagram showing the case of occupation state.
Figure 43:
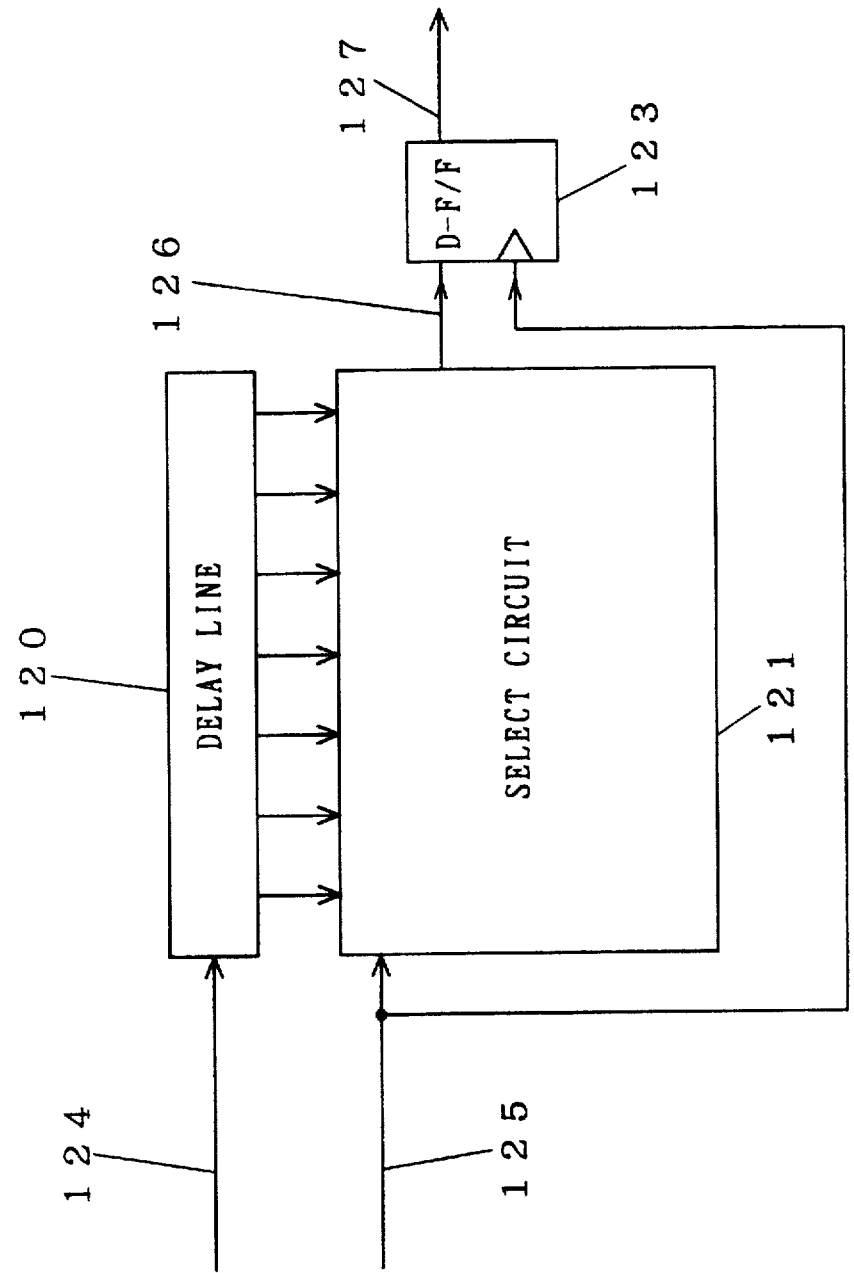
FIG. 43 is a diagram showing a conventional example of a bit synchronization circuit using a delay line.

In order to facilitate the understanding of the two concepts of the "empty state" and the "occupation state", schematic conceptional diagrams thereof are shown in FIG. 41 and FIG. 42, respectively.

Figure 14:
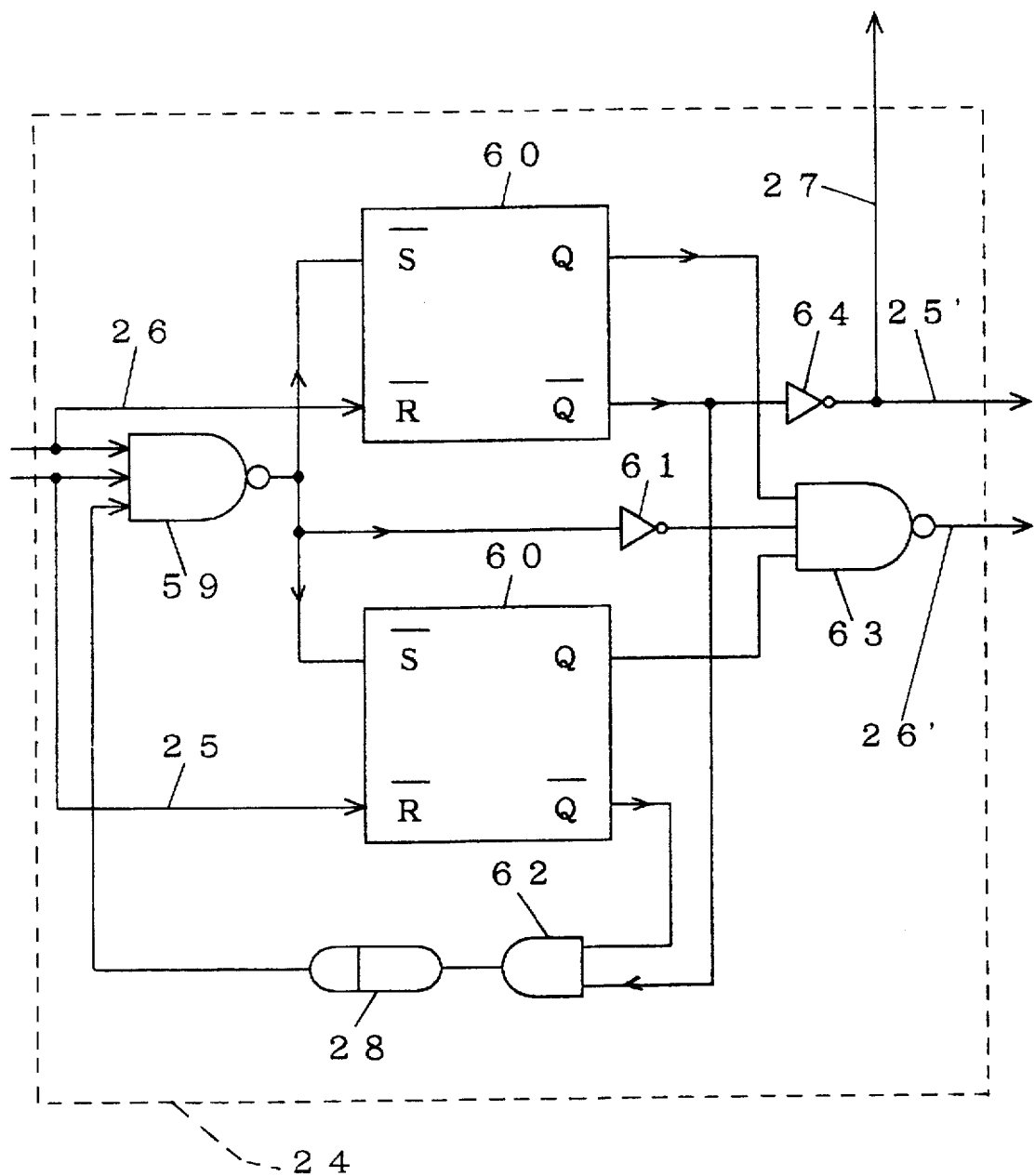
FIG. 14 is a diagram showing an example of circuit of the self-timed C element.

As described above, the self-timed C element 24 here generally means circuits which send/receive the request signal 25 and the acknowledge signal 26 between a self-timed C element on the next state or on the preceding stage to realize data transfer. An example of circuit configuration of such a self-timed C element 24 is shown in FIG. 14. As shown in the figure, the self-timed C element 24 includes two R-S-F/Fs 60, two NAND circuits 59 and 63, two inverters 61 and 64, an AND circuit 62 and a delay element 28 which is composed of a plurality of inverters connected in series.

As shown in FIG. 10, in this preferred embodiment, inversion of the select clock 5 is inputted as a request input signal for the first stage of the row of the self-timed C elements and the internal clock 2 is inputted as an acknowledge input signal for the final stage, which enables to absorb the phase difference between both clocks 5 and 2 and to turn the external data signal to operation with the phase of the internal clock 2. Accordingly, the internal data signal 8 held in the D-latch 17 on the final stage is outputted in synchronization with the internal clock 2.

Now, as can be seen in the conventional example, in the synchronization circuit utilizing S/P·P/S circuits, registers are required on both of the S/P side and the P/S side, and registers corresponding to the number of expand bits are further required for the counter portion. On the contrary, by taking the structure using a row of self-timed C elements as shown in FIG. 10, registers and the like are not needed so that the number of circuits can be saved to suppress the consumption power.

(Second Preferred Embodiment)

Next, a synchronization circuit as the second preferred embodiment of the present invention will be described.

Figure 15:
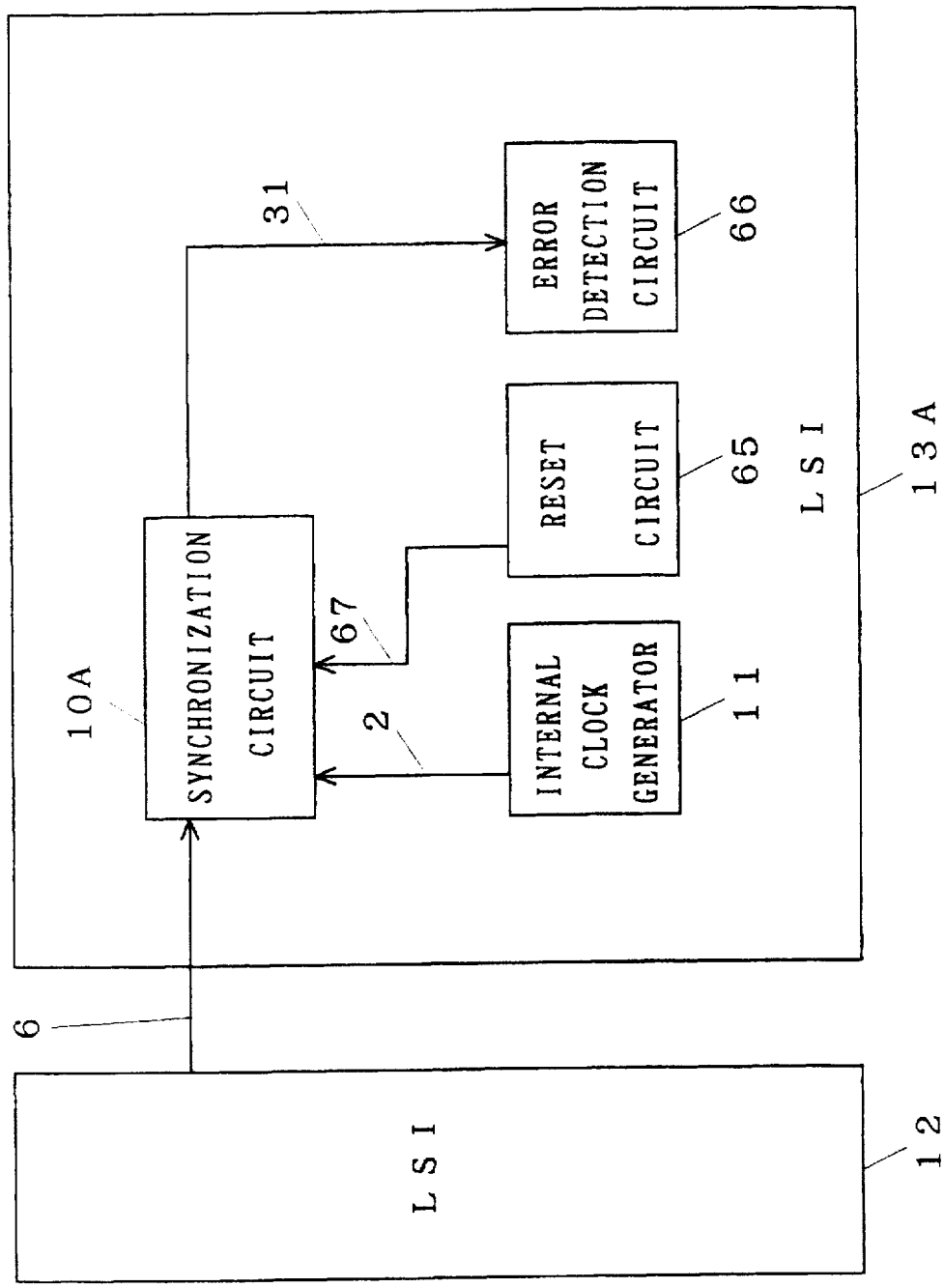
FIG. 15 is a block diagram showing an LSI incorporating a synchronization circuit according to the second preferred embodiment.

FIG. 15 is a block diagram showing an LSI 13A incorporating a synchronization circuit 10A as the second preferred embodiment and an LSI 12 transmitting the external data signal 6 to the LSI 13A. As shown in the figure, the LSI 13A newly includes a reset circuit 65 and an error detection circuit 66 in addition to the synchronization circuit 10A and the internal clock generator 11, where the reset circuit 65 outputs external reset 67 to the synchronization circuit 10A.

Figure 16:
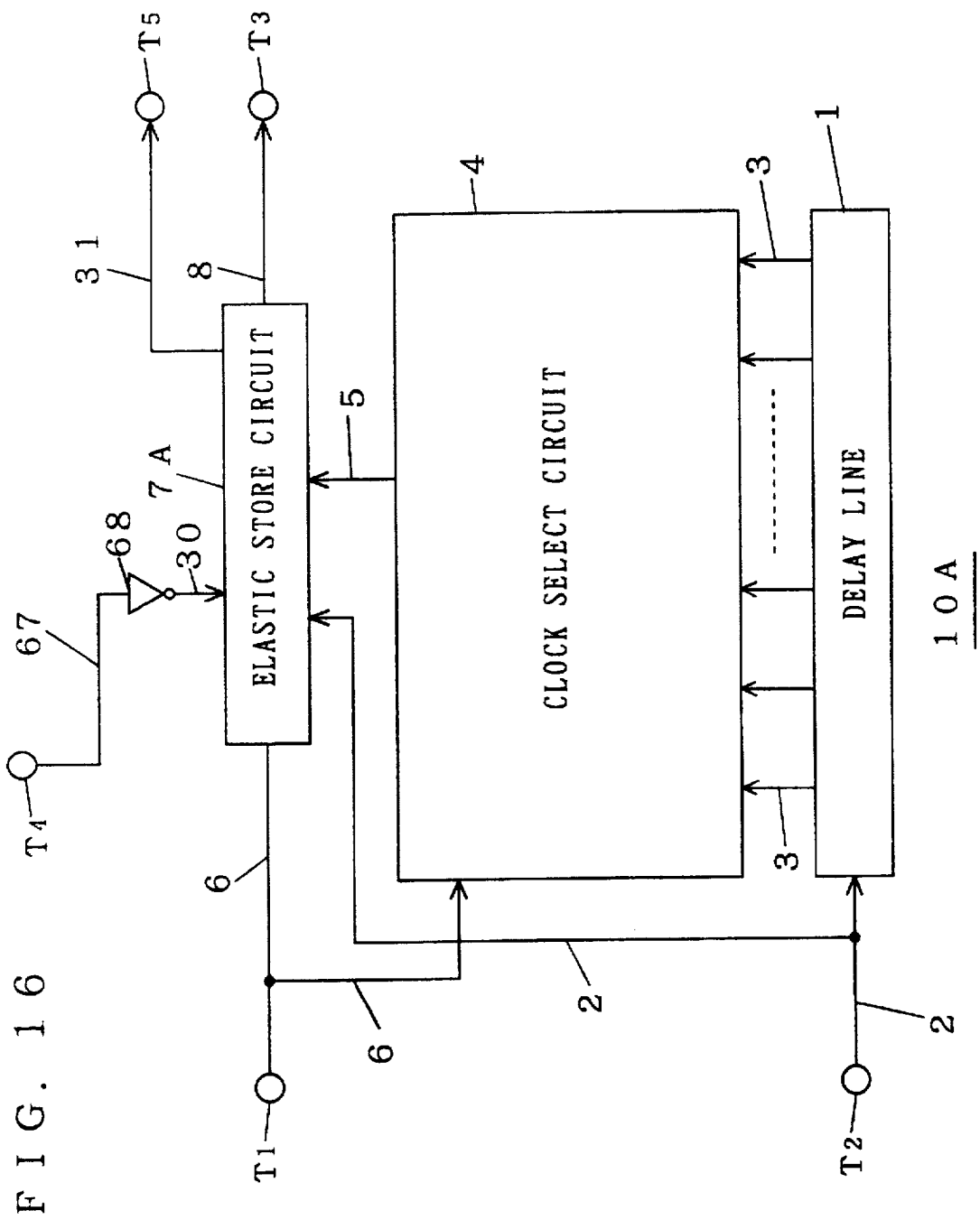
FIG. 16 is a block diagram showing the structure of the synchronization circuit according to the second preferred embodiment.

FIG. 16 is a block diagram showing the structure of the synchronization circuit 10A. The first through third terminals $T_1$-$T_3$, the delay line 1 and the clock select circuit 4 are the same as corresponding ones in the synchronization circuit 10, respectively. A fourth terminal $T_4$ is an input terminal for inputting the external reset 67 to the synchronization circuit 10A. The external reset 67 is inverted by an inverter 68 and then inputted to the elastic store circuit 7A. An fifth terminal $T_5$ is an output terminal for outputting internal reset 31 from the synchronization circuit 10A. The characteristic feature of the second preferred embodiment is in the structure of the elastic store circuit 7A. This circuit 7A is formed on the basis of the structure of the above-described elastic store circuit 7 with an improvement added thereto.

Figure 17:
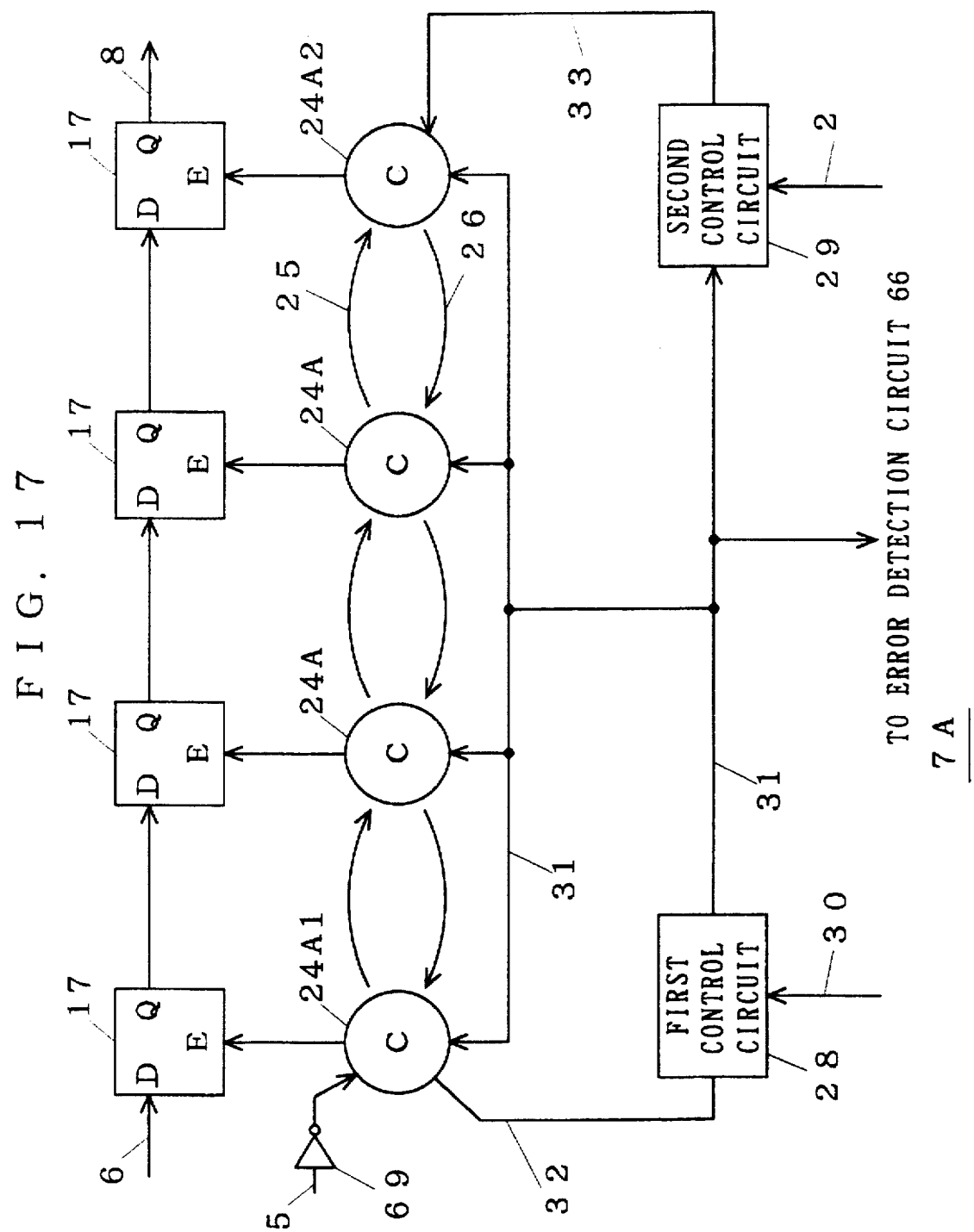
FIG. 17 is a block diagram showing the structure of an elastic store circuit according to the second preferred embodiment.

FIG. 17 is a block diagram showing the structure of the elastic store circuit 7A. In this preferred embodiment, the structure of FIG. 17 is adopted from the following point of view. First, external data signal may be missed when captured after reset, it is therefore necessary to keep a self-timed C element 24A2 on the final stage in the "occupation state" (the state where the capturing of the next external data signal is waited for until the acknowledge input signal rises to the "H" level) to prevent this. For this purpose, as shown in FIG. 17, the internal clock 2 is not directly inputted to the self-timed C element 24A2 on the final stage as an acknowledge input signal, but a second control circuit 29 is added and a new clock 33 generated from the internal clock 2 by the circuit 29 is inputted as an acknowledge input signal to the aforementioned C element 24A2.

Figure 18:
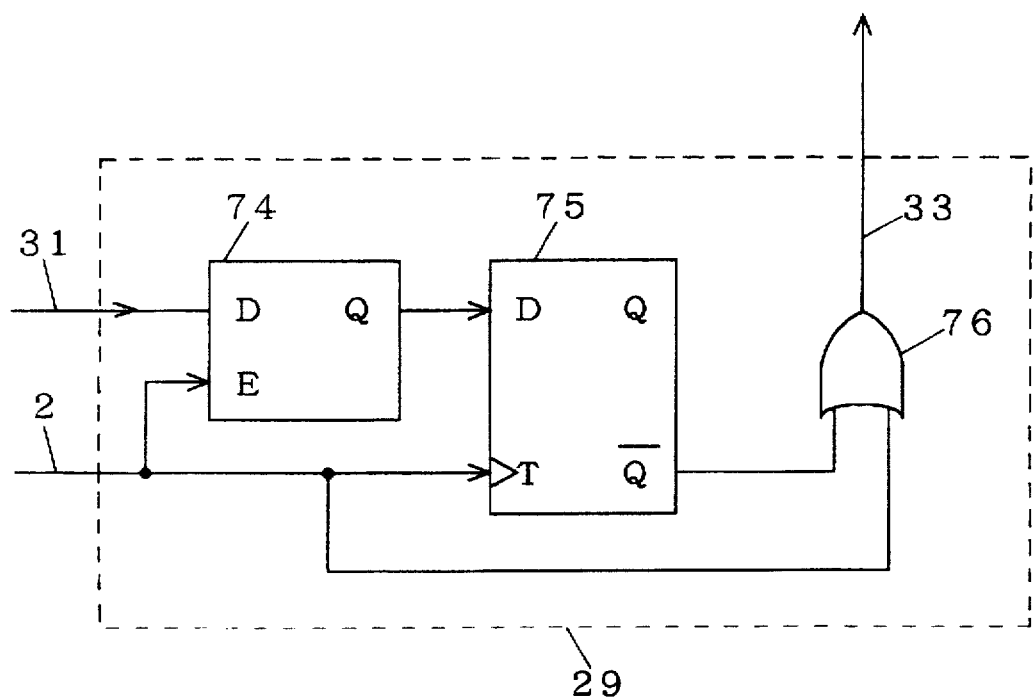
FIG. 18 is a diagram showing an example of structure of a second control circuit.

FIG. 18 shows a circuit example of the second control circuit 29. As shown in the figure, the second control circuit 29 includes a D-latch 74, a D-F/F 75 and an OR circuit 76. The internal reset 31 inputted to the D terminal of the D-latch 74 here corresponds to the inversion of the external reset 30.

Figure 19:
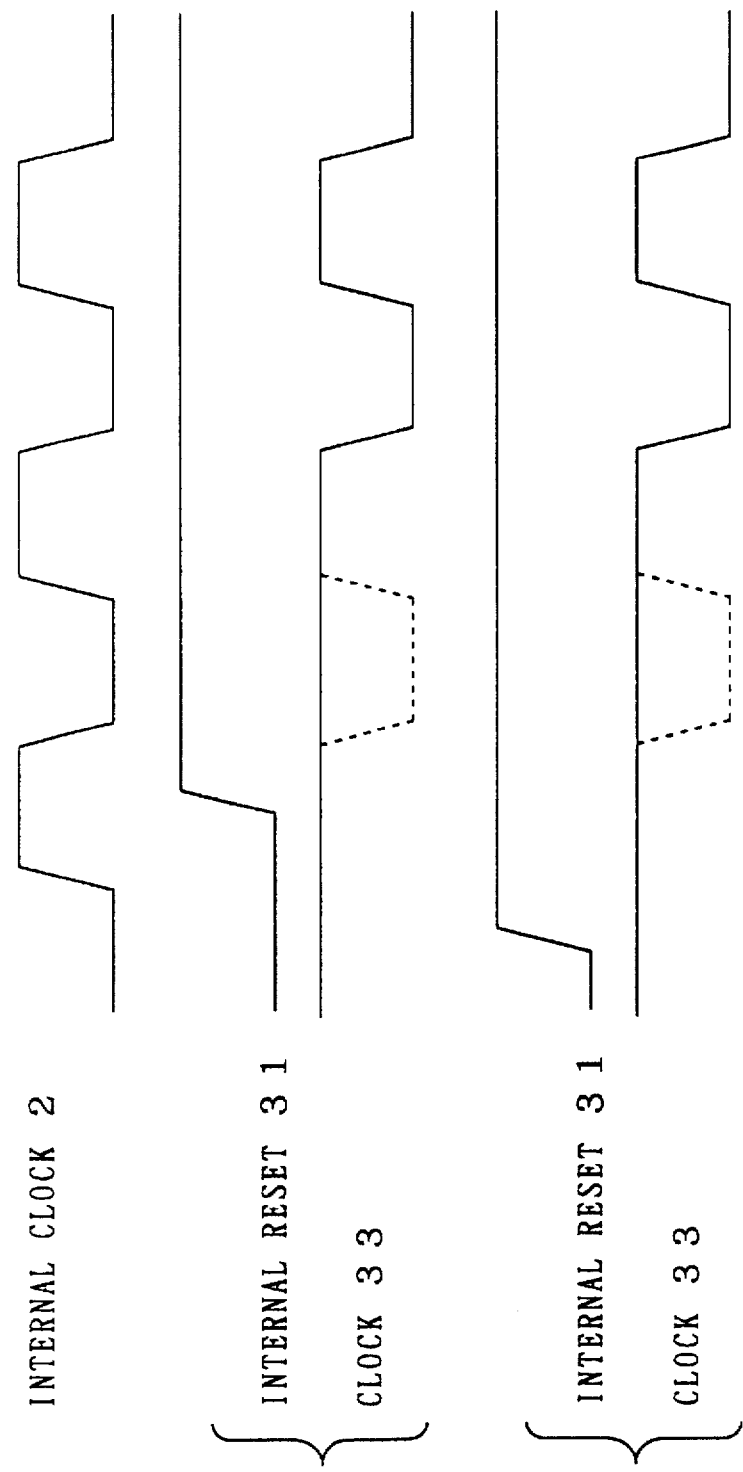
FIG. 19 is a timing chart for illustrating the operation of the second control circuit.

FIG. 19 shows the operation chart of the second control circuit 29 just after the inversion of the external reset, 30, i.e., the internal reset 31 is inputted. When the internal reset 31 rises from the "L" level to the "H" level, the Q output of the D-latch 74 remains at the "L" level, and clock 33 which is output of the OR circuit 76 is at the "H" level accordingly. The state where the clock 33 is at the "H" level continues until the internal clock 2 rises after that and then falls to the "L" level again. That is to say, the clock 33 which is an acknowledge input signal of the self-timed C element 24A2 on the final state is outputted being delayed from the internal clock 2 by its one period. Accordingly, stopping input of the acknowledge input signal 33 for one period can put the self-timed C element 24A2 on the final stage in the occupation state. Depending on the phase difference, a C element 24A on the stage preceding to the self-timed C element 24A2 may also goes in the occupation state.

Also, all of the row of the self-timed C elements may possibly go in the occupation state due to some reason such as noise in circuit or jitter of the external data signal 6, for example. In such a case, information thereof must be informed to another circuit (the error detection circuit 66 corresponds to that circuit, herein) to abandon the present data.

In this case, it may not be impossible to consider preventing occurrence of such a state by simply increasing the number of the self-timed C element row. However, this only haphazardly increases the self-timed C elements and is contrary to the object of down sizing the synchronization circuit.

Accordingly, in the second preferred embodiment, the structure is taken in which a first control circuit 28 is provided to detect an occupation signal 32 of the self-timed C element 24A1 on the first stage and to generate the internal reset 31 in the first control circuit 28, with which internal reset 31 all of each self-timed C element 24A and the second control circuit 29 are reset again. By this re-reset, data in each D-F/F 17 is eliminated. When the occupation signal 32 dose not show the occupation state, the first control circuit 28 outputs the inversion 30 of external reset as the internal reset 31 as it is.

Figure 20:
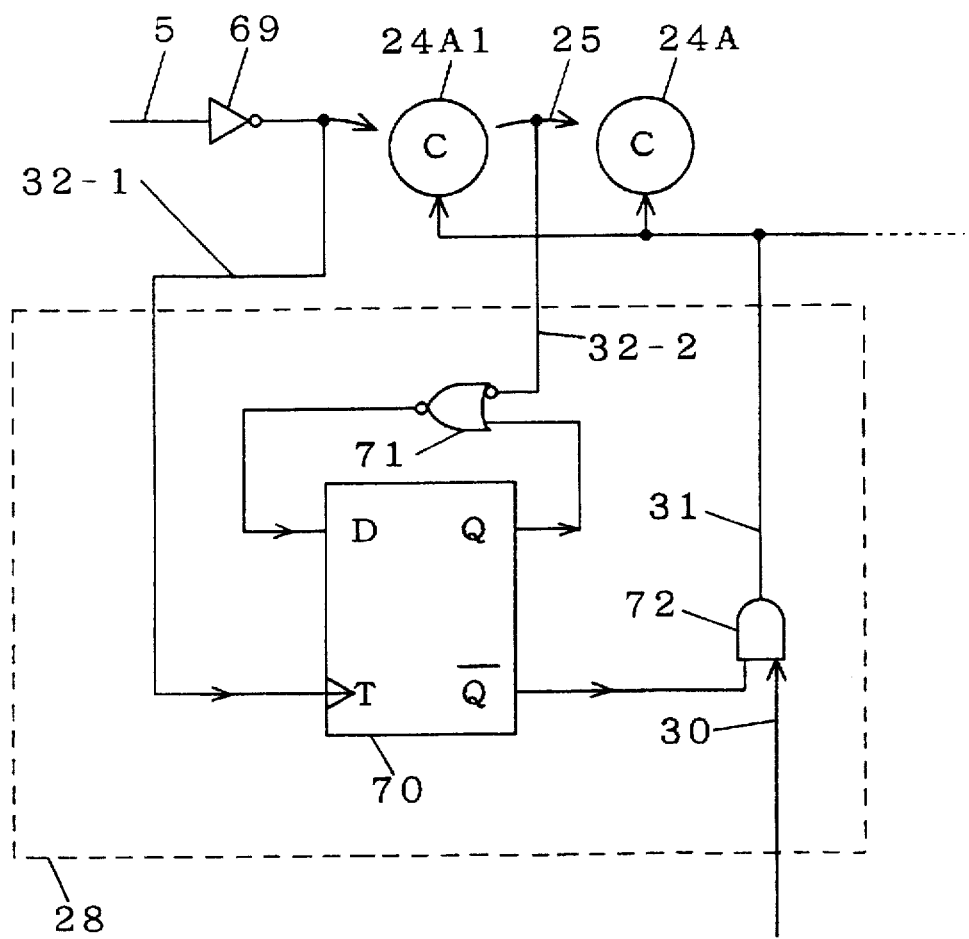
FIG. 20 is a diagram showing an example of structure of a first control circuit.

Now, an example of circuit structure of the first control circuit 28 is shown in FIG. 20. As shown in the figure, the first control circuit 28 has a gate circuit 71, a D-F/F 70 and an AND circuit 72. The occupation signal 32 depicted in FIG. 17 is a general term representing the first and second occupation signals 32-1 and 32-2 shown in FIG. 20. The first occupation signal 32-1 corresponds to an inversion signal of the select clock 5 (which is a request input signal of the self-timed C element 24A1 on the first stage), and the second occupation signal 32-2 corresponds to the request output signal 25 of the self-timed C element 24A1 on the first stage.

Figure 21:
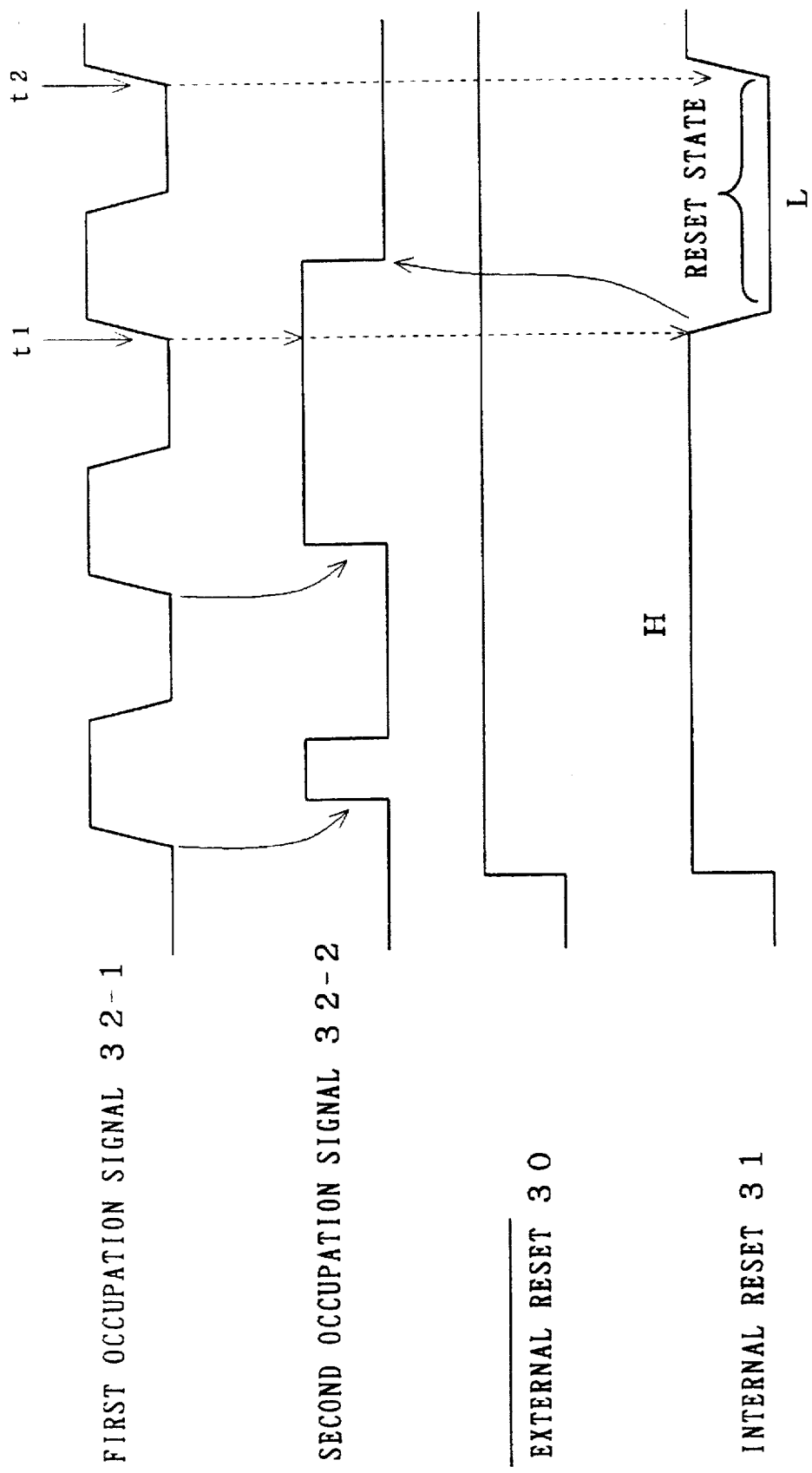
FIG. 21 is a timing chart for illustrating the operation of the first control circuit.

The operation chart of the first control circuit 28 is shown in FIG. 21. As shown in the figure, as the $\bar{Q}$ output of the D-F/F 70 is at the "H" level in the initial time, the inversion 30 of the external reset becomes the internal reset 31 as it is to reset each portion 24A and 29. Subsequently, however, if all the self-timed C elements 24 go in the occupation state, even if the request input signal (32-1) is inputted to the self-timed C element 24A1 on the first stage, the C element 24A1 maintains the level of the request output signal 25 (32-2) at the "H" level (the time $t_1$ in FIG. 21) until the acknowledge input signal falls. Accordingly, the internal reset 31 falls to the "L" level to go in the reset state. This re-resets each portion 24A, 29. After that, as the request output signal 25 (32-2) falls to the "L" level, at the time $t_2$ in FIG. 21, the internal reset 31 rises to the "H" level in accordance with the inversion of external reset 30 being at the "H" level.

Figure 22:
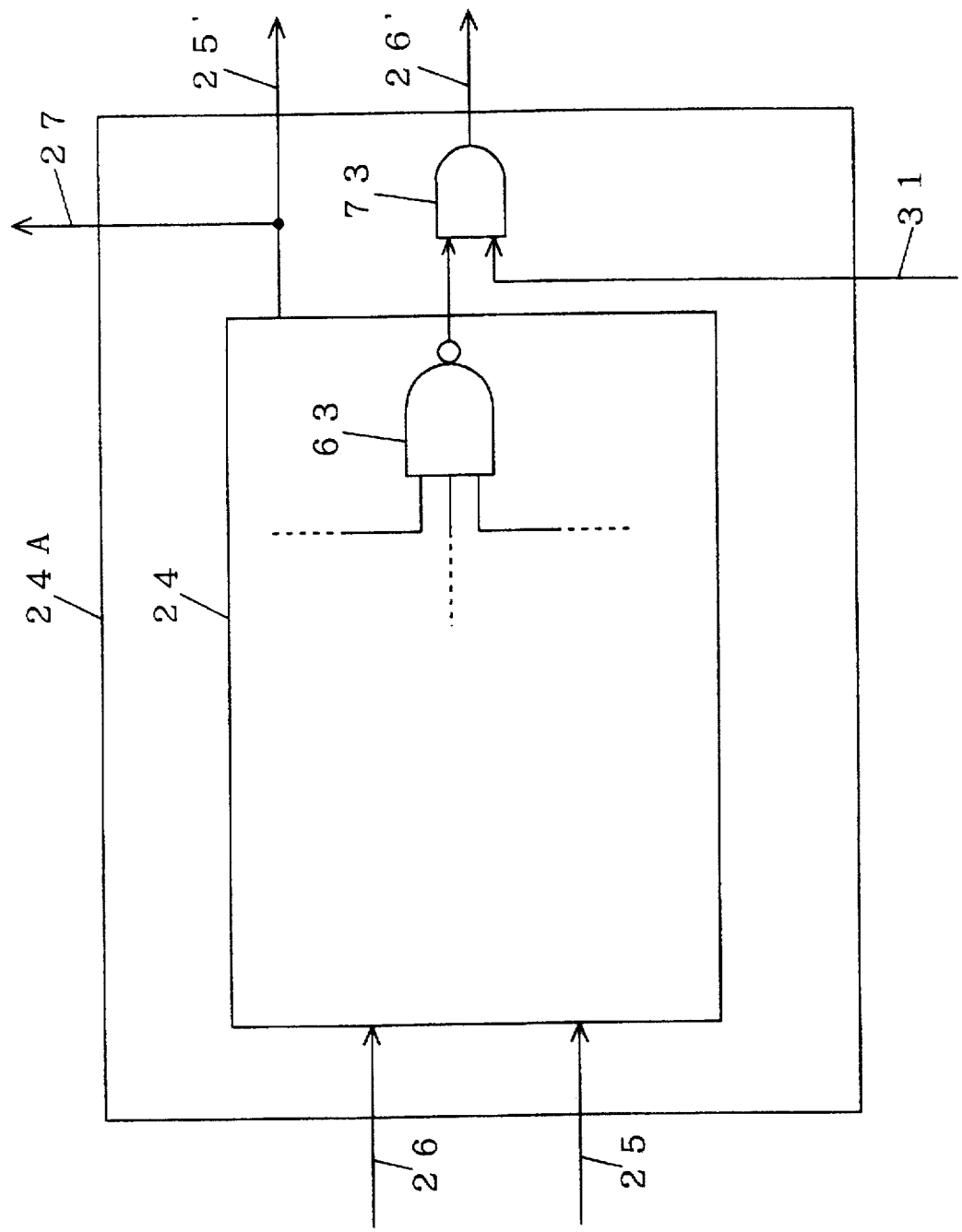
FIG. 22 is a diagram showing the circuit structure of a self-timed C element according to the second preferred embodiment.

In this second preferred embodiment, each self-timed C element 24A is constituted by providing a reset add circuit to the self-timed C element 24 in the first preferred embodiment to be able to accommodate reset by the internal reset 31. The circuit structure is shown in FIG. 22. That is, the self-timed C element 24A produces the acknowledge output signal 26' by providing an AND circuit 73 inputting output of a NAND circuit 63 of the self-timed C element 24 and the internal reset 31. By this, the acknowledge output signal 26' also falls to the "L" level in response to a fall to the "L" level of the internal rest 31. Also, the error detection circuit 66 detects the change of the internal reset 31 from the "H" level to the "L" level to detect that wrong data has been captured.

By this, the number of the self-timed C elements can be saved (minimum is 3) while preventing all the self-timed C elements 24A from going in the occupation state, and furthermore occurrence of the capturing of wrong data due to noise of input data or the like can be detected.

Although this preferred embodiment uses both of the first and second control circuits 28 and 29, the first control circuit 28 only may be applied alternatively, or the second control circuit 29 only may be applied. In the latter case, the inversion 30 of the external reset is intactly inputted to the control circuit 29.

(Third Preferred Embodiment)

The first and second preferred embodiments are both related to a bit synchronization circuit in which the external data signal 6 is turned to the phase of the internal clock 2. The method used therein can be expanded to a cell synchronization circuit by comparing a cell phase pulse as a reference and a cell phase pulse from outside. From this point of view, a synchronization circuit is realized including both the bit synchronization control and cell synchronization control in the third preferred embodiment.

Figure 23:
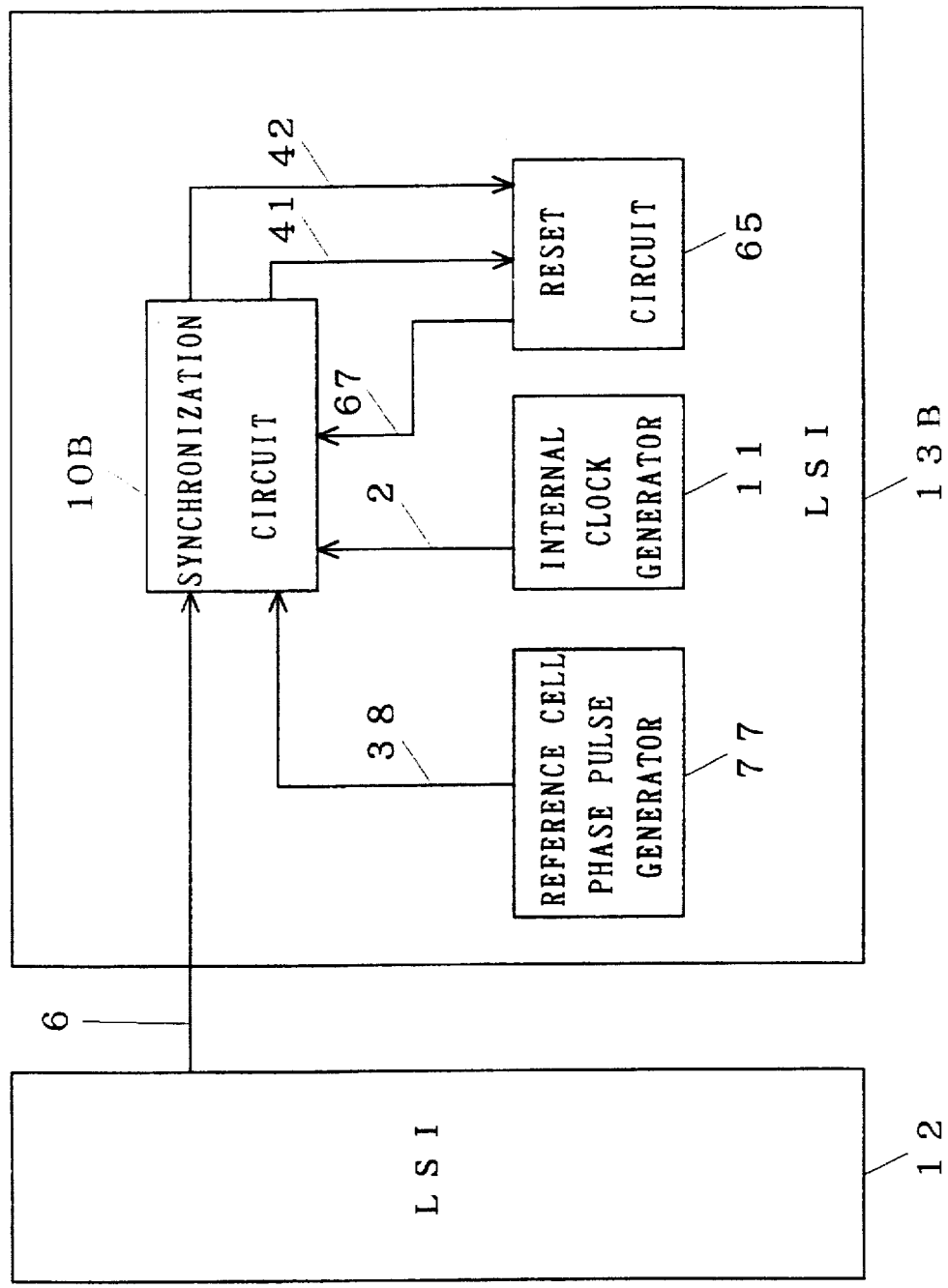
FIG. 23 is a block diagram showing data transmission between LSI chips in the third preferred embodiment.

FIG. 23 is a block diagram schematically showing an LSI 13B incorporating a synchronization circuit 10B according to the third preferred embodiment and an LSI 12 for transmitting the external data signal 6 to the LSI 13B. Though not shown in FIG. 23, the LSI 12 transmits to the synchronization circuit 10B together with the external data signal 6 an data signal for internal cell phase pulse running in parallel before subjected to the bit synchronization and cell synchronization processing, which corresponds to the internal cell phase pulse (37 in FIG. 26) which will be described later.

The LSI 13B has an internal clock generator 11, a reference cell phase pulse generator 77 and a reset circuit 65 in addition to the synchronization circuit 10B as its interface portion. The reference cell phase pulse generator 77 outputs a reference cell phase pulse 38 as one of external cell phase pulses. The reset circuit 65 inputs two cell phase error signals 41 and 42 outputted by the synchronization circuit 10B while outputting the external reset 67 to the synchronization circuit 10B.

Figure 24:
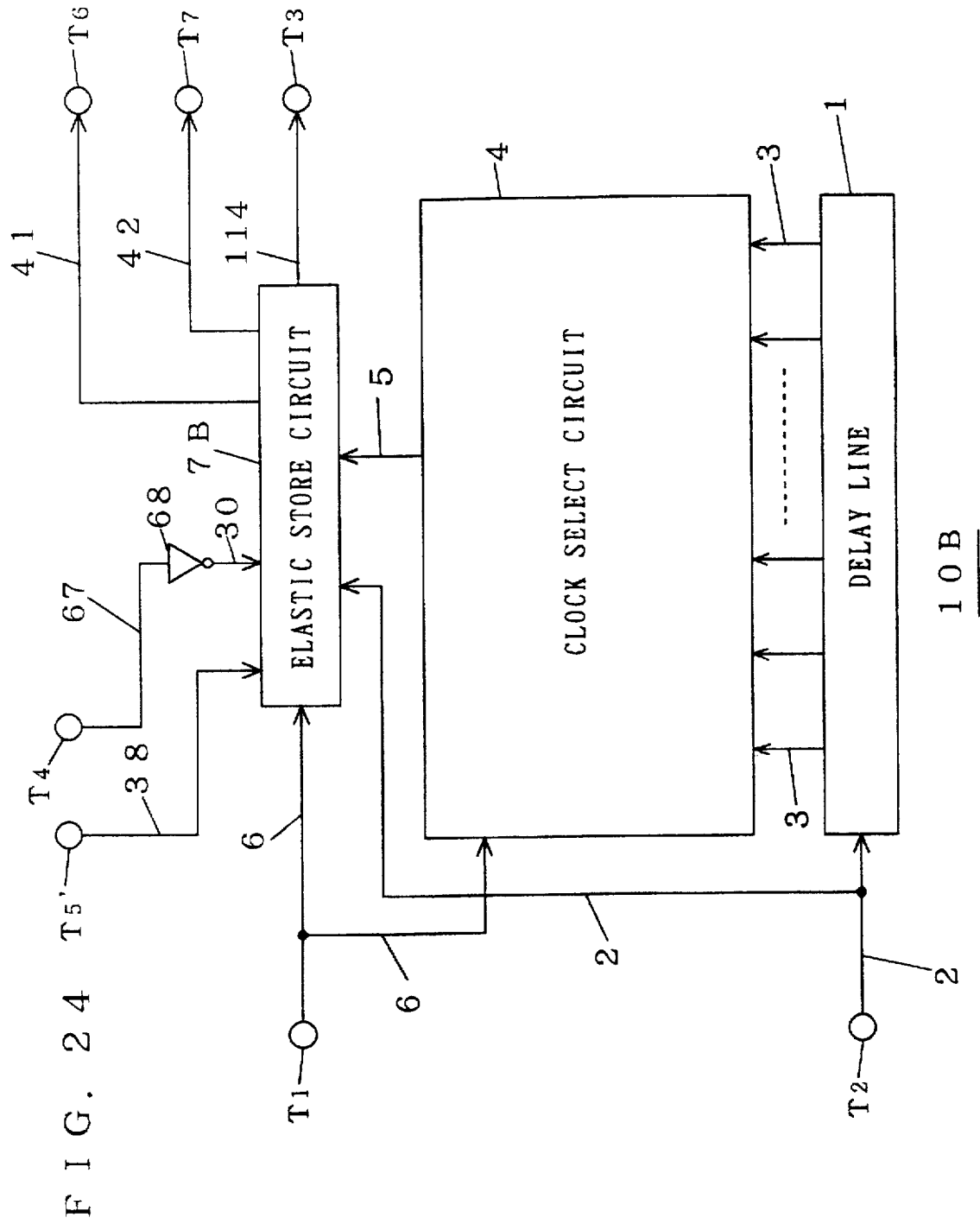
FIG. 24 is a block diagram showing the structure of a synchronization circuit according to the third preferred embodiment.

FIG. 24 is a block diagram showing the structure of the synchronization circuit 10B, where the first through fourth terminals $T_1$–$T_4$, the delay line 1, the clock select circuit 4 and the inverter 68 are the same as corresponding ones in the synchronization circuit 10A, respectively. A fifth terminal $T_5'$ is an input terminal for inputting the reference cell phase pulse 38 to the synchronization circuit 10B. Sixth and seventh terminals $T_6$ and $T_7$ are output terminals for outputting the first and second cell phase errors 41 and 42 from the synchronization circuit 10B, respectively. The reference numeral 6' is the data signal for internal cell phase pulse mentioned above which is one of the cell phase pulses from outside. The characteristic feature of this third preferred embodiment is also in the elastic store circuit 7B. This circuit 7B will be described below.

Figure 25:
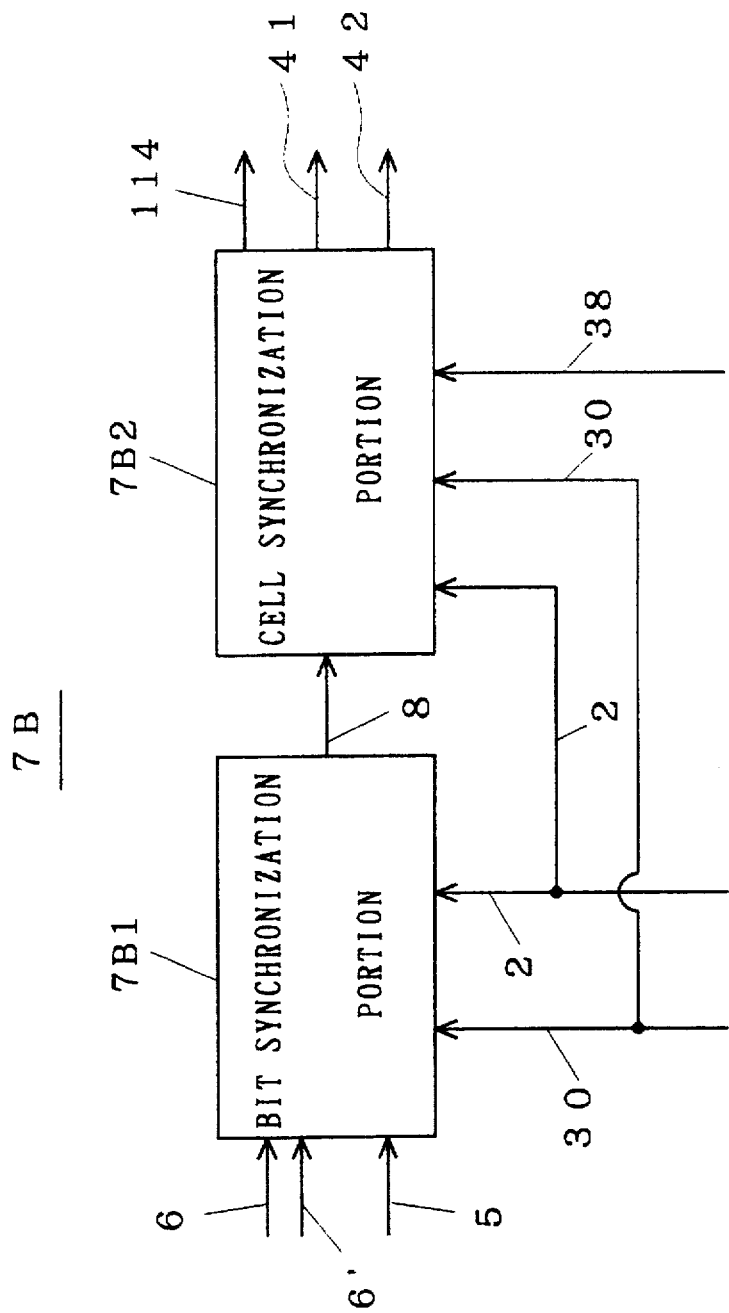
FIG. 25 is a block diagram showing the structure of an elastic store circuit according to the third preferred embodiment.

FIG. 25 is a block diagram showing that the elastic store circuit 7B is generally divided into two parts, i.e., the bit synchronization portion 7B1 and the cell synchronization portion 7B2. The bit synchronization portion 7B1 is the same as the elastic store circuit 7A in the second preferred embodiment described above. (It is a matter of course that the bit synchronization portion 7B1 can have the same structure as that of the elastic store circuit 7 in the first preferred embodiment.) However, the circuit 7B1 performs the bit synchronization process also to the data signal for the internal cell phase pulse. Accordingly, the internal signal 8 herein includes a signal before the cell synchronization which corresponds to the internal cell phase pulse 37 described later.

Figure 26:
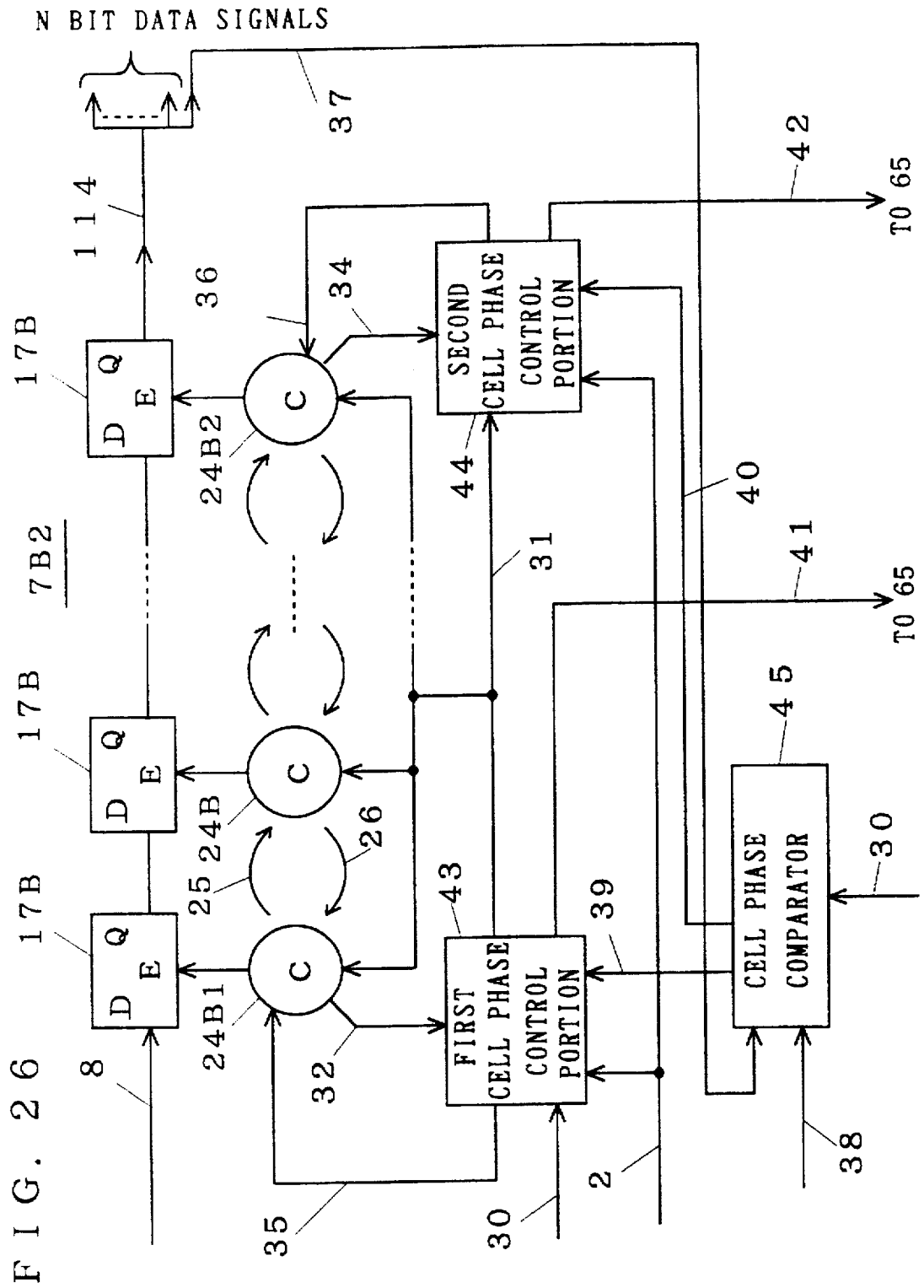
FIG. 26 is a block diagram showing the circuit structure of a cell phase synchronization portion of the elastic store circuit.

FIG. 26 is a block diagram depicting the structure of the cell synchronization portion 7B2. As seen in the figure, the cell synchronization portion 7B2 of the elastic store circuit 7B has a row of D-latches (17B) (a new latch row), a row of self-timed C elements (24B) (a new self-timed C element row), a first cell phase control portion 43 for controlling the self-timed C element 24B1 on the first stage, a second cell phase control portion 44 for controlling the self-timed C element 24B2 on the final stage, and a cell phase comparator 45 for comparing the internal cell phase pulse 37 and the reference cell phase pulse 38 to output first and second cell phase adjust signals 39 (F) and 40 (B).

Figure 27:
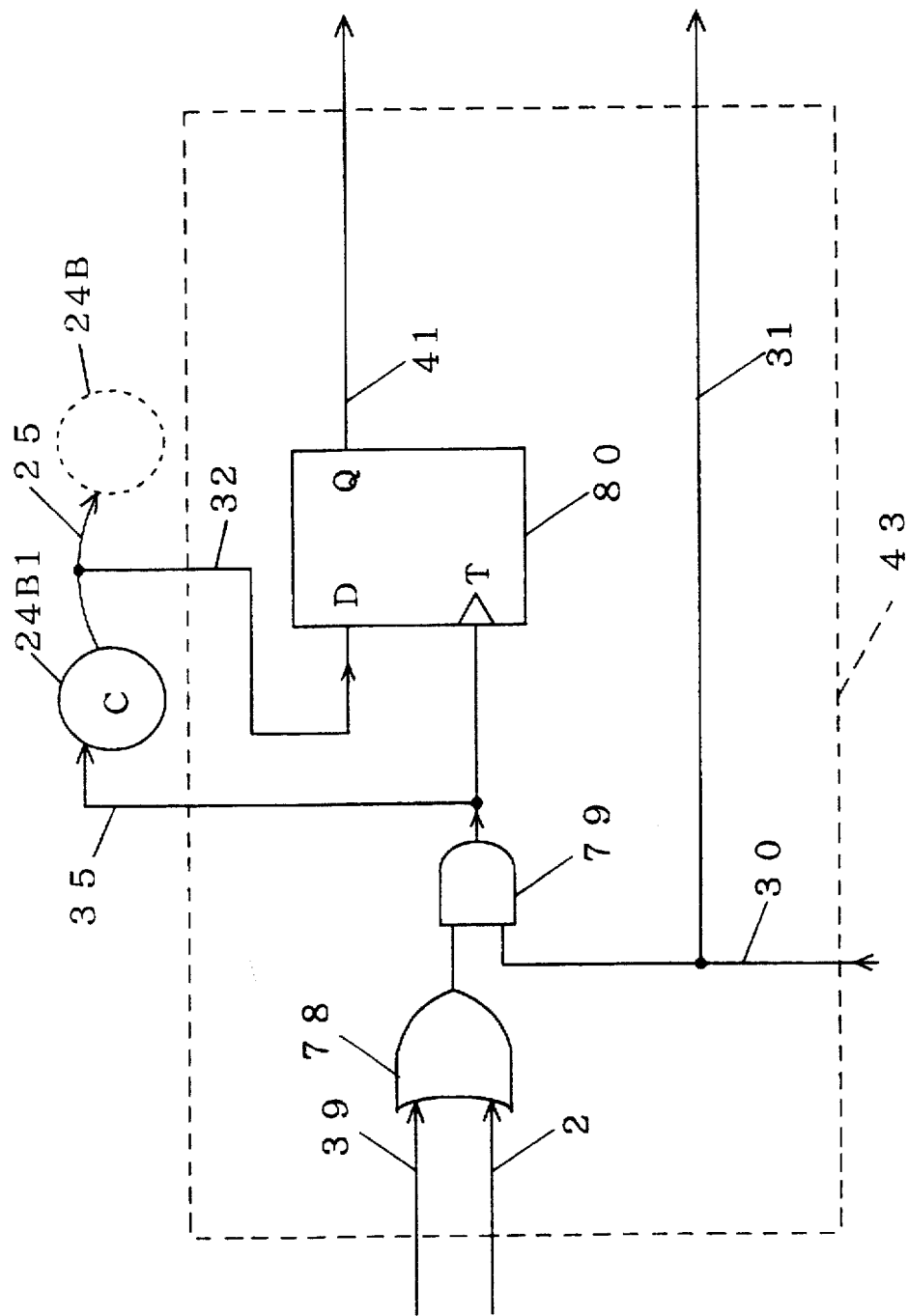
FIG. 27 is a diagram showing an example of circuit structure of a first cell phase control portion.

FIG. 27 is a block diagram showing an example of circuit structure of the first cell phase control portion 43. The control portion 43 has an OR circuit 78, an AND circuit 79 and a D-F/F 80. The inversion of the external reset, 30, here intactly becomes the internal reset 31.

Figure 28:
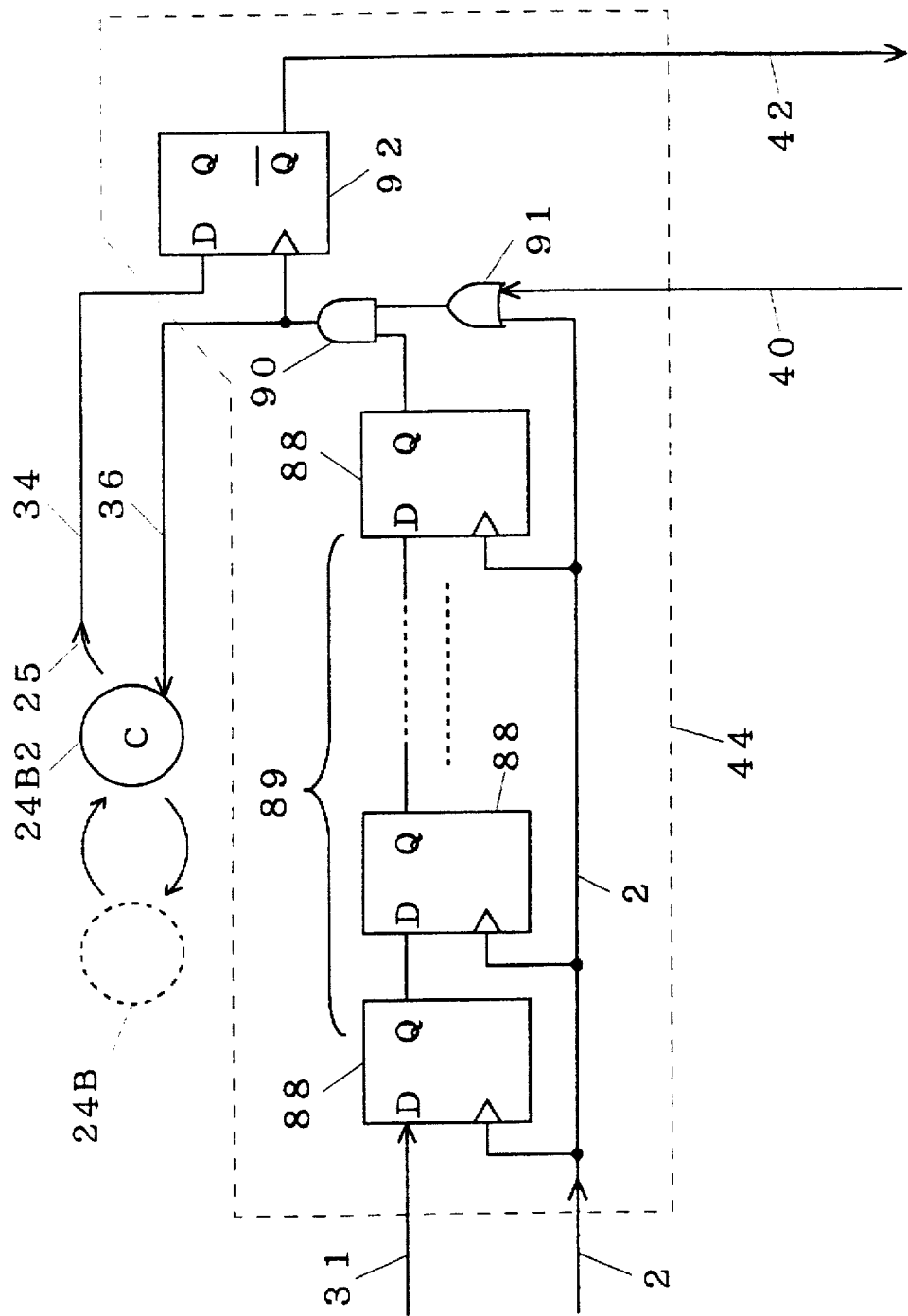
FIG. 28 is a diagram showing an example of circuit structure of a second cell phase control portion.

FIG. 28 is a block diagram showing an example of circuit structure of the second cell phase control portion 44. The control portion 44 has a group of D-F/Fs 88 connected in series, 89, an OR circuit 91, an AND circuit 90 and a D-F/F 92.

Figure 29:
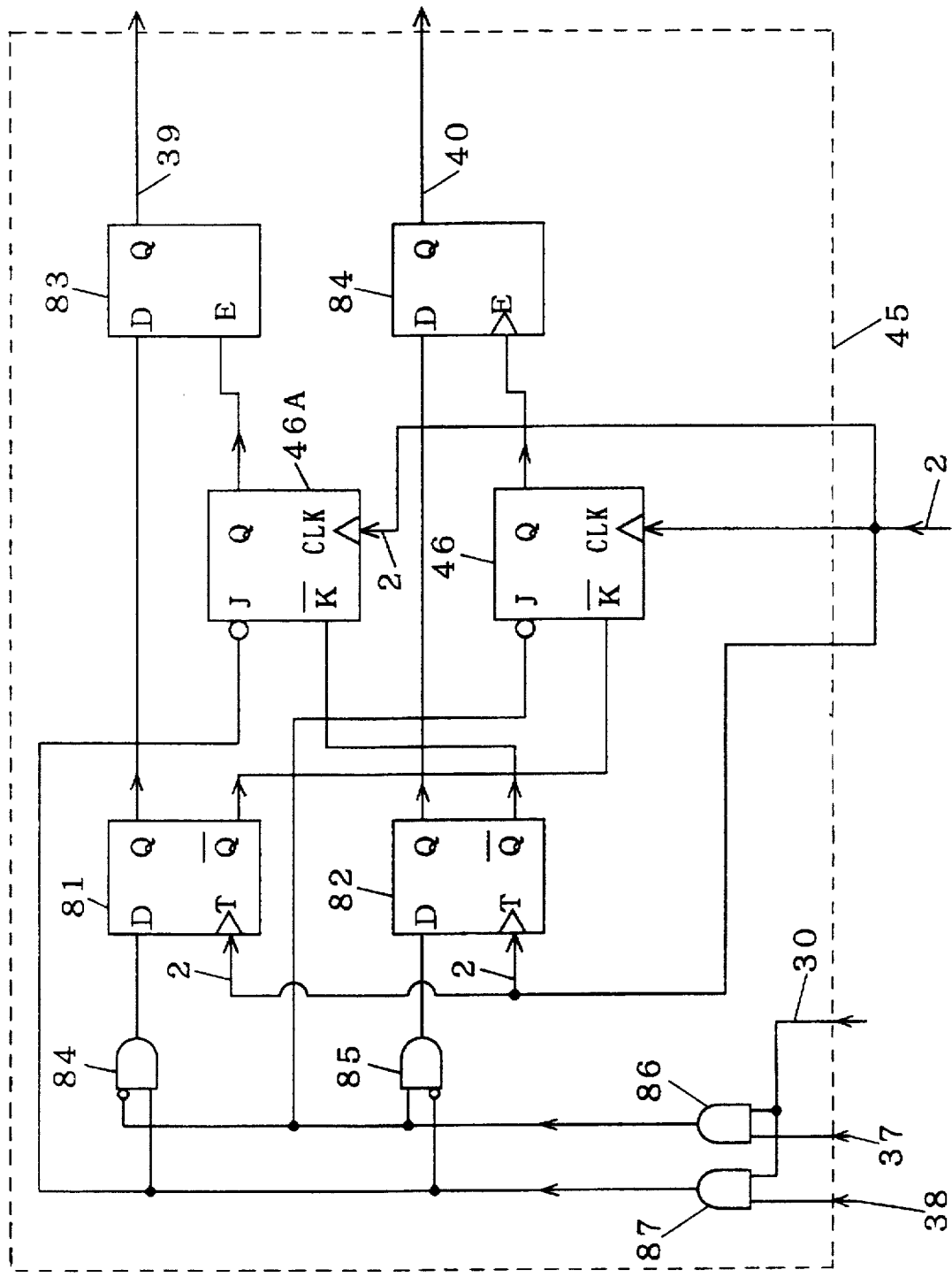
FIG. 29 is a diagram showing an example of circuit structure of a cell phase comparator.
Figure 30:
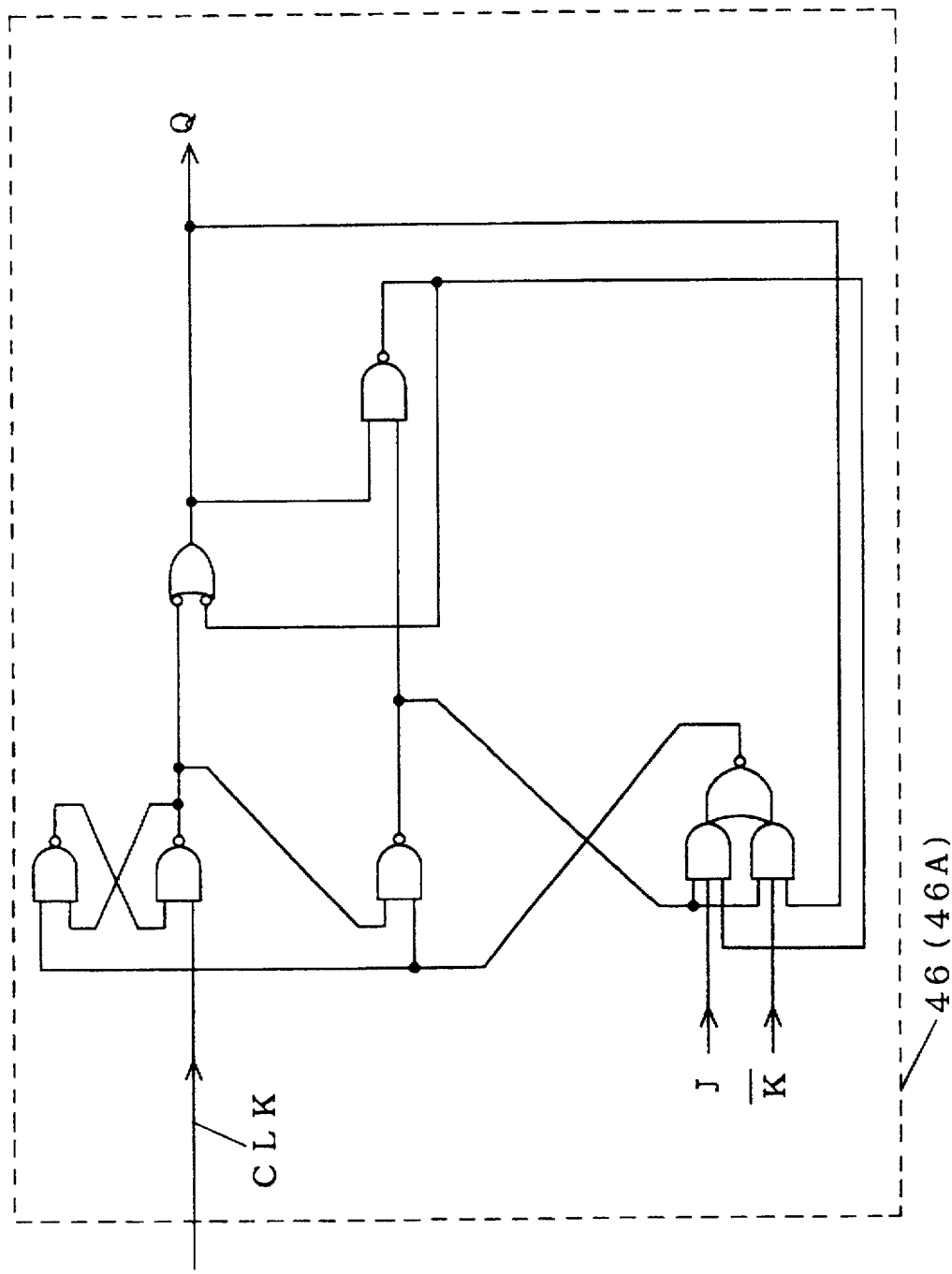
FIG. 30 is a diagram showing an example of circuit structure of an edge trigger type J-K flip flop.

FIG. 29 is a block diagram showing a specific example of structure of the cell phase comparator 45. The comparator 45 includes D-F/Fs 81, 82, AND circuits 86, 87, gate circuits 84, 85, edge trigger type J-K-F/Fs 46, 46A and D-latches 83, 84. For reference, an example of structure of the edge trigger type J-K-F/F 46 (46A) is depicted in FIG. 30.

The circuit structure inside the self-timed C element 24B (the new self-timed C element) is the same as that of the aforementioned self-timed C element 24A.

The operation thereof will be described. First, immediately after reset by the internal reset 31, the second cell phase control portion 44 puts the self-timed C elements 24B corresponding to the number of the sift registers in the D-F/F row group 89 in the occupation state. This point is based on the same principle as the second preferred embodiment using the second control circuit 29. This is, however, preferably half of the total number of the self-timed C elements 24B (a half of (adjustable bit shift−1)).

When the internal cell phase pulse 37 transferred by the row of self-timed C elements (24B) coincides in the bit unit with the reference cell phase pulse 38 serving as reference, the cell phase comparator 45 dose not output first and second cell phase adjust signals 39 and 40 (both the signals 39 and 40 are outputs at the 0 level), and the cell synchronization is regarded as having been established in advance. Now, both the cell phase pulses 37 and 38 are allowed to have width by the adjustable bit width. For example, in the timing chart showing the example of operation of the cell phase comparator 45 shown in FIG. 31, the adjustable bit width is represented as 3 bits.

However, when the phase of the internal cell phase pulse 37 and that of the reference cell phase pulse 38 do not agree, the cell phase is made to agree by the method described below.

Figure 31:
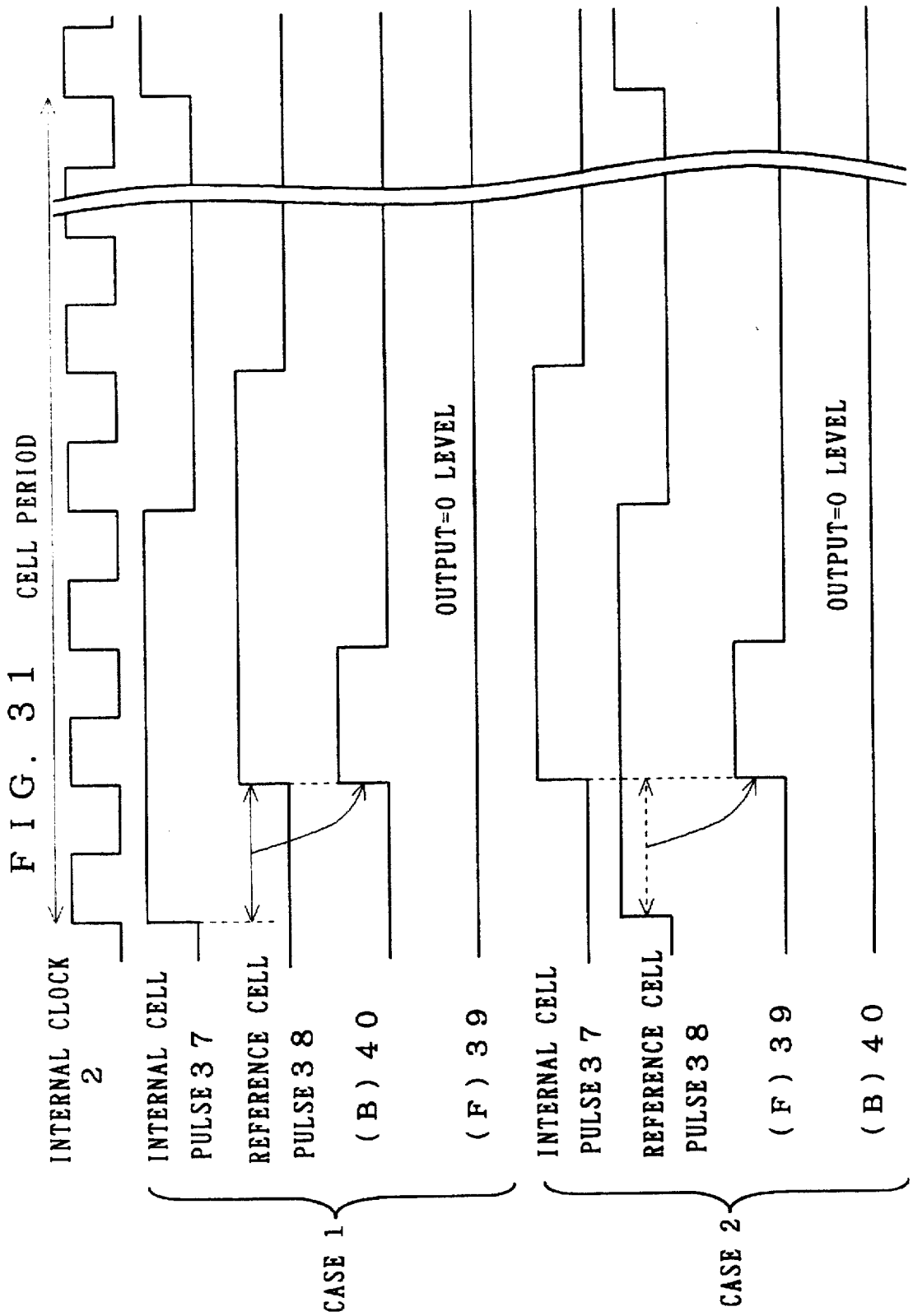
FIG. 31 is a timing chart for illustrating the operation of the cell phase comparator.

First, as shown as the case 1 in FIG. 31, when the internal cell phase pulse 37 is leading the reference cell phase pulse 38, the cell phase comparator 45 brings the second cell phase adjust signal (B) 40 to the "H" level for the time period corresponding to the number of bits of the lead. On the contrary, when the internal cell phase pulse 37 is lagging behind the reference phase pulse 38, as shown in the case 2 of FIG. 31, the cell phase comparator 45 outputs the first cell phase adjust signal (F) 39 as the "H" level for the time corresponding to the number of bits of the lag. The first and second cell phase control portions 43 and 44 respectively receive the first and second cell phase adjust signals 39 and 40 to control the self-timed C elements 24B1 and 24B2 with the write clock 35 and the read clock 36, respectively. In the example of FIG. 31, output waveforms of respective signals are shown with a phase shift corresponding to one bit for convenience of description.

In the first cell phase control portion 43, the write clock 35 is fixed to the "H" level when the first cell phase adjust signal (F) 39 is at the "H" level. The write clock 35 corresponds to a request input signal of the self-timed C element 24B1 on the first stage. Thus, as stated above, the self-timed C elements 24B in the occupation state receive the acknowledge input signal to open corresponding ones of the D-latches 17B. Accordingly, the number of the data in the hold state by the self-timed C elements (24B) row in the occupation state decreases by the number of bits of the write clock 35 being at the "H" level to perform operation of accelerating the data transfer. The internal cell phase pulse 37 thus achieves the same phase as the reference cell phase pulse 38.

Figure 32:
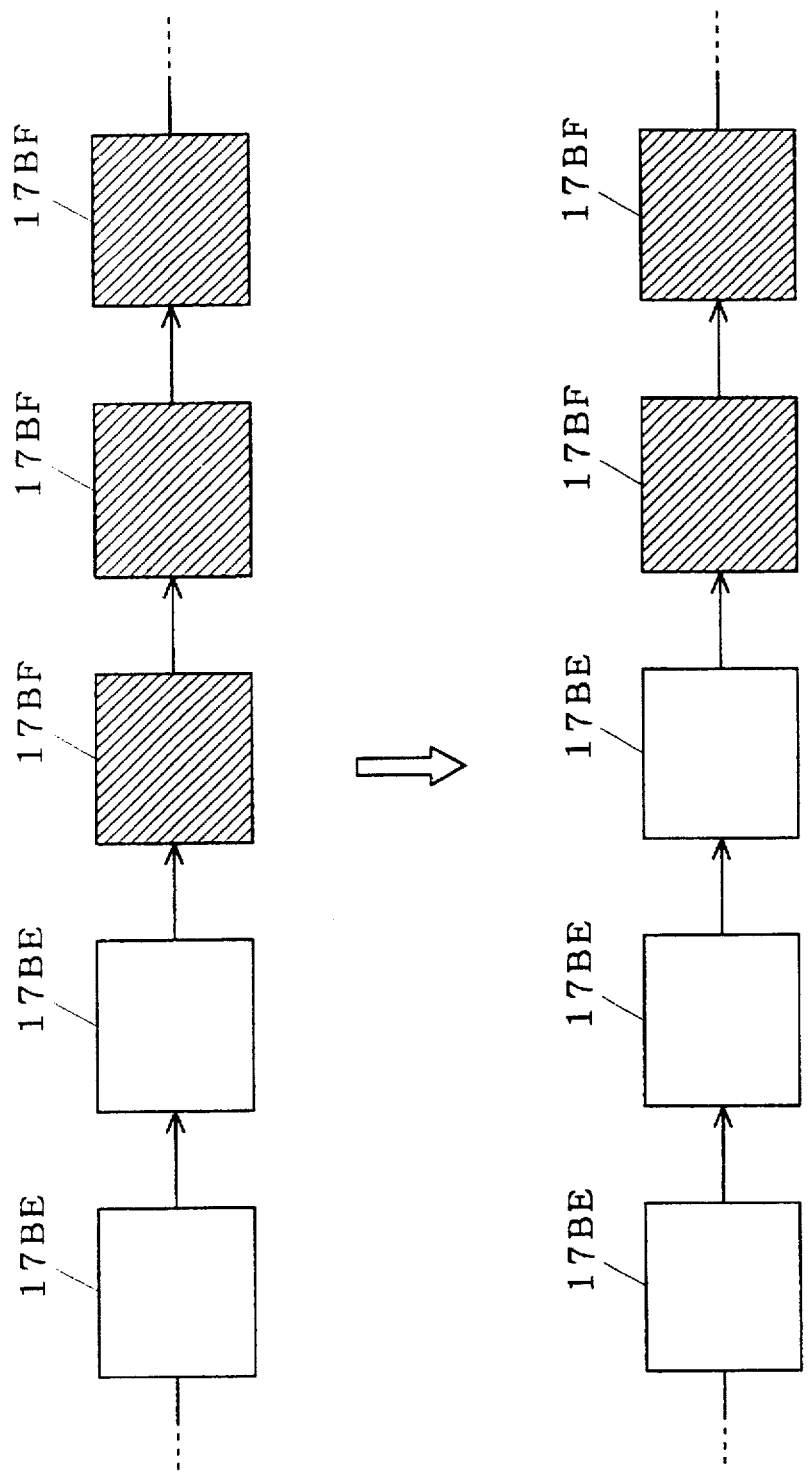
FIG. 32 is a diagram showing a change of the occupation state of a row of D-latches.

If the adjustable bit width is exceeded at that time and the self-timed C element 24B1 on the first stage is put in the occupation state, the occupation state is detected by the occupation signal 32 in the same way as that illustrated in FIG. 20 of the second preferred embodiment, and the obtained first cell phase error (F)41 is outputted to another circuit (the reset circuit 65 here). Detecting the first cell phase error 41, the reset circuit 65 then causes the inversion 30 of the external reset 67 to rise again to the "H" level to re-reset each of the portions 24B, 43 and 44. Thus, it can be recovered to the state where the cell synchronization can be established again even if all the self-timed C elements 24B are put in the occupation state due to error operation. The change of the occupation state of each D-latch 17B in this case is schematically shown in FIG. 32. FIG. 32 illustrates the case of phase shift of one bit, where the reference character 17BE is a D-latch in the empty state and 17BF is a D-latch in the occupation state.

In the second cell phase control portion 44, the read clock 36 is fixed to the "H" level when the second cell phase adjust signal (B) 40 is at the "H" level. This read clock 36 corresponds to the acknowledge input signal of the self-timed C element 24B2 on the final stage. This increases the self-timed C elements 24B in the hold state in the self-timed C element row by the number of bits of the phase shift mentioned above, which operates to delay the data transfer. By this delay operation, the internal cell phase pulse 37 achieves the same phase as the reference cell phase pulse 38. At this time, if the adjustable bit width is exceeded and the self-timed C element 24B2 on the final stage is put in the empty state (the state where the request output signal has already risen when the acknowledge input signal falls), the empty signal 34 is detected and the second cell phase control portion 44 outputs the second cell phase error (B) 42 to the reset circuit 65. At this time, the reset circuit 65 causes the inversion of the external reset, 30, to rise to the "H" level again to re-reset respective portions 24B, 43, 44.

By adopting such structure of the elastic store circuit 7B including such a cell synchronization portion 7B2 as shown in FIG. 26, bit synchronization and cell synchronization can be controlled by a united method to easily simplify the circuit structure of the synchronization circuit.

Figure 44:
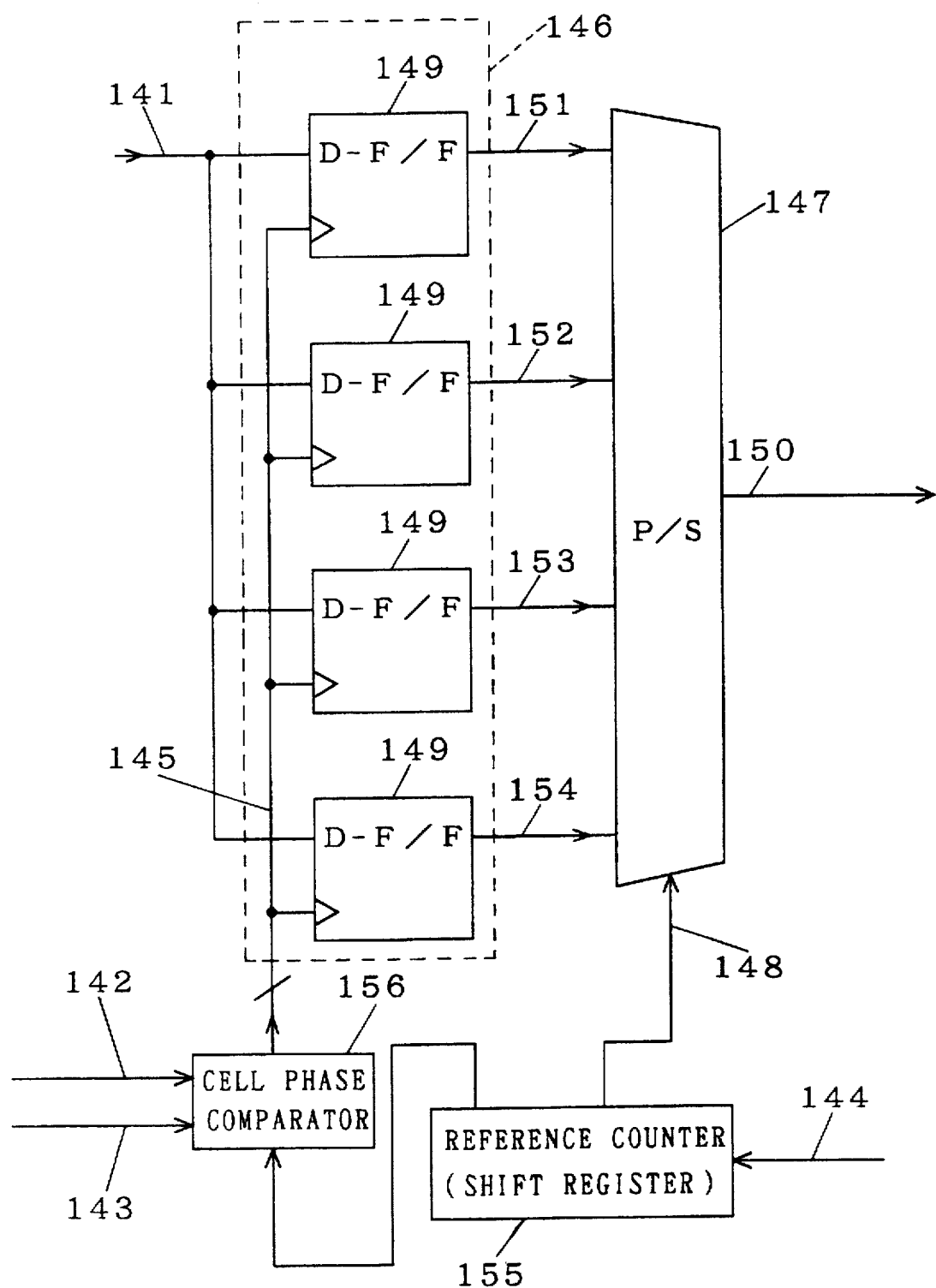
FIG. 44 is a diagram showing the structure of a conventional example of a cell synchronization circuit.
Figure 45:
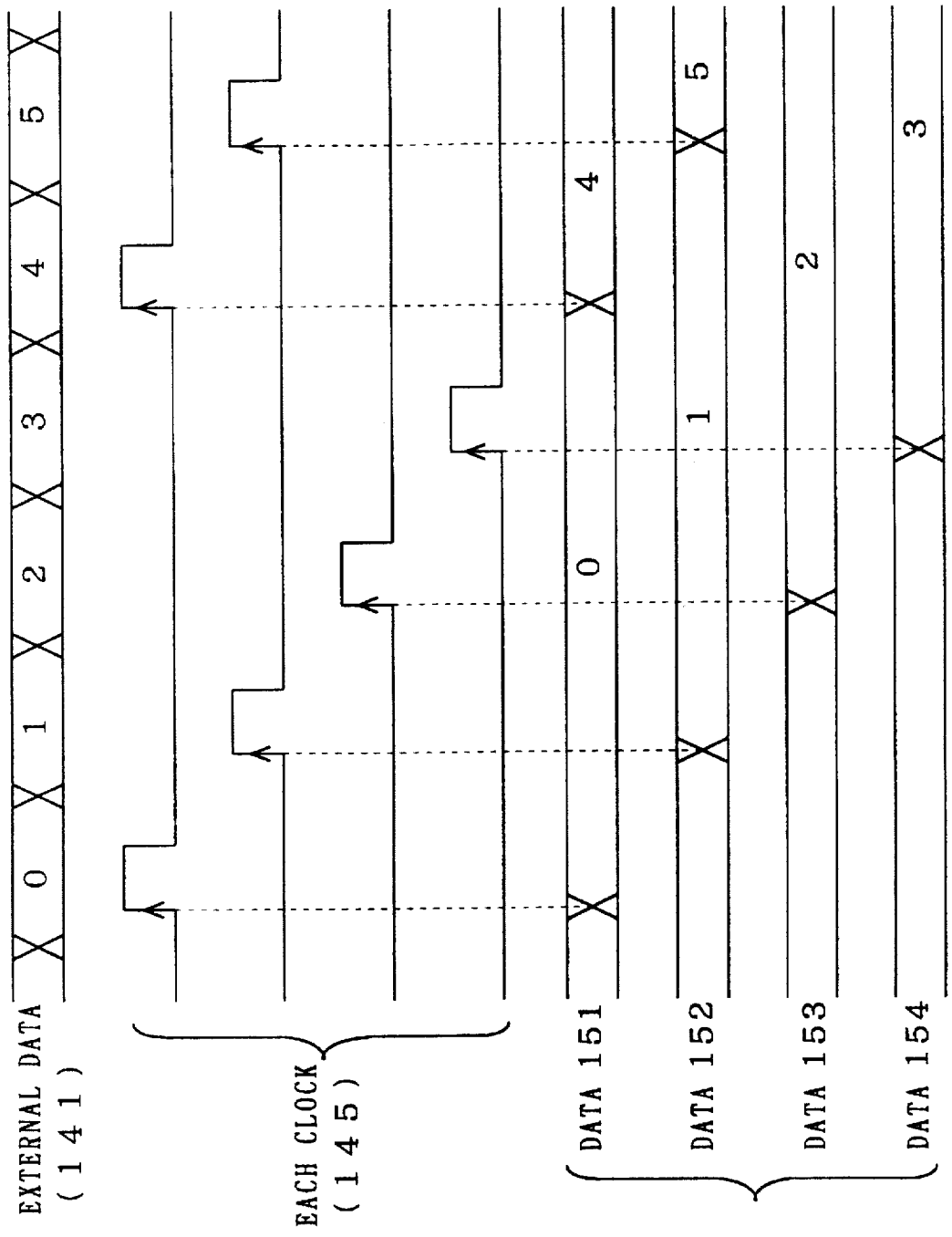
FIG. 45 is a timing chart of an S/P in the conventional cell synchronization circuit.
Figure 46:
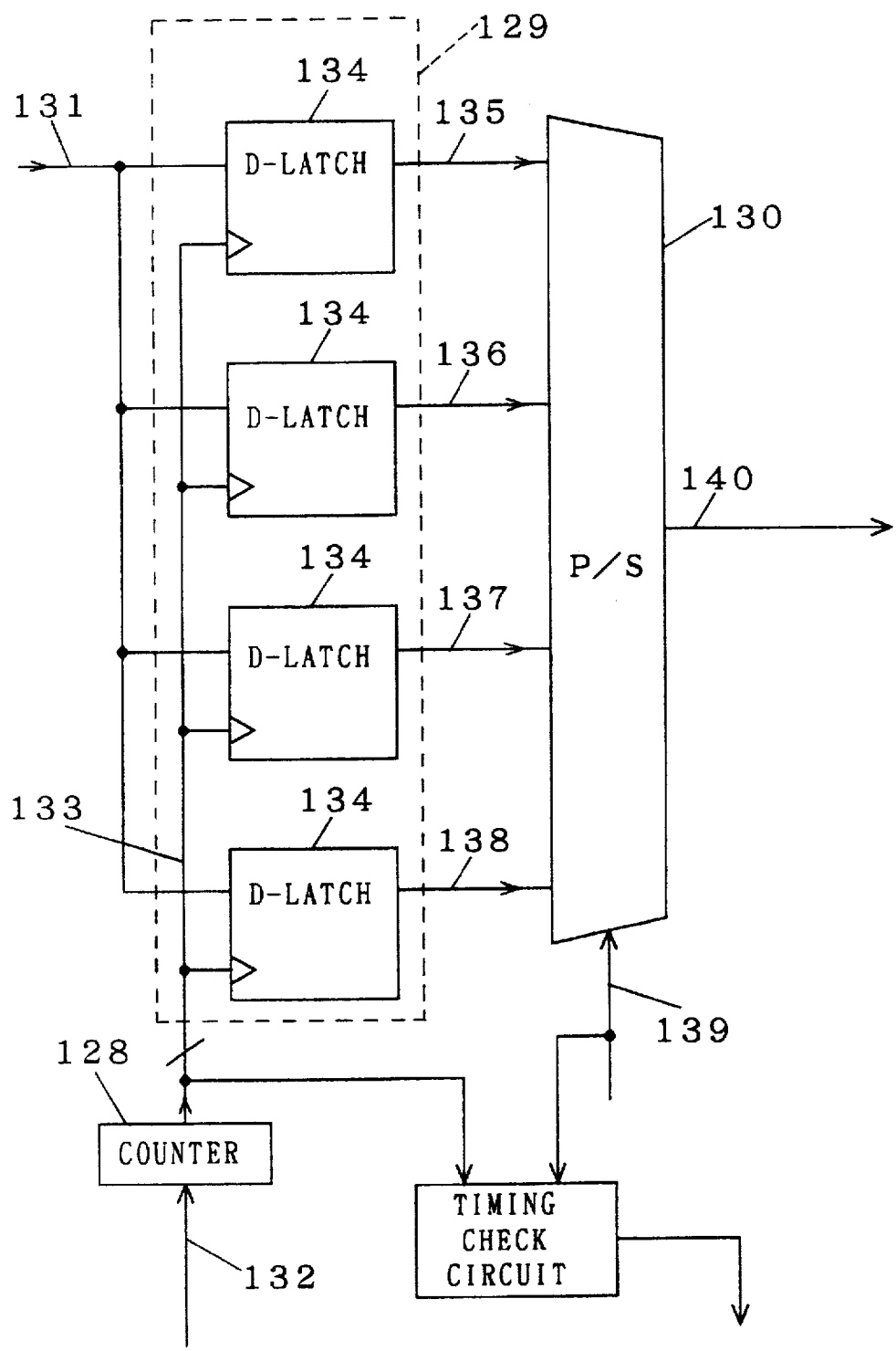
FIG. 46 is a diagram showing the structure of a conventional example of a bit synchronization circuit using S/P·P/S circuits.

Furthermore, according to this preferred embodiment, although the cell phase comparator 45 itself has the similar structure as that of the conventional cell phase synchronization portion (FIG. 44), the bit synchronization and cell synchronization which have been realized with the structure of the select circuit utilizing the counter circuit, the cell phase comparator, S/P and P/S can be easily realized by controlling the first stage and the final stage of the row of self-timed C elements. In this point, it can be said that the system according to the present preferred embodiment is considerably more advantageous in the aspect of circuit scale as the adjustable bit width becomes larger. This owes to the fact that only the number of the self-timed C elements 24B increases and only single provision of other parts 43, 44 and 45 is enough in this preferred embodiment.

Moreover, in the conventional system, heads of cells must always be at the same position, so that the adjustable bit width must be a measure of the number of cell bits. In this system, however, there is an advantage that the synchronization circuits can be constituted without considering such limitation.

(Fourth Preferred Embodiment)

Figure 33:
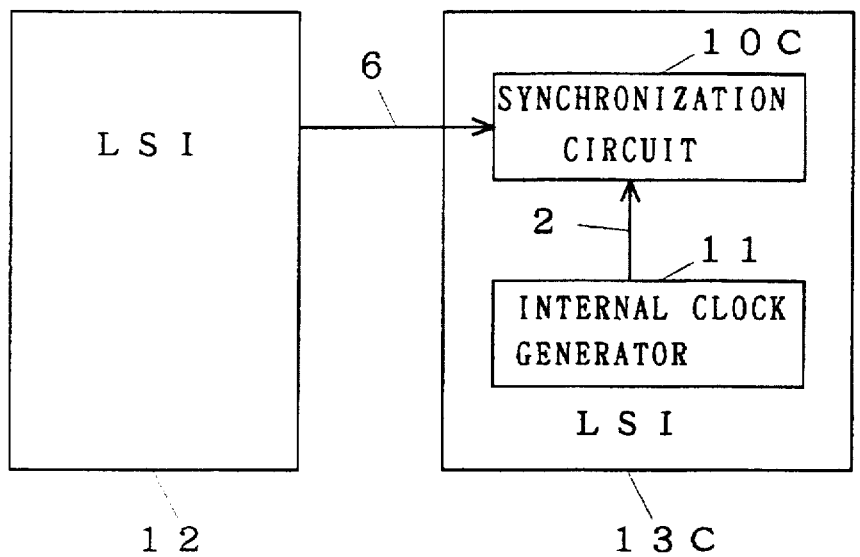
FIG. 33 is a diagram showing data transmission between LSI chips in the fourth preferred embodiment.

FIG. 33 is a block diagram schematically showing an LSI 13C incorporating a synchronization circuit 10C according to the fourth preferred embodiment of the present invention as an interface portion and an LSI 12 transmitting the external data to the LSI 13C. In this synchronization circuit 10C, the self-latch function is accomplished with a row of self-timed C elements. Now, the self-latch here generally means circuits which latch data of themselves at changing points of the data.

Figure 34:
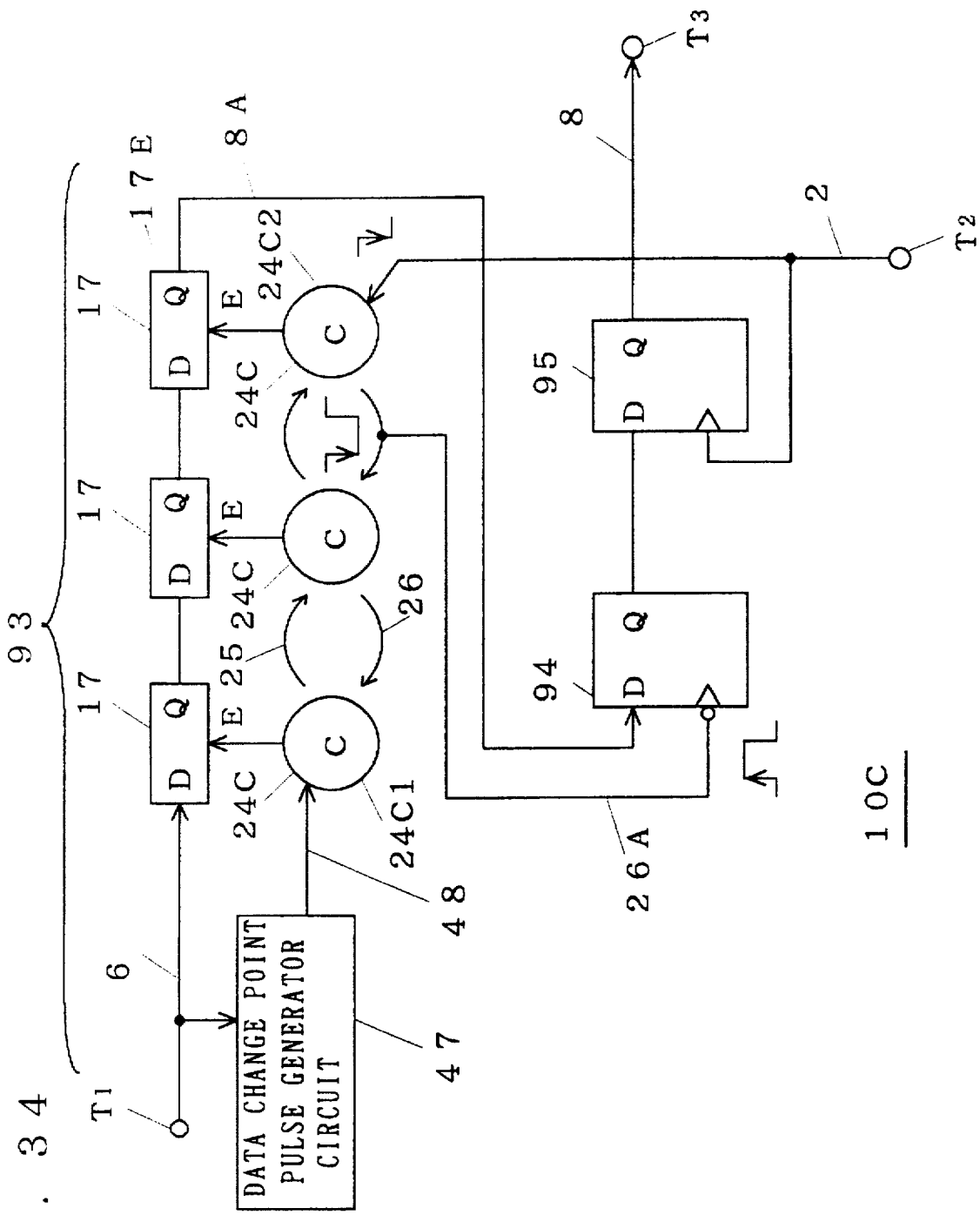
FIG. 34 is a block diagram showing an example of structure of a synchronization circuit according to the fourth preferred embodiment.

FIG. 34 is a block diagram depicting the internal structure of the synchronization circuit 10C. This circuit 10C is generally divided into a bit synchronization portion 93 including a row of D-latches (17), a row of self-timed C elements (24C) and a data change point pulse generating circuit 47 and a cell synchronization portion including two D-F/Fs 94 and 95. The synchronization circuit 10C formes an elastic store circuit itself. The first though third terminals $T_1$-$T_3$ are the same as the corresponding terminals in the first preferred embodiment, respectively.

Figure 35:
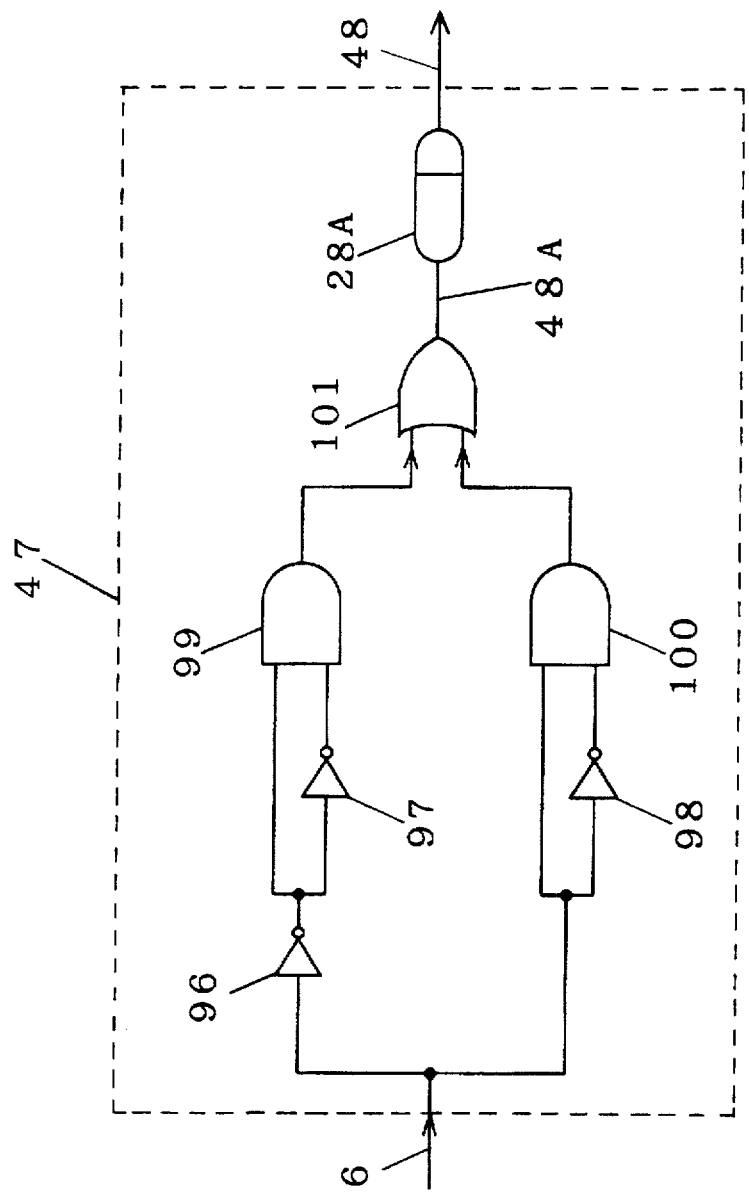
FIG. 35 is a diagram showing a circuit example of a data change point pulse generation circuit.

FIG. 35 is a block diagram showing an example of the circuit structure of the data change point pulse generating circuit 47. This circuit 47 has inverters 96-98, AND circuits 99 and 100, an OR circuit 101 and a delay element 28A (for example, having a series connection structure of a plurality of buffers or inverters). The operation is described below.

Figure 36:
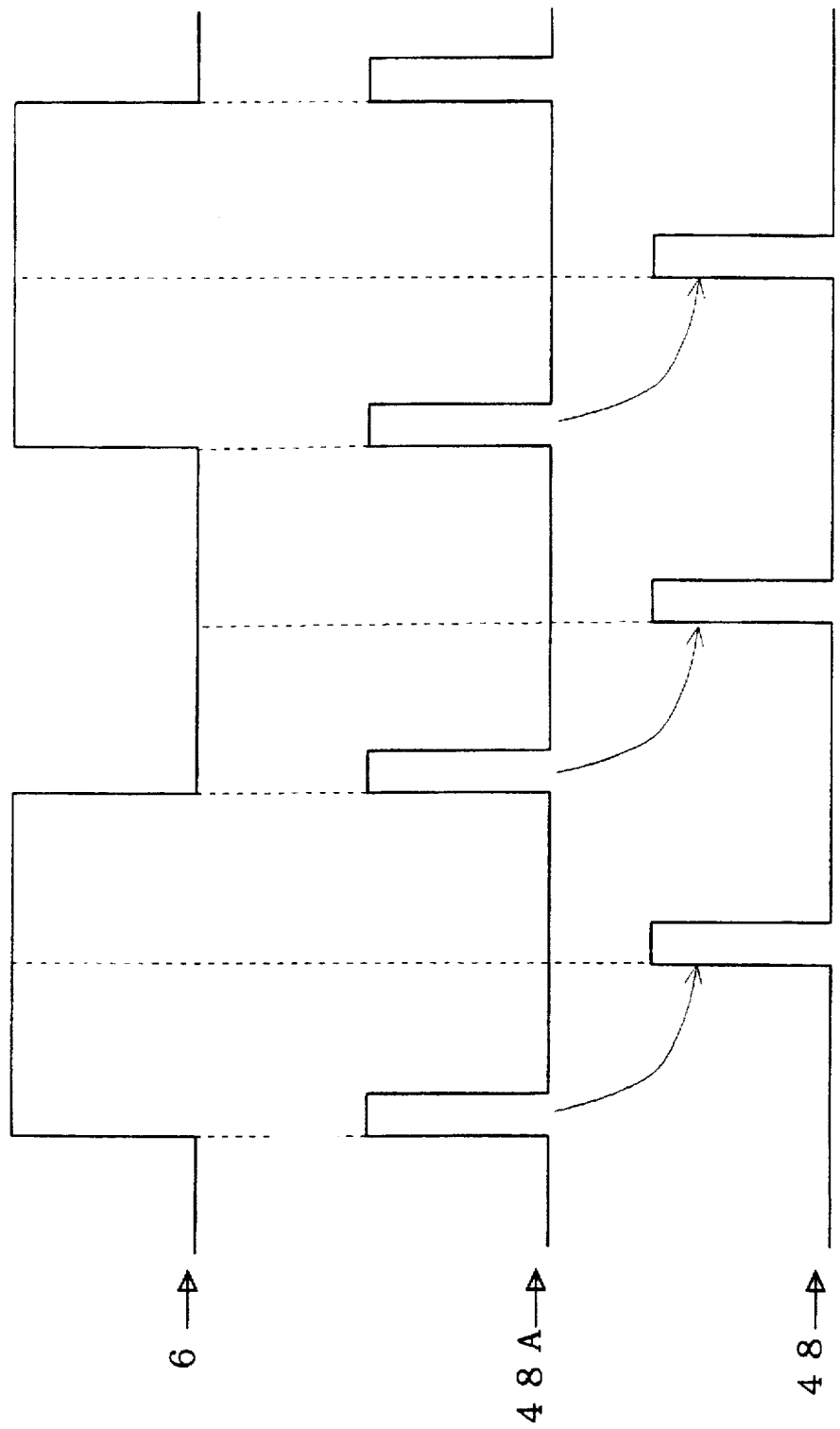
FIG. 36 is a timing chart illustrating the operation of the data change point pulse generation circuit.

The data change point pulse generating circuit 47 generates pulse from rise-fall change point of the external data signal 6 and inputs the pulse to the self-timed C element 24C1 on the first stage as its request input signal 48. This point is illustrated in the timing chart of FIG. 36.

The acknowledge input signal of the self-timed C element 24C2 on the final stage is the internal clock 2 itself.

On the cell synchronization portion side, the first D-F/F 94 takes in the acknowledge output signal 26 outputted by the self-timed C element 24C2 on the final stage as a capture edge 26A, in accordance with which the capture edge 26A it captures data 8A outputted by the D-latch 17E on the final stage. The captured data 8A is turned with the internal clock 2 in the second D-F/F 95 to enable capturing of the data 8A as the internal data signal 8 in synchronization with the internal clock 2.

That is to say, when the D-latch 17E on the final stage is in the closed state (occupation state), if the internal clock 2 falls to the "L" level, the acknowledge output signal 26 outputted by the self-timed C element 24C2 on the final stage subsequently falls and inversion of the capturing edge 26A of the first D-F/F 94 rises. At this time the C element 24C2 puts the D-latch 17E in the open state. Accordingly, the data 8A is taken in by the first D-F/F 94 and further the data 8A is outputted by the second D-F/F 95 in synchronization with the internal clock 2.

According to this synchronization circuit 10C, the internal data signal 8 can be outputted on the basis of the internal clock 2 and the external data signal 6 without using the delay line 1 and the clock select circuit 4 in FIG. 2.

Now, in the conventional latch circuit, as in the phase comparator portion depicted in FIG. 5 of "IEEE ISSCC '92 SESSION 5" PP94-95 M. Bagheri et.al, the read clock is inverted only when "Low" of the write clock (WCK) and the falling edge (ED) of the read clock (RCK) corresponding to the internal clock agree in timing. (Changing from a fall latch to a rise latch. Refer to FIG. 6 in the literature cited above.) In this conventional system, timing detection of one-severalth of one period of the read clock is required, so that it is difficult to be realized in a high speed circuit. On the contrary, in this system, the phase difference between the external data signal 6 and the internal clock 2 is absorbed by send/receive of the request signal 25 and acknowledge signal 26 among the self-timed C elements 24C, accordingly such a timing detection circuit as mentioned above in the conventional case is not required at all, enabling a self-latch circuit which can be adapted to the speed up and scaling down of circuit structure to be realized.

(Fifth Preferred Embodiment)

While strict delay value control is needed in the first conventional art which have been already described, the delay value control in the fifth preferred embodiment is rather soft, where it is sufficient that the total delay value of the delay line 1A is not less than one period of the external data.

The fifth preferred embodiment relates to an improvement of the delay line 1 in FIG. 2. Other parts are the same as those in the first through fourth preferred embodiments.

Figure 37:
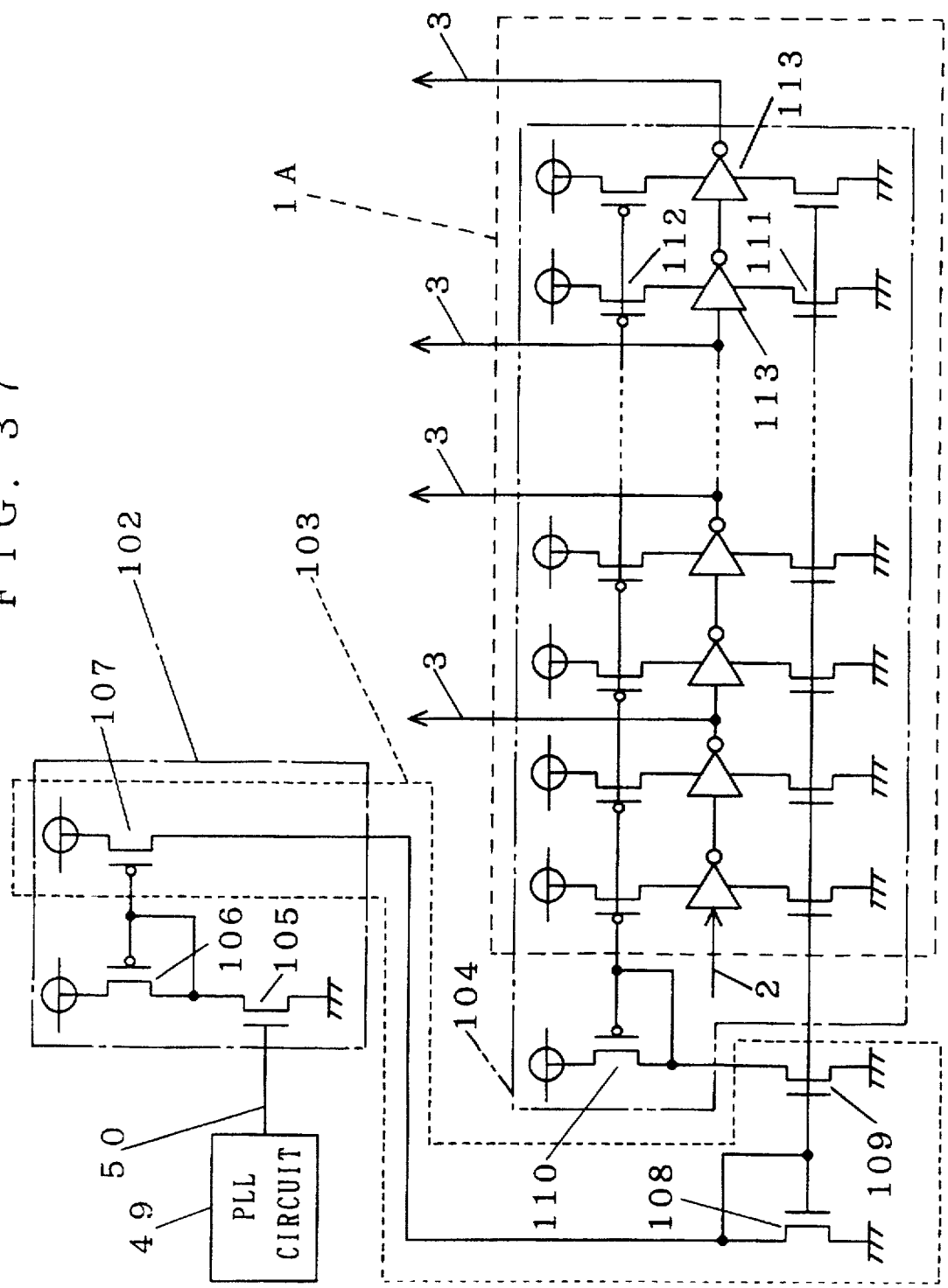
FIG. 37 is a diagram showing an example of structure of a delay line according to the fifth preferred embodiment.

FIG. 37 shows an example of circuit structure of the delay line 1A of this preferred embodiment. It is an object of this preferred embodiment to keep all delay values of the delay line 1A constant with respect to inequality in process and temperature change, where a PLL circuit 49 is provided and a control voltage signal 50 itself of the voltage-controlled oscillator (VCO) therein is utilized to adjust all delay values of the delay line 1A. Note that an output terminal of the VCO control voltage signal 50 of the PLL circuit 49 is called a VCO control voltage signal input terminal.

In this case, as to individual buffer portions in the delay line 1A, it can be assumed that the characteristics thereof are almost uniform, therefore the delay amounts of individual delay clocks 3 can be always constant if all delay values of the delay line 1A can be controlled to be constant.

Figure 38:
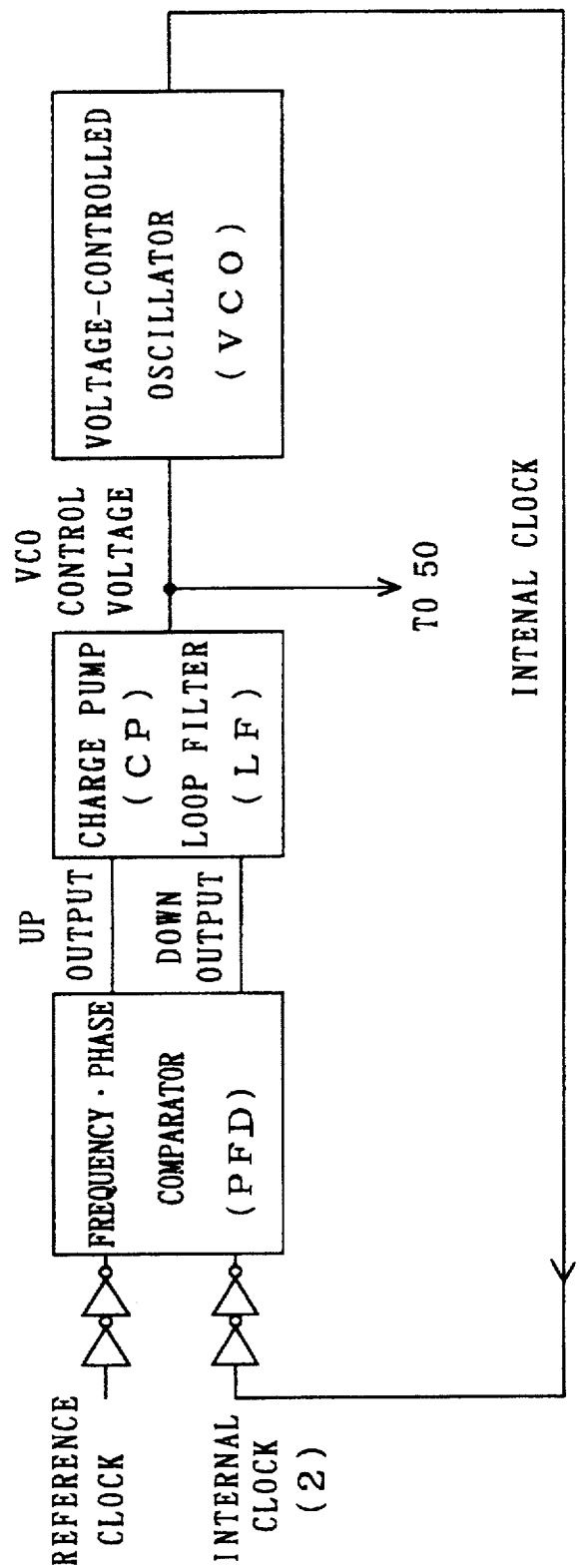
FIG. 38 is a diagram showing an example of structure of a PLL circuit.
Figure 39:
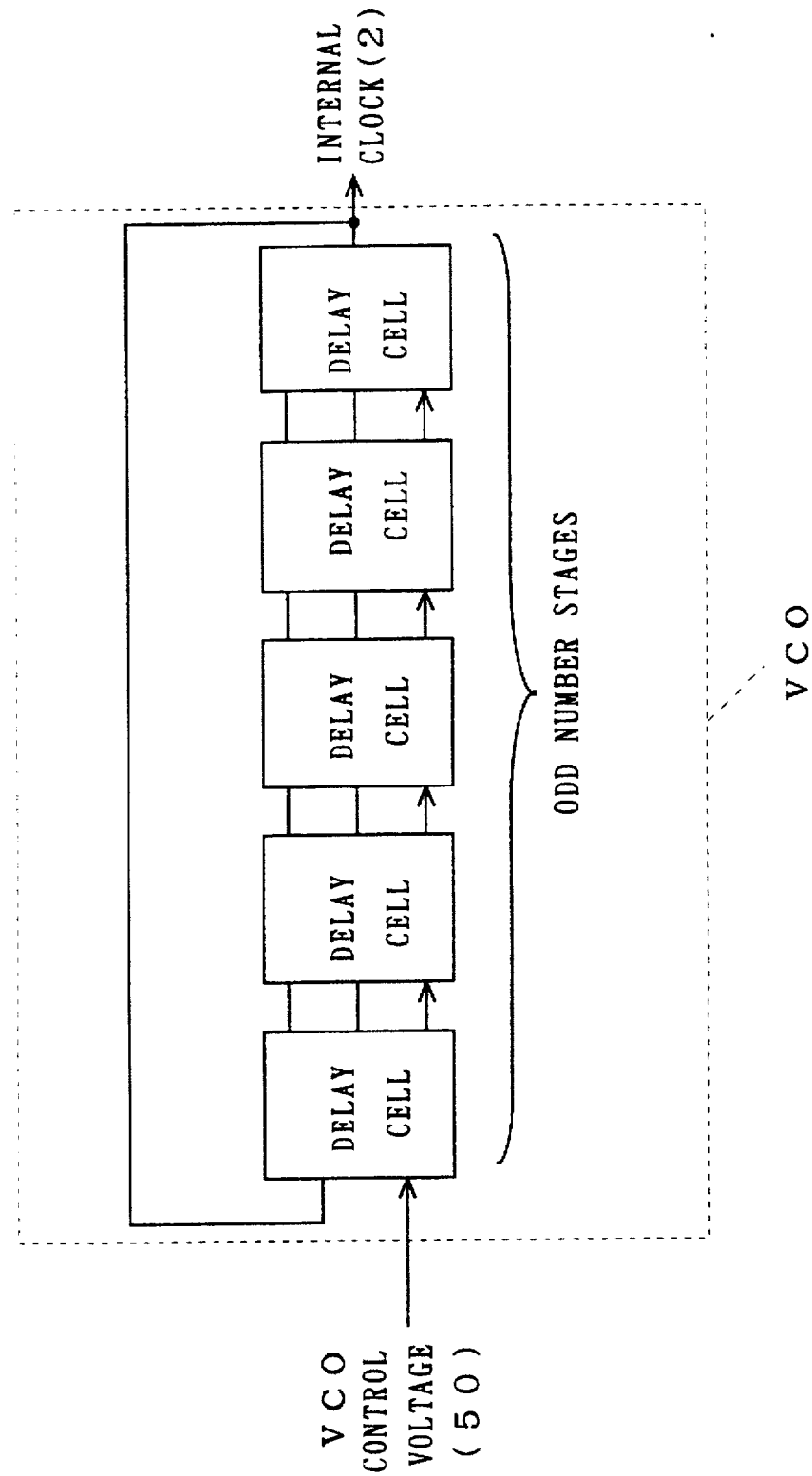
FIG. 39 is a block diagram showing the structure of a VCO in the PLL circuit.
Figure 40:
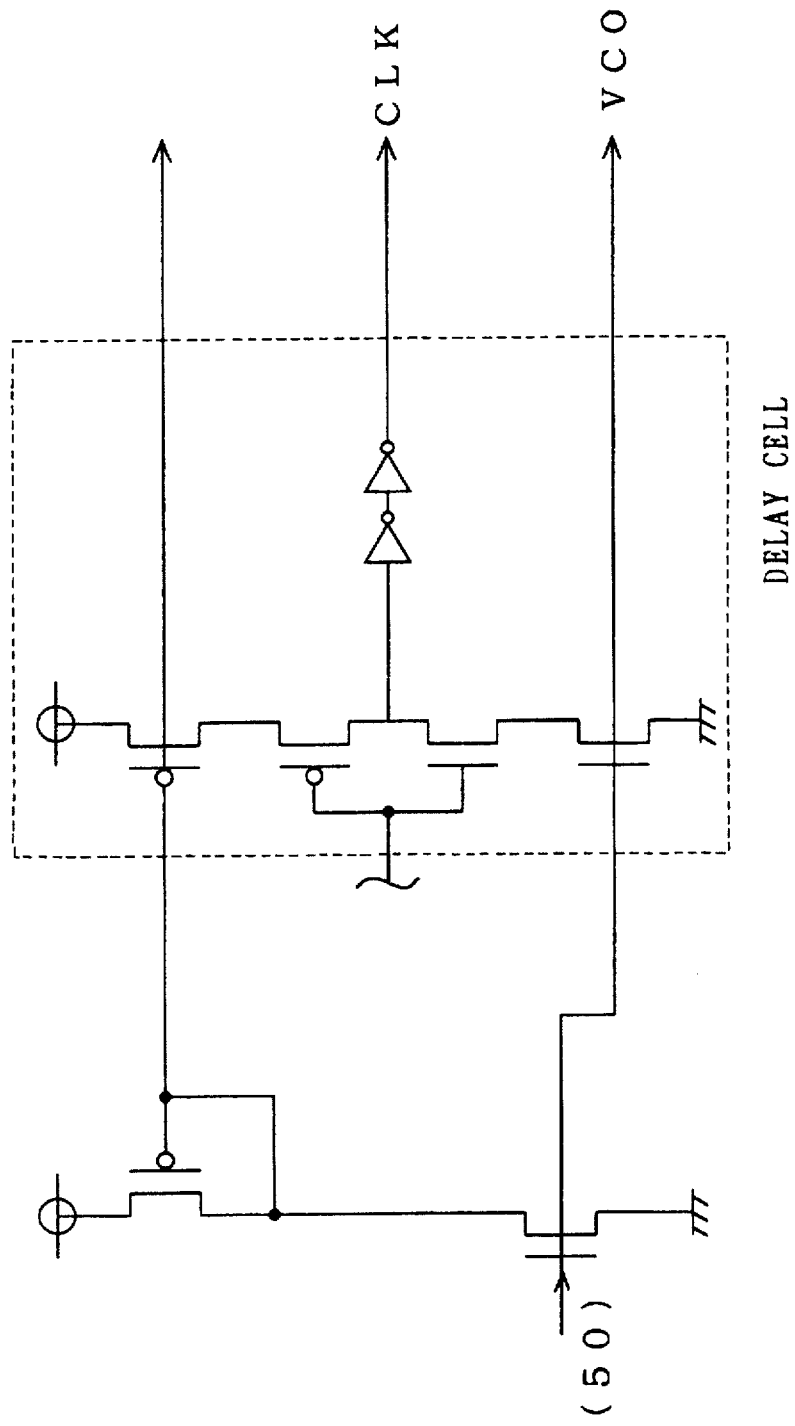
FIG. 40 is a circuit diagram showing the structure of a delay cell of the VCO.

Accordingly, in the fifth preferred embodiment, a current mirror circuit receiving the VCO control voltage signal 50 of the PLL circuit 49 to be driven is provided and the driving force of the delay line 1A is controlled by the current flowing in the current mirror circuit. The structure of the PLL circuit 49 is the same as that shown in FIG. 3 of "IEEE ISSCC '87" pp251-261, D. K. Jeong et. al, of which internal structure is shown in FIG. 38. Further, one example of block structure of the VCO in the PLL circuit 49 shown in FIG. 38 is illustrated in FIG. 39 and an example of structure of the delay cell of that VCO is shown in FIG. 40. Now, the reference clock dose not mean parallel run of clock for each data, but which is formed to input one clock with frequency equal to the operating frequency of the data for each chip.

As shown in FIG. 37, first, P-type FETs 106, 107 and an N-type FET 105 form a first current mirror circuit 102, and further the P-type FET 107 and N-type FETs 108, 109 form a second current mirror circuit 103, and further each combination of a P-type FET 110 and a P-type EFT 112 and an N-type FET 111 in the delay line 1A forms a third current mirror circuit 104. In the delay line 1A, a plurality of combinations of the P-type FET 112 and the N-type FET 111 are provided (if the number of the delay clocks 3 is assumed to be n, the number of the combinations is 2n), and an inverter 113 is provided between the P-type FET 112 and a corresponding N-type FET 111. That is to say, the current between the P-type FET 112 and the N-type FET 111 is controlled by a gate of this inverter 113. Moreover, the number of the inverters 113 (the number of the combinations of the P-type FETs 112 and the N-type FETs 111 connected through the inverters 113, accordingly) is the same as the total number of the inverters of the VCO delay cells in the PLL circuit 49 (refer to FIG. 3(c) in the literature cited above or FIG. 39 and FIG. 40). By constituting so, the all delay values of the delay line 1 can be ½ of the clock period of the external data signal.

This control can suppress the change of the delay value due to inequality in process of the inverters 111 among different chips and temperature change. Also, the current mirror current is controlled by the voltage value of the VCO control voltage signal 50 to suppress the driving force of each inverter 113, so that the consumption power in the delay line 1A can be considerably saved.

The descriptions on the individual preferred embodiments made above can be summarized as follows. That is to say, the present invention is important technique in the inter-chip interfaces in the synchronization relation, and it can be utilized as I/O interfaces for micro-processors or as a synchronization recover function in the data communication systems and the like. The present invention enables realization of synchronization circuits capable of small scale, low consumption power and high speed lock, which is a point of increasing importance for the systems mentioned above, to which various applications and adaptations of the present invention can be expected. The effects of the respective preferred embodiments are as follows.

(1) In the first through third preferred embodiments and the fifth preferred embodiment, the delay lines 1, 1A are utilized to enable capturing of the external data signal without running external clock in parallel.

(2) According to the first preferred embodiment, the bit synchronization can be realized with small scale and high speed lock.

(3) According to the first through fourth preferred embodiments, an ES circuit (Elastic Store circuit) with a row of self-timed C elements can be realized.

(4) According to the third preferred embodiment, both the bit synchronization and cell synchronization can be realized by means of the ES circuit using the row of self-timed C elements.

(5) According to the fourth preferred embodiment, a self latch circuit with high speed and small scale can be realized.

(6) According to the fifth preferred embodiment, a delay line of low consumption power type capable of controlling delay value always constant can be realized.

While the invention has been shown and described in detail, the foregoing description is in all aspects illustrative and not restrictive. It is therefore understood that numerous modifications and variations can be devised without departing from the scope of the invention.

What is claimed is:

1. A synchronization circuit, comprising:

a first terminal for inputting an external data signal;

a second terminal for inputting an internal clock;

a delay line connected to said second terminal for sequentially delaying said internal clock to produce a plurality of delay clocks;

a clock select circuit connected to said first terminal and said delay line for selecting one of said plurality of delay clocks that makes a level change while said external data signal is at a predetermined level and for outputting a selected one of said delay clocks as a select clock; and an elastic store circuit having a bit synchronization portion, said bit synchronization portion being connected to said first terminal, said second terminal and said clock select circuit and capturing said external data signal in accordance with said level change of said select clock and further converting said external data signal captured therein to an internal data signal having a phase being synchronized with said internal clock to output said internal data signal.

2. The synchronization circuit according to claim 1, wherein said bit synchronization portion of said elastic store circuit includes, a row of latches having a plurality of latches serially connected for sequentially latching said external data signal and outputting said internal data signal from said latch on the final stage, and a row of self-timed C elements having a plurality of self-timed C elements each provided for each said latch and connected serially, in said plurality of self-timed C elements, said self-timed C element on the first stage inputting said select clock as its request signal and said self-timed C element on the final stage inputting said internal clock as its acknowledge signal, and each of said plurality of self-timed C elements, controlling corresponding said latch to a hold state if said latch is in an empty state when receiving input of said request signal outputted by said self-timed C element on the preceding stage, outputting said request signal and acknowledge signal to each of said self-timed C elements on the following stage and said preceding stage, and subsequently controlling said latch to an open state in accordance with input of said acknowledge signal outputted by said self-timed C element on said following stage, and if corresponding said latch is in an occupation state when receiving input of said request signal outputted by said self-timed C element corresponding to the preceding stage, controlling said latch from said hold state to said open state in accordance with input of said acknowledge signal outputted by said self-timed C element on said following stage, and further respectively outputting said request signal and acknowledge signal to said self-timed C elements on said following stage and said preceding stage and controlling said latch from said open state to said hold state again.

3. The synchronization circuit according to claim 2, wherein said clock select circuit comprises:

a first latch circuit for latching each of said plurality of delay clocks in accordance with the level change of said external data signal and outputting a status signal in response thereto;

an encode circuit for outputting an encode signal at a second level only for input of first said status signal attaining said second level among a plurality of said status signals outputted by said first latch circuit while said status signal on the preceding stage is at a first level, and for outputting said encode signal at said first level for input of other said status signals;

a second latch circuit for latching each said encode signal at a same timing as a new level change following said level change of said external data signal and outputting a select signal in response thereto; and a select circuit responsive to each of said select signal outputted by said second latch circuit for selecting as said select clock said delay clock corresponding to said encode signal at said second level out of inputted said plurality of delay clocks.

4. The synchronization circuit according to claim 3, wherein:

said first latch circuit comprises a plurality of first flip-flops provided for each inputted said delay clock;

each of said first flip-flops capturing a corresponding one of said delay clocks in accordance with said level change of inputted said external data signal;

said second latch circuit comprises a plurality of second flip-flops provided for each inputted said encode signal; and each of said second flip-flops capturing respective encode signals in accordance with said new level change of inputted said external data signal.

5. The synchronization circuit according to claim 3, wherein:

said first latch circuit comprises, a gate circuit for generating a pulse signal having a pulse width shorter than that of said external data signal in accordance with said level change of inputted said external data signal, and a plurality of first latches provided for respective of inputted said delay clocks for capturing said one of said delay clocks in accordance with inputted said pulse signal; and said second latch circuit comprises, another gate circuit for generating another pulse signal having a pulse width shorter than that of said external data signal in accordance with said new level change of inputted said external data signal, and a plurality of second latches provided for each of inputted said encode signals for capturing corresponding ones of said encode signals in accordance with inputted said another pulse signal.

6. The synchronization circuit according to claim 2, further comprising;

a third terminal for outputting said internal data signal, and a fourth terminal for inputting external reset, and said bit synchronization portion of said elastic store circuit further comprising, a control circuit for stopping output of said internal clock inputted from said second terminal for certain period of its period immediately after being reset by said external reset inputted from said fourth terminal and for outputting said internal clock after the output stop as said acknowledge signal to said self-timed C element on said final stage.

7. The synchronization circuit according to claim 6, wherein said bit synchronization portion of said elastic store circuit comprises, said control circuit as a second control circuit, and further comprises, a first control circuit connected to said fourth terminal, said row of self-timed C elements and said second control circuit for, when an occupation signal outputted by said self-timed C element on the first stage indicates that said latch on the first stage is in the open state, outputting said external reset to said row of self-timed C elements and said second control circuit for resetting, and when said occupation signal indicates that said latch on the first stage is in the occupation state, producing internal reset and outputting the internal reset to said row of self-timed C elements and said second control circuit to re-reset.

8. The synchronization circuit according to claim 7, further comprising, a fifth terminal for outputting said internal reset, and said first control circuit outputting said internal reset also to said fifth terminal as an error detection signal.

9. The synchronization circuit according to claim 2, further comprising:

a third terminal for outputting said internal data signal; and a fourth terminal for inputting external reset; and said bit synchronization portion of said elastic store circuit further comprising, a control circuit connected to said fourth terminal and said row of self-timed C elements for outputting said external reset to said row of self-timed C elements for reset when an occupation signal outputted by said self-timed C element on the first stage indicates that said latch on the corresponding first stage is in the open state and for producing an internal reset to output said internal reset to said row of self-timed C elements for re-resetting when said occupation signal indicates that said latch on the first stage is in the occupation state.

10. The synchronization circuit according to claim 2, wherein said first terminal also inputs a signal corresponding to an internal cell phase pulse before both bit synchronization and cell synchronization transmitted running in parallel with said external data signal, said bit synchronization portion of said elastic store circuit also applies the same processing to said signal corresponding to said internal cell phase pulse as the processing to said external data signal and outputs it as said internal signal, said elastic store circuit further comprises a cell synchronization portion connected to said bit synchronization portion, and said cell synchronization portion comprises, a row of new latches having a plurality of new latches connected serially and having its first stage connected to said bit synchronization portion of said elastic store circuit for sequentially latching said internal data signal outputted by said bit synchronization portion and outputting it as a cell synchronization data signal, a row of new self-timed C elements having a plurality of new self-timed C elements provided for each of said new latches and connected serially for controlling said new latches, a cell phase comparator for comparing said internal cell phase pulse outputted by said new self-timed C element on the final stage of said row of new self-timed C elements and a reference cell phase pulse, and when said internal cell phase pulse delays from said reference cell phase pulse, outputting a first cell phase adjust signal only for the delay time, and when said internal cell phase pulse is advanced from said reference cell phase pulse, outputting a second cell phase adjust signal only for the advancing time, and when said internal cell phase pulse and said reference cell phase pulse agree in phase, outputting none of said first and second cell phase adjust signals, a first cell phase control portion for outputting a write clock in accordance with said internal clock inputted from said second terminal when said cell phase comparator dose not output said first cell phase adjust signal, and outputting said write clock in accordance with said first cell phase adjust signal when said cell phase comparator outputs said first cell phase adjust signal to said new self-timed C element on the first stage as its request signal, respectively, and a second cell phase control portion for outputting a read clock obtained by delaying output of said internal clock inputted from said second terminal by certain period of its period when said cell phase comparator dose not output said second cell phase adjust signal, and outputting said read clock in accordance with said second cell phase adjust signal when said cell phase comparator outputs said second cell phase adjust signal to said new self-timed C element on the final stage as its acknowledge signal, respectively, and said new self-timed C elements having the same function as that of said self-timed C elements.

11. The synchronization circuit according to claim 10, further comprising, sixth and seventh terminals, wherein said first cell phase control portion comprises, means for inputting as an occupation signal said request signal which said new self-timed C element on the first stage outputs to said new self-timed C element on the next stage and for outputting a first cell phase error signal to said sixth terminal when said occupation signal indicates the occupation state of said new self-timed C element on the first stage, and said second cell phase control portion comprises, means for receiving an empty signal indicating that said new self-timed C element on the final stage is in the empty state from said new self-timed C element on the final stage and for outputting a second cell phase error signal to said seventh terminal.

12. The synchronization circuit according to claim 1, further comprising;

a phase-locked loop circuit; and a current mirror circuit driven by receiving a VCO control voltage signal for a voltage controlled oscillator in said phase-locked loop circuit, wherein said delay line includes, a plurality of buffers connected serially which are driven by current generated by said current mirror circuit.

13. A synchronization circuit for performing capturing and phasing of an external data signal by self-latch comprising a plurality of latches connected serially for latching data of itself at a point of change of inputted data, wherein timing adjustment of latching by said self-latch is controlled by a row of self-timed C elements including serially connected self-timed C elements each provided for each said latch.

14. A synchronization circuit, comprising:

a first terminal for inputting an external data signal;

a second terminal for inputting an internal clock;

a data change point pulse generation circuit connected to said first terminal for generating a pulse signal which is in synchronization with a change point of said external data signal;

a bit synchronization portion having a row of latches connected to said first terminal and having a plurality of latches serially connected and a row of self-timed C elements having serially connected self-timed C elements provided for each said latch for outputting a latch signal to the corresponding latch for controlling thereof; and a cell synchronization portion connected to a final stage of said self-timed C elements and said latch respectively in said row of self-timed C elements and said row of latches and to said second terminal for capturing a data signal outputted by said latch on a final stage in synchronization with an acknowledge signal outputted by said self-timed C element on the final stage and further outputting captured said data signal in synchronization with said internal clock;

said self-timed C element on a first stage in said row of self-timed C elements inputting said pulse signal as a request signal therefor, and said self-timed C element on the final stage being connected to said second terminal and inputting said internal clock as said acknowledge signal, and each of said self-timed C elements, if said corresponding latch is in an empty state when receiving input of said request signal outputted by said self-timed C element corresponding to a preceding stage, controlling said latch to a hold state, outputting said request signal and acknowledge signal to each of said self-timed C elements corresponding to a following stage and said preceding stage, and subsequently, controlling said latch to an open state in accordance with input of said acknowledge signal outputted by said self-timed C element on said following stage, and if said corresponding latch is in an occupation state when receiving input of said request signal outputted by said self-timed C element corresponding to said preceding stage, controlling said latch from said occupation state to said open state in accordance with input of said acknowledge signal outputted by said self-timed C element on said following stage, and further outputting said request signal and acknowledge signal to said self-timed C elements on said following stage and preceding stage, respectively, and controlling said latch from said open state to said occupation state.

15. The synchronization circuit according to claim 1, further comprising:

a third terminal for outputting said internal data signal;

a fourth terminal for inputting an external reset; wherein said bit synchronization portion of said elastic store circuit includes, a plurality of latches serially connected in a row for sequentially latching said external data signal and outputting said internal data signal from said latch on a final stage thereof, and a row of self-timed C elements having a plurality of self-timed C elements each provided for respective of said latches and connected serially, wherein in said plurality of self-timed C elements, said self-timed C element on a first stage inputting said select clock as a request signal therefor; and a control circuit for stopping an output of said internal clock inputted from said second terminal for a certain time period of a period of said internal clock, said control circuit stopping the output of said internal clock immediately after being reset by said external reset inputted from said fourth terminal and for outputting said internal clock after the output is stopped, said internal clock, as controlled by said control circuit, serving as said acknowledge signal to said self-timed C element on said final stage.

16. The synchronization circuit according to claim 1, further comprising:

a third terminal for outputting said internal data signal;

a fourth terminal for inputting an external reset; wherein said bit synchronization portion of said elastic store circuit includes, a plurality of latches serially connected in a row for sequentially latching said external data signal and outputting said internal data signal from said latch on a final stage thereof, and a row of self-timed C elements having a plurality of self-timed C elements each provided for respective of said latches and connected serially, wherein in said plurality of self-timed C elements, said self-timed C element on a first stage thereof inputting said select clock as a request signal therefor; and a control circuit connected to said fourth terminal and said row of self-timed C elements for outputting said external reset to said row of self-timed C elements for reset when an occupation signal outputted by said self-timed C element on the first stage indicates that said latch on the corresponding first stage is in an open state and for producing an internal reset to output said internal reset to said row of self-timed C elements for re-resetting when said occupation signal indicates that said latch on the first stage is in the occupation state.

17. The synchronization circuit according to claim 1, wherein:

said bit synchronization portion of said elastic store circuit includes, a plurality of latches serially connected in a row for sequentially latching said external data signal and outputting said internal data signal from said latch on a final stage thereof, and a row of self-timed C elements having a plurality of self-timed C elements each provided for respective of said latches and connected serially, wherein in said plurality of self-timed C elements, said self-timed C element on the first stage thereof inputting said select clock as a request signal therefor;

said first terminal also inputs a signal corresponding to an internal cell phase pulse before both bit synchronization and cell synchronization transmitted running in parallel with said external data signal;

said bit synchronization portion of said elastic store circuit also applies a same processing to said signal corresponding to said internal cell phase pulse as that applied to said external data signal and outputs said signal as said internal signal;

said elastic store circuit further comprises a cell synchronization portion connected to said bit synchronization portion; and said cell synchronization portion comprises, a plurality of new latches connected serially in a row and having a first stage thereof connected to said bit synchronization portion of said elastic store circuit for sequentially latching said internal data signal outputted by said bit synchronization portion and outputting said internal data signal as a cell synchronization data signal, a row of new self-timed C elements having a plurality of new self-timed C elements provided for each of said new latches and connected serially for controlling said new latches, a cell phase comparator for comparing said internal cell phase pulse outputted by said new self-timed C element on a final stage of said row of new self-timed C elements and a reference cell phase pulse, and when said internal cell phase pulse delays from said reference cell phase pulse, outputting a first cell phase adjust signal only for a delay time, and when said internal cell phase pulse is advanced from said reference cell phase pulse, outputting a second cell phase adjust signal only for an advancing time, and when said internal cell phase pulse and said reference cell phase pulse agree in phase, outputting none of said first and second cell phase adjust signals, a first cell phase control portion for outputting a write clock in accordance with said internal clock inputted from said second terminal when said cell phase comparator does not output said first cell phase adjust signal, and outputting said write clock in accordance with said first cell phase adjust signal when said cell phase comparator outputs said first cell phase adjust signal to said new self-timed C element on the first stage as a request signal therefor, respectively, and a second cell phase control portion for outputting a read clock obtained by delaying output of said internal clock inputted from said second terminal by a certain period of its period when said cell phase comparator does not output said second cell phase adjust signal, and outputting said read clock in accordance with said second cell phase adjust signal when said cell phase comparator outputs said second cell phase adjust signal to said new self-timed C element on the final stage as an acknowledge signal, respectively, and said new self-timed C elements functioning in a same way as said self-timed C elements.

18. The synchronization circuit of claim 1, wherein:

said bit synchronization portion of said elastic store circuit includes, a row of self-timed C elements having a plurality of self-timed C elements connected in series, respective of said plurality of self-timed C elements communicating with adjacent of said plurality of self-timed C elements with request signals and acknowledge signals.

* * * * *